United States Patent
Park et al.

(10) Patent No.: US 11,258,929 B2
(45) Date of Patent: Feb. 22, 2022

(54) LENS MOVING APPARATUS, AND CAMERA MODULE AND OPTICAL DEVICE COMPRISING SAME

(71) Applicant: LG INNOTEK CO., LTD., Seoul (KR)

(72) Inventors: Tae Bong Park, Seoul (KR); Sang Ok Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/165,320

(22) Filed: Feb. 2, 2021

(65) Prior Publication Data

US 2021/0185194 A1    Jun. 17, 2021

Related U.S. Application Data

(63) Continuation of application No. 16/338,375, filed as application No. PCT/KR2017/010607 on Sep. 26, 2017, now Pat. No. 10,951,799.

(30) Foreign Application Priority Data

Sep. 30, 2016 (KR) .......................... 10-2016-0126745
Dec. 12, 2016 (KR) .......................... 10-2016-0168532
Dec. 12, 2016 (KR) .......................... 10-2016-0168533

(51) Int. Cl.
*H04N 5/225* (2006.01)
*G03B 3/10* (2021.01)
(Continued)

(52) U.S. Cl.
CPC ............. *H04N 5/2253* (2013.01); *G03B 3/10* (2013.01); *G03B 13/36* (2013.01); *H05K 3/34* (2013.01); *H02K 35/02* (2013.01); *H04N 5/2257* (2013.01)

(58) Field of Classification Search
CPC .... H04N 5/2253; H04N 5/2257; H04N 5/225; H04N 5/232; G03B 3/10; G03B 13/36;
(Continued)

(56) References Cited

U.S. PATENT DOCUMENTS

| 5,682,097 A | 10/1997 | Bryant et al. |
| 8,000,590 B2 * | 8/2011 | Tanimura ................. G02B 7/08 396/75 |

(Continued)

FOREIGN PATENT DOCUMENTS

| CN | 1860397 A | 11/2006 |
| CN | 104937482 A | 9/2015 |

(Continued)

OTHER PUBLICATIONS

International Search Report in International Application No. PCT/KR2017/010607, filed Sep. 26, 2017.
(Continued)

*Primary Examiner* — Chiawei Chen
(74) *Attorney, Agent, or Firm* — Saliwanchik, Lloyd & Eisenschenk

(57) ABSTRACT

An embodiment comprises: a housing; a bobbin disposed in the housing; a first coil disposed on the bobbin; a magnet disposed on the housing; a first sensing coil, disposed on the housing, for generating a first induced voltage by interacting with the first coil; a first circuit board connected to the first coil and the first sensing coil; and a first amplifier, disposed on the first circuit board, for amplifying the first induced voltage of the first sensing coil and outputting a first amplified signal.

20 Claims, 56 Drawing Sheets

(51) Int. Cl.
*G03B 13/36* (2021.01)
*H05K 3/34* (2006.01)
*H02K 35/02* (2006.01)

(58) Field of Classification Search
CPC .... G03B 2205/0069; G03B 2205/0015; G03B 30/00; G03B 2205/0007; H05K 3/34; H02K 35/02; H02K 41/0356; H02K 11/225; H02K 11/215; G02B 7/08; G02B 27/646
See application file for complete search history.

(56) References Cited

U.S. PATENT DOCUMENTS

| | | | | |
|---|---|---|---|---|
| 9,625,734 | B2* | 4/2017 | Dobermann | F16F 15/035 |
| 10,154,189 | B2* | 12/2018 | Kasamatsu | H04N 5/232123 |
| 10,498,263 | B2* | 12/2019 | Nomura | H02P 6/006 |
| 2003/0203532 | A1* | 10/2003 | Misawa | H04N 5/22521 438/89 |
| 2006/0028320 | A1* | 2/2006 | Osaka | G03B 3/10 340/384.1 |
| 2012/0014002 | A1* | 1/2012 | Ollila | G02B 7/08 359/824 |
| 2013/0038781 | A1* | 2/2013 | Inaji | H02P 23/18 348/357 |
| 2015/0207983 | A1* | 7/2015 | Kang | H04N 5/2254 348/349 |
| 2017/0059810 | A1* | 3/2017 | Kang | H02K 1/34 |
| 2018/0011284 | A1 | 1/2018 | Park et al. | |
| 2018/0026515 | A1 | 1/2018 | Park et al. | |
| 2020/0401197 | A1* | 12/2020 | Asada | G06F 1/189 |

FOREIGN PATENT DOCUMENTS

| | | |
|---|---|---|
| JP | 2008-51927 A | 3/2008 |
| JP | 2012-177754 A | 9/2012 |
| JP | 2014-126668 A | 7/2014 |
| JP | 2015-118115 A | 6/2015 |
| JP | 2015-191213 A | 11/2015 |
| JP | 2015-197627 A | 11/2015 |
| KR | 10-2008-0030790 A | 4/2008 |
| KR | 10-2009-0124318 A | 12/2009 |
| KR | 10-2015-0097998 A | 8/2015 |
| KR | 10-2015-0108107 A | 9/2015 |
| KR | 10-2016-0075100 A | 6/2016 |
| KR | 10-2016-0094636 A | 8/2016 |
| WO | WO-2016/099051 A1 | 6/2016 |
| WO | WO-2016/126061 A1 | 8/2016 |
| WO | WO-2018/062810 A1 | 4/2018 |

OTHER PUBLICATIONS

Supplementary European Search Report dated Jul. 11, 2019 in European Application No. 17856696.4.
Office Action dated May 12, 2020 in U.S. Appl. No. 16/338,375.
Notice of Allowance dated Nov. 2, 2020 in U.S. Appl. No. 16/338,375.
Office Action dated Oct. 28, 2020 in Chinese Application No. 201780068450.6.
"New 2016 Solder Joint Goals," *PCB Libraries Forum*, Jul. 3, 2016, pp. 1-3.
European Search Report dated Jun. 11, 2021 in European Application No. 20183989.1.
Office Action dated Jul. 8, 2021 in Chinese Application No. 201780068450.6.

* cited by examiner

LENS MOVING APPARATUS, AND CAMERA MODULE AND OPTICAL DEVICE COMPRISING SAME

CROSS-REFERENCE TO RELATED APPLICATIONS

This application is the continuation of U.S. application Ser. No. 16/338,375, filed Mar. 29, 2019; which is the U.S. national stage application of International Patent Application No. PCT/KR2017/010607, filed Sep. 26, 2017, which claims the benefit under 35 U.S.C. § 119 of Korean Application Nos. 10-2016-0126745, filed Sep. 30, 2016; 10-2016-0168532, filed Dec. 12, 2016; and 10-2016-0168533, filed Dec. 12, 2016; all of which are hereby incorporated by reference in their entirety.

TECHNICAL FIELD

Embodiments relate to a lens moving apparatus and a camera module and optical instrument including the same.

BACKGROUND ART

Since it is difficult to apply technology of a voice coil motor (VCM) used in a general camera module to a sub-miniature camera module for low-power consumption, research related thereto has been actively conducted.

In the case of a camera module mounted in a small electronic apparatus such as a smartphone, the camera module may be frequently impacted during use or may be slightly shaken due to hand tremor during photographing. Considering this, in recent years, technology for additionally providing a handshake inhibition unit to a camera module has been developed.

DISCLOSURE

Technical Problem

Embodiments provide a lens moving apparatus capable of reducing noise of a voltage induced in a second coil and improving accuracy of autofocus operation, and a camera module and optical instrument including the same.

Technical Solution

In an embodiment, a lens moving apparatus includes a housing, a bobbin disposed in the housing, a first coil disposed on the bobbin, a magnet disposed on the housing, a first sensing coil disposed on the housing to generate a first induced voltage by interaction with the first coil, a first circuit board electrically connected to the first coil and the first sensing coil, and a first amplifier disposed on the first circuit board to amplify the first induced voltage of the first sensing coil and to output a first amplified signal.

The first amplifier may include a first input terminal electrically connected with one end of the first sensing coil, a second input terminal electrically connected with the other end of the first sensing coil, an output terminal configured to output the first amplified signal, a first power terminal configured to receive first power, and a second power terminal configured to receive second power.

The first circuit board may include a first terminal electrically connected to the output terminal, a second terminal electrically connected to the first power terminal, a third terminal electrically connected to the second power terminal, a first dummy terminal disposed between the first terminal and the second terminal, and a second dummy terminal disposed between the first terminal and the third terminal.

The first terminal may be disposed between the second terminal and the third terminal.

The first circuit board may include a first terminal electrically connected to the output terminal, a second terminal electrically connected to the first power terminal, and a third terminal electrically connected to the second power terminal, the second and third terminals may be disposed at one side of the first terminal, the third terminal may be disposed between the first terminal and the second terminal, the first power may be connected to a first positive voltage, and the second power may be connected to a second negative voltage.

The first circuit board may further include a dummy terminal disposed between the first terminal and the third terminal.

A driving signal which is an alternating current (AC) signal may be applied to the first coil.

The lens driving apparatus may further include a second sensing coil disposed in the housing to generate a second induced voltage by interaction with the first coil, and a detector configured to receive the first induced voltage and the second induced voltage and to detect displacement of the bobbin.

The detector may determine noise generated in at least one of the first sensing coil or the second sensing coil based on the result of comparing the first induced voltage with the second induced voltage and detect and control displacement of the bobbin based on the result of determination.

The first sensing coil and the second sensing coil may be connected to each other in series, an intermediate tap may be provided at a contact point between one end of the first sensing coil and one end of the second sensing coil, and ground power may be supplied to the intermediate tap.

Advantageous Effects

Embodiments can reduce noise of a voltage induced by a second coil and improve accuracy of autofocus operation.

DESCRIPTION OF DRAWINGS

FIG. 24b is a perspective view except for the first sensing coil and the second sensing coil of FIG. 24a.

FIG. 24c is a view showing an embodiment of the first sensing coil and the second sensing coil shown in FIG. 24a.

BEST MODE

Figure 1:
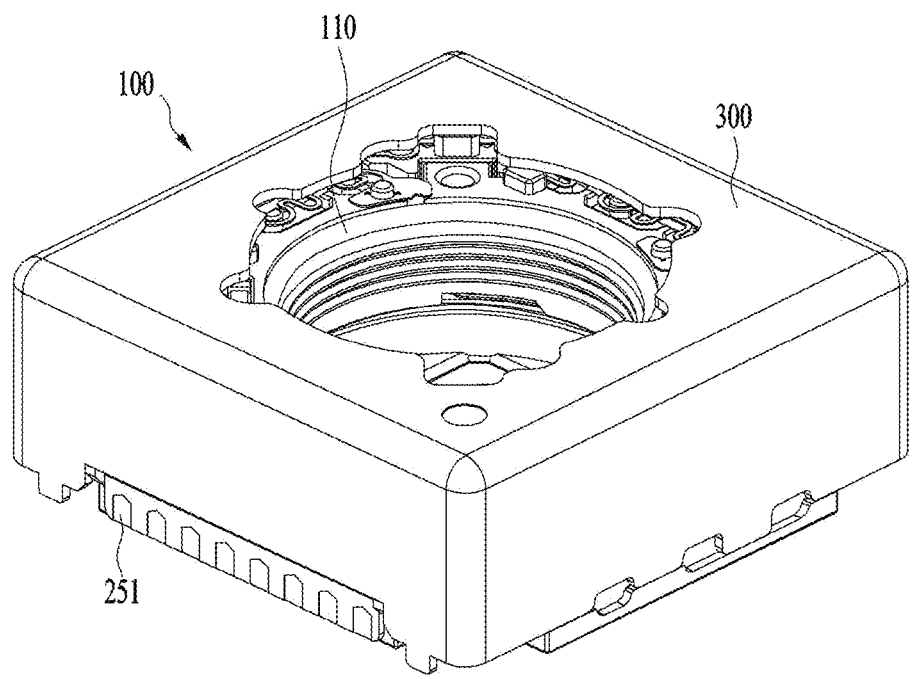
FIG. 1 is a perspective view of a lens moving apparatus according to an embodiment.

Hereinafter, embodiments will be described in detail with reference to the accompanying drawings. In description of the embodiments, it will be understood that, when an element such as a layer (film), region, pattern or structure is referred to as being formed "on" or "under" another element, such as a substrate, layer (film), region, pad or pattern, it can be directly "on" or "under" the other element or be indirectly formed with intervening elements therebetween. It will also be understood that "on" and "under" the element is described relative to the drawings.

In the drawings, dimensions may be exaggerated, omitted or schematically illustrated for convenience and clarity of description. In addition, the size of each element does not entirely reflect an actual size. The same reference numbers will be used throughout the specification to refer to the same or like constituent elements.

For convenience of description, a lens moving apparatus according to an embodiment is described using the Cartesian coordinate system (x, y, z), but may be described using another coordinate system, and the embodiment is not limited thereto. In the drawings, x- and y-axes indicate directions perpendicular to a z-axis, which is an optical axis direction. The optical axis or a z-axis direction parallel to the optical axis may be referred to as a "first direction", an x-axis direction may be referred to as a "second direction", and a y-axis direction may be referred to as a "third direction".

A "handshake correction device" applied to a small camera module of a mobile device such as a smartphone or a tablet PC may mean a device configured to inhibit the outline of a captured image from being blurred due to vibration by handshake of a user at the time of capturing a still image.

In addition, an "autofocusing device" is a device for automatically focusing and forming an image of a subject on an image sensor surface. The handshake correction device and the autofocusing device may be variously configured. A lens moving apparatus according to an embodiment may move an optical module including at least one lens in a first direction parallel to an optical axis or relative to a surface formed by second and third directions perpendicular to the first direction, thereby performing handshake correction operation and/or autofocus operation.

Figure 2:
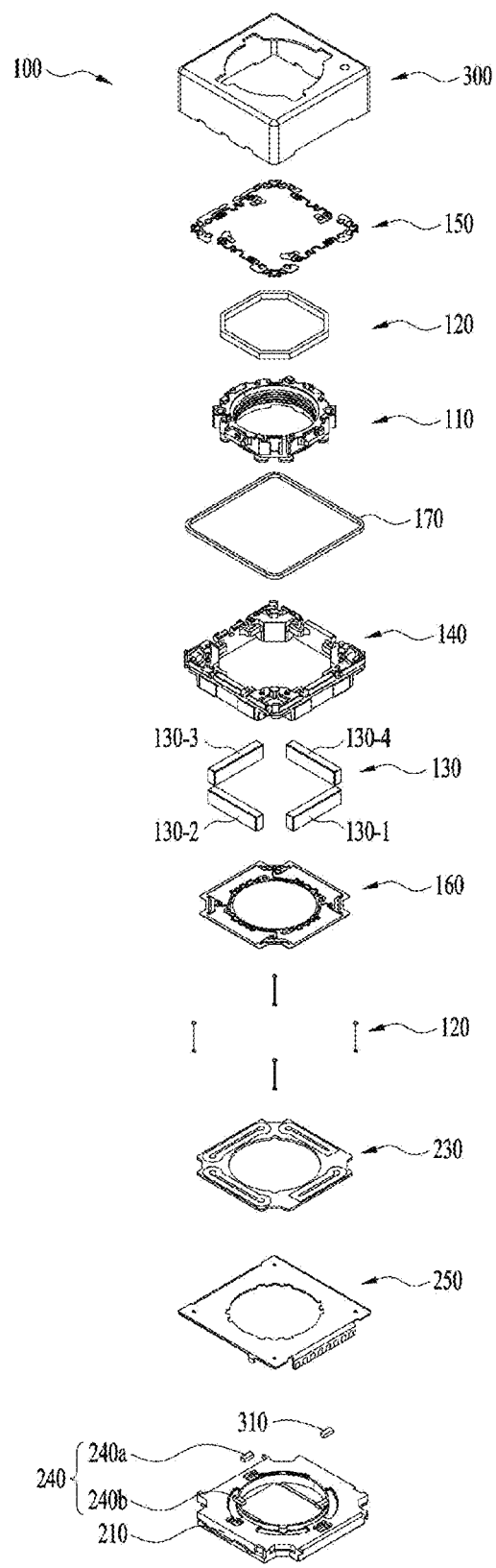
FIG. 2 is an exploded perspective view of the lens moving apparatus shown in FIG. 1.
Figure 3:
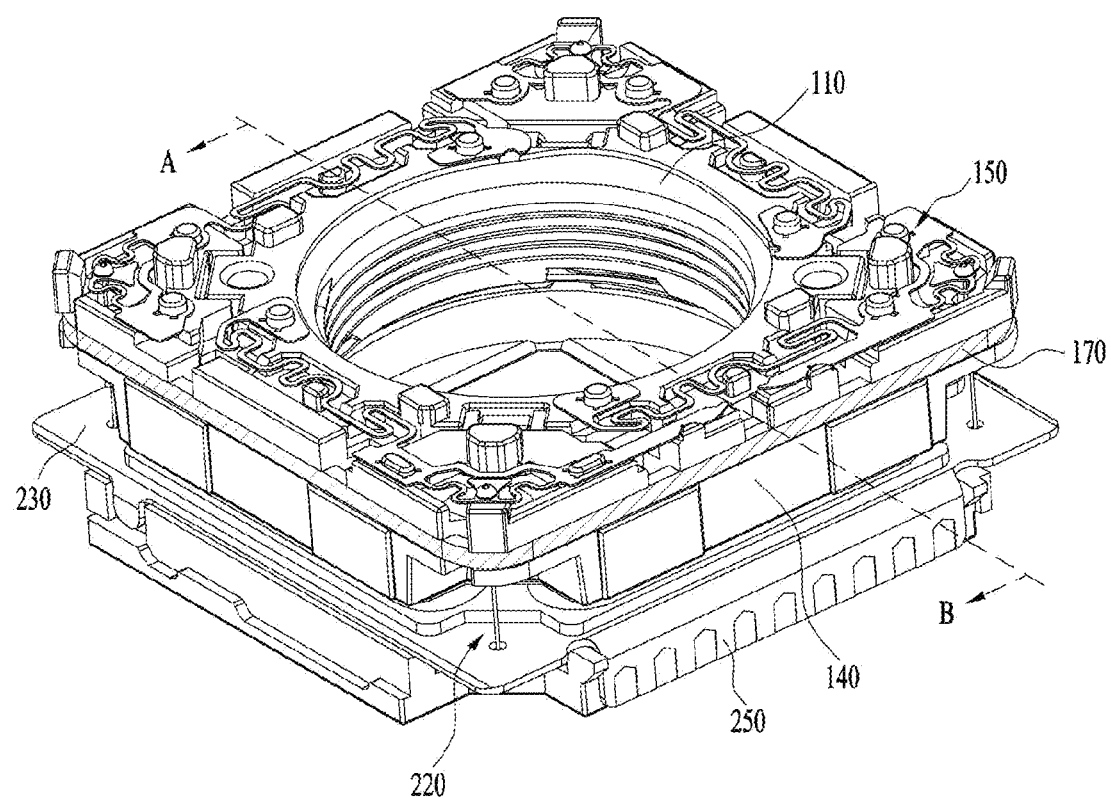
FIG. 3 is an assembled perspective view of the lens moving apparatus of FIG. 1 except for a cover.

FIG. 1 is a perspective view of a lens moving apparatus 100 according to an embodiment, FIG. 2 is an exploded perspective view of the lens moving apparatus 100 shown in FIG. 1, and FIG. 3 is an assembled perspective view of the lens moving apparatus 100 of FIG. 1 except for a cover 300.

Referring to FIGS. 1 to 3, the lens moving apparatus 100 includes a bobbin 110, a first coil 120, a magnet 130, a housing 140, an upper elastic member 150, a lower elastic member 160, a second coil 170, a supporting member 220, a third coil 230, a circuit board 250, position sensors 240 and an amplifier 310.

The lens moving apparatus 100 may further include a cover member 300 and a base 210.

First, the cover member 300 will be described.

The cover member 300 receives other elements 110 to 170 and 220 to 250 in a reception space formed together with the base 210.

The cover member 300 may be a box having an open lower portion and including an upper plate and side plates, a lower portion of the cover member 300 may be coupled with an upper portion of the base 210. The shape of an upper end of the cover member 300 may be polygonal, for example, rectangular or octagonal.

The cover member 300 may include a hollowness formed in the upper plate thereof to expose a lens (not shown) coupled to the bobbin 110 to external light. In addition, a window made of a light transmissive material may be further provided in the hollowness of the cover member 300 in order to inhibit foreign materials such as dust or moisture from permeating into a camera module.

The cover member 300 may be made of a nonmagnetic material such as SUS in order to inhibit the cover member from being adhered to the magnet 130 or may be made of a magnetic material to function as a yoke.

Next, the bobbin 110 will be described.

The bobbin 110 is disposed inside the housing 140.

Figure 4A:
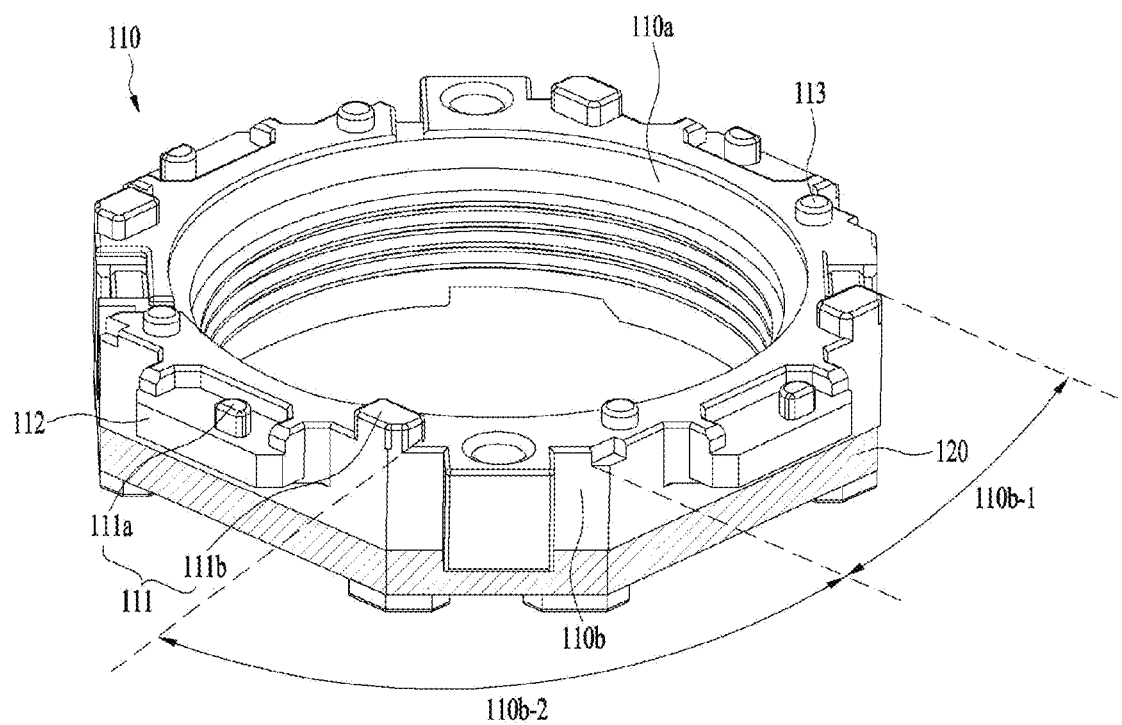
FIG. 4a is a first perspective view of a bobbin and a first coil shown in FIG. 1.
Figure 4B:
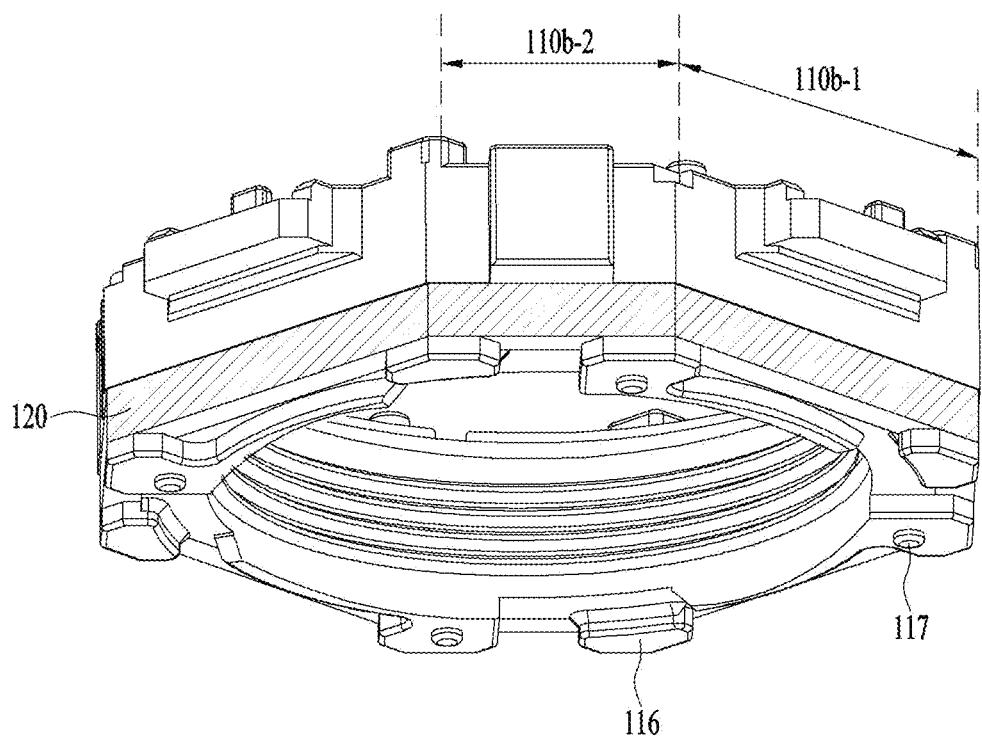
FIG. 4b is a second perspective view of the bobbin and the first coil shown in FIG. 1.

FIG. 4a is a first perspective view of the bobbin 110 and the first coil 120 shown in FIG. 1, and FIG. 4b is a second perspective view of the bobbin 110 and the first coil 120 shown in FIG. 1.

Referring to FIGS. 4a and 4b, the bobbin 110 may include a first protrusion 111 protruding from an upper surface thereof in a first direction and a second protrusion 112 protruding from an outer circumferential surface of the bobbin 110 in a second direction and/or a third direction.

The first protrusion 111 of the bobbin 110 may include a guide portion 111a and a first stopper 111b. The guide portion 111a of the bobbin 110 serves to guide the installation position of the upper elastic member 150. For example, the guide portion 111a of the bobbin 110 may guide a first frame connector 153 of the upper elastic member 150.

The second protrusion 112 of the bobbin 110 may protrude from the outer circumferential surface 110b of the bobbin 110 in the second direction and/or the third direction perpendicular to the first direction.

In addition, a first upper supporting projection 113 engaged with a through-hole 151a of a first inner frame 151 of the upper elastic member 150 may be provided on an upper surface of the bobbin 110.

The first stopper 111b and the second protrusion 112 of the bobbin 110 may serve to inhibit the upper surface of the bobbin 110 from directly colliding with the inside of the cover member 300 even when the bobbin 110 moves beyond a prescribed range by external impact in the case where the bobbin 110 moves in the first direction for the autofocus function.

The bobbin 110 may include a first lower supporting projection 117 formed on a lower surface thereof to be engaged with and fixed to the through-hole 161a of the lower elastic member 160.

The bobbin 110 may include a second stopper 116 protruding from the lower surface thereof. The second stopper 116 may serve to inhibit the lower surface of the bobbin 110 from directly colliding with the base 210, the third coil 230 or the circuit board 250 even when the bobbin 110 moves beyond a prescribed range by external impact in the case where the bobbin 110 moves in the first direction for the autofocus function.

The outer circumferential surface 110b of the bobbin 110 may include first side portions 110b-1 (or first side surfaces) and second side portions 110b-2 (or second side surfaces) located between the first side portions 110-1.

The first side portions 110b-1 of the bobbin 110 may correspond to or be opposite to the magnet 130. Each of the second side portions 110-b of the bobbin 110 may be disposed between two adjacent first side portions.

The outer circumferential surface of each of the first side portions 110b-1 of the bobbin 110 may be planar and the outer circumferential surface of each of the second side portions 110b-2 may be curved, without being limited thereto.

The bobbin 110 may include at least one first coil groove (not shown), in which the first coil 120 is disposed or installed, in the outer circumferential surface 110b thereof. For example, the first coil grooves may be provided in the first side portions and the second side portions of the bobbin 110. The shape and number of first coil grooves may correspond to the shape and number of first coils 120 disposed on the outer circumferential surface 110b of the bobbin 110. In another embodiment, the bobbin 110 may not include the first coil groove and the first coil 120 may be directly wound on and fixed to the outer circumferential surface of the bobbin 110.

Next, the first coil 120 will be described.

The first coil 120 may be disposed on the outer circumferential surface 110b of the bobbin 110, and may be an auto focus (AF) driving coil for performing electromagnetic interaction with the magnet 130 disposed in the housing 140.

In order to generate electromagnetic force by interaction with the magnet 130, a driving signal (e.g., driving current or voltage) may be applied to the first coil 120.

The driving signal applied to the first coil 120 may be an AC signal, e.g., AC current. For example, the driving signal provided to the first coil 120 may be a sine wave signal or a pulse signal (e.g., a pulse width modulation (PWM) signal).

In another embodiment, the driving signal applied to the first coil 120 may include an AC signal and a DC signal. The AC signal, e.g., AC current, is applied to the first coil 120, in order to induce electromotive force or a voltage in the second coil 172 by mutual induction.

By electromagnetic force due to interaction between the first coil 120 and the magnet 130, an AF movable portion may move in the first direction.

By controlling the driving signal applied to the first coil 120 to control electromagnetic force due to interaction between the first coil 120 and the magnet 130, it is possible to control movement of the AF movable portion in the first direction and thus to perform an autofocus function.

The AF movable portion may include the bobbin 110 elastically supported by upper and lower elastic members 150 and 160 and elements installed in the bobbin 110 to move along with the bobbin 110. For example, the AF movable portion may include the bobbin 110, the first coil 120, and a lens (not shown) installed in the bobbin 110.

The first coil 120 may be wound to surround the outer circumferential surface of the bobbin 110 to rotate about an optical axis in a clockwise or counterclockwise direction.

In another embodiment, the first coil 120 may be implemented in a closed loop shape wound clockwise or counterclockwise about an axis perpendicular to the optical axis, e.g., a coil ring shape, and the number of coil rings may be equal to the number of magnets 130, without being limited thereto.

The first coil 120 may be electrically connected to at least one of the upper or lower elastic members 150 or 160 and may be electrically connected to the circuit board 250 through the upper or lower elastic member 150 or 160 and the supporting members 220.

The housing 140 receives the bobbin 110, in which the first coil 120 is disposed.

Figure 5A:
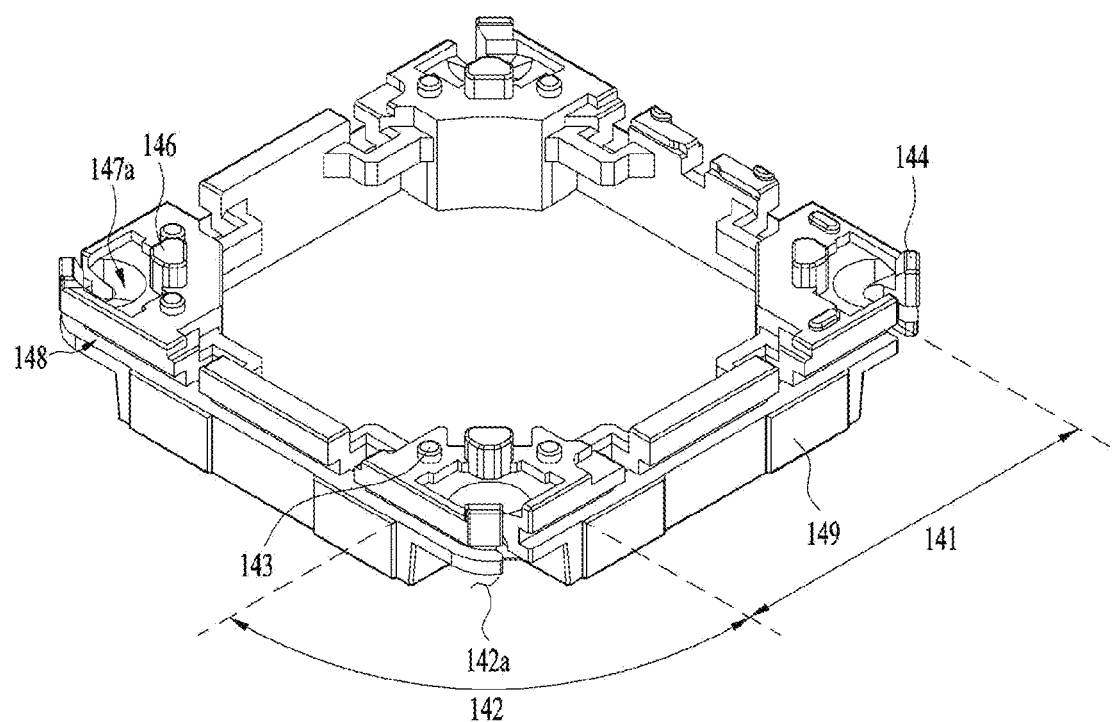
FIG. 5a is a first perspective view of a housing shown in FIG. 1.
Figure 5B:
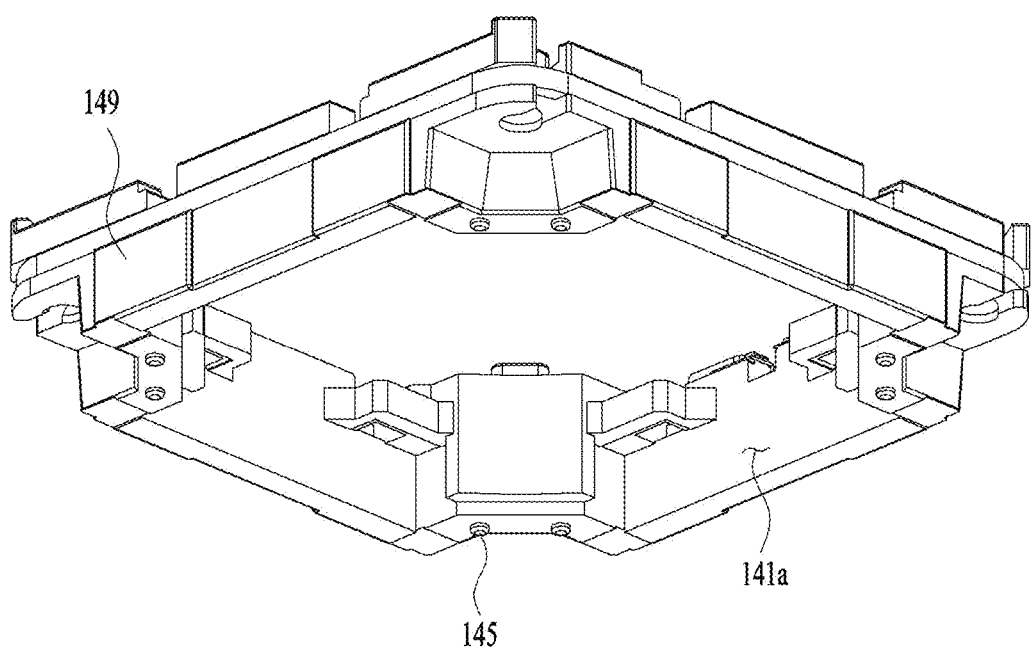
FIG. 5b is a second perspective view of the housing shown in FIG. 1.
Figure 6:
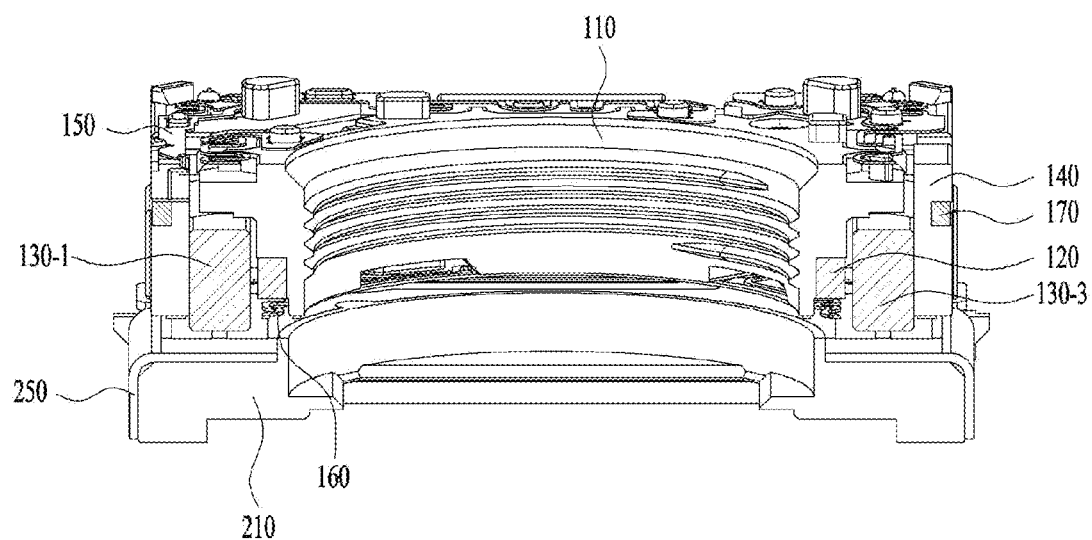
FIG. 6 is a cross-sectional view of the lens moving apparatus shown in FIG. 3 taken along line A-B.

FIG. 5a is a first perspective view of the housing 140 shown in FIG. 1, FIG. 5b is a second perspective view of the housing 140 shown in FIG. 1, and FIG. 6 is a cross-sectional view of the lens moving apparatus 100 shown in FIG. 3 taken along line A-B.

Referring to FIGS. 5a, 5b and 6, the housing 140 may have a hollow pillar shape and may include the plurality of side portions 141 and second side portions 142 forming the hollowness.

For example, the housing 140 may include the first side portions 141 spaced apart from each other and the second side portions 142 spaced apart from each other. The first side portions 141 of the housing 140 may be replaced with "side portions" and the second side portions 142 of the housing 140 may be replaced with "corner portions".

Each of the first side portions 141 of the housing 140 may be disposed or located between two adjacent second side portions 142 to connect the second side portions 142 to each other, and may include a plane having a certain depth.

The magnet 130 may be disposed or installed on the first side portions 141 of the housing 140, and a supporting member 220 may be disposed on the second side portions 142 of the housing 140.

The housing 140 may include a magnet seating portion 141a provided in the inner surfaces of the first side portions 141 in order to support or receive the magnets 130-1 to 130-4.

The housing 140 may include second coil seating grooves 148 for winding or accommodating the second coil 170.

The second coil seating grooves 148 of the housing 140 may be recessed from the outer surfaces of the first side portions 141 and the second side portions 142 of the housing 140.

For example, the second coil seating grooves 148 of the housing 140 may be provided on the upper ends of the outer surfaces of the first and second side portions 141 and 142.

For example, the second coil seating grooves 148 of the housing 140 may be spaced apart from the upper surface of the housing 140 to be provided in the outer surfaces of the first and second side portions 141 and 142, without being limited thereto.

The first side portions 141 of the housing 140 may be disposed in parallel to the side plate of the cover member 300. A through-hole 147a, through which the supporting member 220 passes, may be provided in the second side portions 142 of the housing 140.

In addition, a second stopper 144 may be provided on the upper surface of the housing 140, in order to inhibit direct collision with the inner surface of the cover member 300.

The housing 140 may include at least one second upper supporting projection 143 on the upper surfaces of the second side portions 142, for engagement with the through-hole 152a of the first outer frame 152 of the upper elastic member 150, and second lower supporting projections 145 on the lower surfaces of the second side portions 142, for engagement with and fixing to the through-hole 162a of the second outer frame 162 of the lower elastic member 160.

In order not only to secure a passage, through which the supporting member 220 passes, but also to secure a space filled with silicon capable of damping, the housing 140 may include grooves 142a provided in the second side portions 142. For example, the groove 142a of the housing 140 may be filled with damping silicon.

The housing 140 may include third stoppers 149 protruding from the outer surfaces of the first side portions 141. The third stoppers 149 can inhibit the housing 140 from colliding with the inner surface of the side plate of the cover member 300 when the housing 140 moves in the second and third directions.

The housing 140 may further include a fourth stopper (not shown) protruding from the lower surface thereof, in order to inhibit the bottom surface of the housing 140 from colliding with the base 210, the third coil 230 and/or the circuit board 250.

The magnets 130-1 to 130-4 are received inside the first side portions 141 of the housing 140, without being limited thereto. In another embodiment, the magnets 130-1 to 130-4 may be disposed outside the first side portions 141 of the housing 140.

The magnet 130 may be disposed on the first side portions 141 of the housing 140 to correspond to or be aligned with the first coil 120 in a direction perpendicular to the optical axis direction.

For example, the magnets 130-1 to 130-4 disposed in the housing 140 may overlap the first coil 120 in the direction perpendicular to the optical axis, for example, in the second or third direction, at the initial position of the bobbin 110. Here, the initial position of the bobbin 110 may be the initial position of the AF movable portion in a state in which power is not applied to the first coil 120 or a position where the AF movable portion is disposed as the upper and lower elastic members 150 and 160 are elastically deformed only by the weight of the AF movable portion.

The initial position of the bobbin 110 may be a position where the AF movable portion is disposed when gravity is applied in a direction from the bobbin 110 to the base 210 or when gravity is applied in a direction from the base 210 to the bobbin 110.

The AF movable portion may include the bobbin 110 and elements mounted in the bobbin 110.

In another embodiment, the first side portions 141 of the housing 140 are not provided with the magnet seating portion 141a, and the magnet 130 may be disposed at the outside or inside of the first side portions 141 of the housing 140.

The magnet 130 may have a shape corresponding to that of the first side portions 141 of the housing 140, e.g., a rectangular parallelepiped shape, without being limited thereto.

The magnet 130 may be a unipolar magnet or a bipolar magnet having an S-pole surface opposite to the first coil 120 and an N-pole outer surface thereof. However, the embodiment is not limited thereto and the S- and N-poles are reversely disposed.

In the embodiment, the number of magnets 130 is 4, but the embodiment is not limited thereto and the number of magnets 130 may be at least two. The surface of the magnet 130 opposite to the first coil 120 may be planar, but the embodiment is not limited thereto and the surface of the magnet 130 opposite to the first coil 120 may be curved.

Next, the upper elastic member 150 and the lower elastic member will be described.

The upper elastic member 150 and the lower elastic member 160 may be coupled with the bobbin 110 and the housing 140 to flexibly support the bobbin 110.

Figure 7:
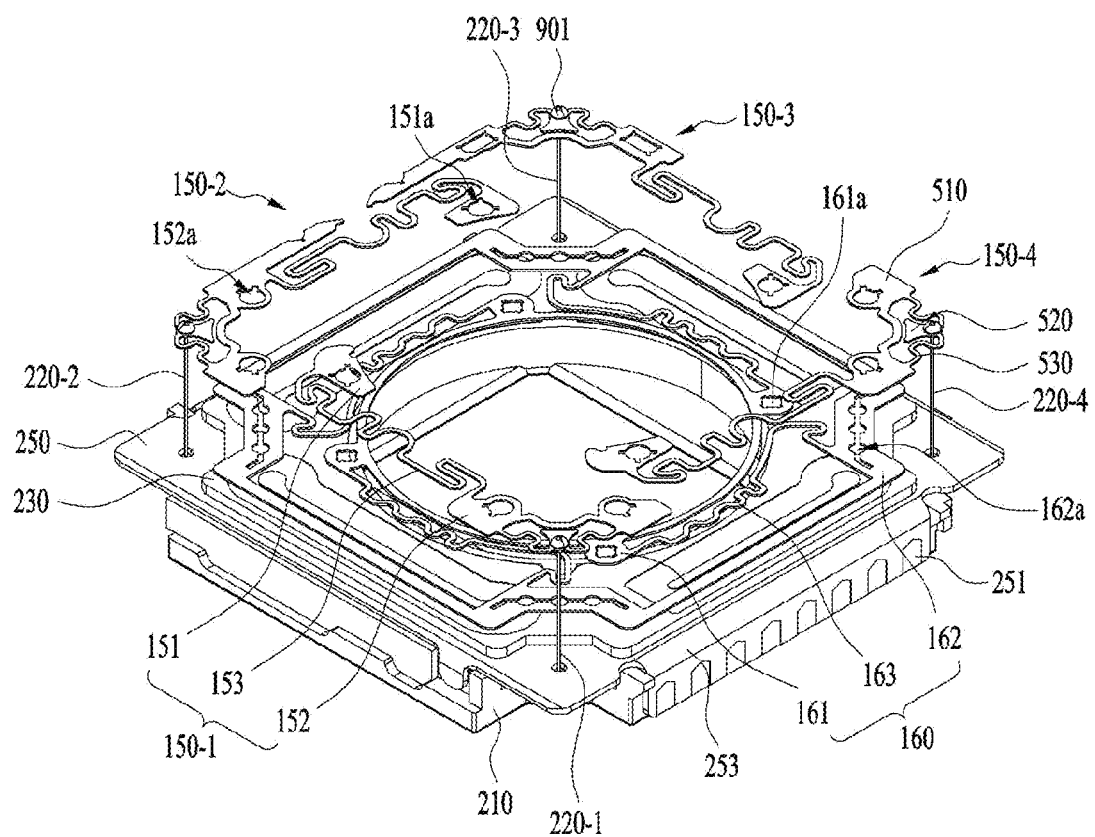
FIG. 7 is an assembled perspective view of an upper elastic member, a lower elastic member, a third coil, a circuit board and a base of FIG. 2.
Figure 8:
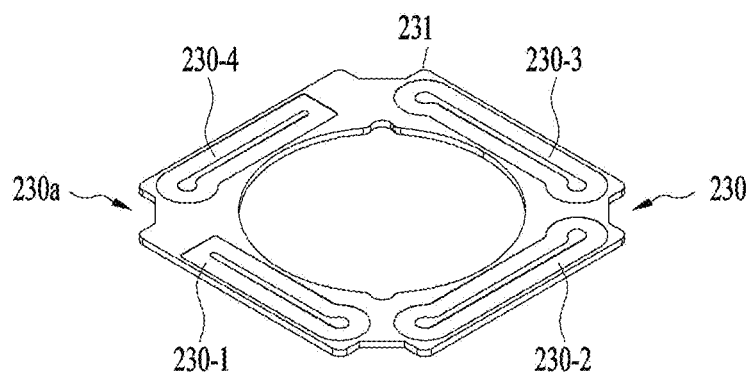
FIG. 8 is an exploded perspective view of the third coil, the circuit board, the base, first and second position sensors and an amplifier.
Figure 8:
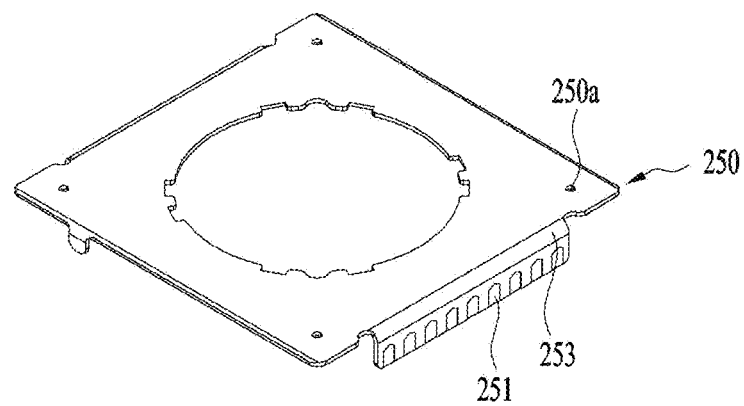
Figure 8:
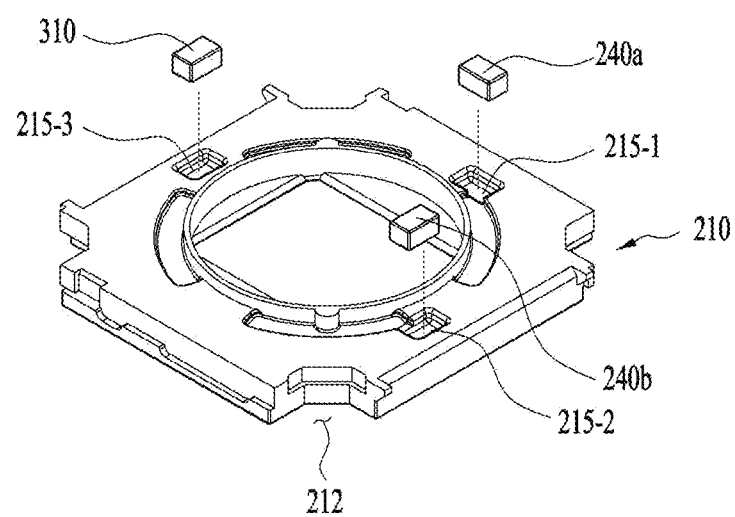

FIG. 7 is an assembled perspective view of the upper elastic member 150, the lower elastic member 160, the third coil 230, the circuit board 150 and the base 210 of FIG. 2, and FIG. 8 is an exploded perspective view of the third coil 230, the circuit board 250, the base 210, first and second position sensors 240a and 240b and an amplifier 310.

Referring to FIGS. 7 and 8, the upper elastic member 150 and the lower elastic member 160 may be coupled to the bobbin 110 and the housing 140 to flexibly support the bobbin 110.

For example, the upper elastic member 150 may be coupled to the upper portion, the upper surface or the upper end of the bobbin 110 and the upper portion, the upper surface or the upper end of the housing 140, and the lower elastic member 160 may be coupled to the lower portion, the lower surface or the lower end of the bobbin 110 and the lower portion, the lower surface or the lower end of the housing 140.

At least one of the upper and lower elastic members 150 and 160 may be divided into two or more.

For example, the upper elastic member 150 may include a plurality of upper springs spaced apart from each other, e.g., first to fourth upper springs 150-1 to 150-4.

The upper elastic member 150 and the lower elastic member 160 may be implemented as a leaf spring without being limited thereto and may be implemented as a coil spring, a suspension wire, etc.

Each of the first to fourth upper springs 150-1 to 150-4 may include an inner frame 151 coupled to the upper portion, the upper surface or the upper end of the bobbin 110, a first outer frame 152 coupled to the upper portion, the upper surface or the upper end of the housing 140, and a first frame connector 153 connecting the first inner frame 151 with the first outer frame 152.

The outer frame 152 of each of the first to fourth upper springs 150-1 to 150-4 may include a first coupler 510 coupled to the housing 140, a second coupler 520 coupled to the supporting members 220-1 to 220-4 and a connector 530 connecting the first coupler 510 with the second coupler 520.

The lower elastic member 160 may include a second inner frame 161 coupled to the lower portion, the lower surface or the lower end of the bobbin 110, a second outer frame 162 coupled to the lower portion, the lower surface or the lower end of the housing 140 and a second frame connector 163 connecting the second inner frame 161 with the second outer frame 162.

Each of the first and second frame connectors 153 and 163 of the upper and lower elastic members 150 and 160 may be formed to be bent or curved at least one time to form a predetermined pattern. Rising and falling operation of the bobbin 110 in the first direction may be flexibly (elastically) supported through positional change and microdeformation of the first and second frame connectors 153 and 163.

For example, one end of the first coil 120 may be bonded to the first inner frame 151 of any one (e.g., 150-1) of the upper springs 150-1 to 150-4 and the other end of the first coil 120 may be bonded to the first inner frame 151 of another (e.g., 150-2) of the upper springs 150-1 to 150-4.

In addition, for example, one end of the second coil 170 may be bonded to the first outer frame of another (e.g., 150-3) of the upper springs 150-1 to 150-4, and the other end of the second coil 170 may be bonded to the first outer frame of another (e.g., 150-4) of the upper springs 150-1 to 150-4.

For example, the first connector connected to the first coil 120 may be provided on the first inner frame 151 of each of the first to second upper springs 150-1 to 150-2 by soldering or a conductive adhesive member, and the second connector connected to the first coil 120 may be provided on the first outer frame 152 of each of the third to fourth upper springs 150-3 to 150-4 by soldering or a conductive adhesive member.

Each of the first to fourth upper springs 150-1 to 150-4 may include a through-hole 151a disposed in the first inner frame 151 and engaged with the first upper supporting projection 113 of the bobbin 110 and a through-hole 152a disposed in the first outer frame 152 and engaged with the second upper supporting projection 144 of the housing 140.

In addition, the lower elastic member 160 may include a through-hole 161a disposed in the second inner frame 161 and engaged with the first lower supporting projection 117 of the bobbin 110 and a through-hole 162a disposed in the second outer frame 162 and engaged with the second lower supporting projection 147 of the housing 140.

In order to absorb and damp vibration of the bobbin 110, the lens moving apparatus 100 may further include a first damping member (not shown) disposed between each of the upper springs 150-1 to 150-4 and the housing 140.

For example, the first damping member (not shown) may be disposed in a space between the first frame connector 153 of each of the upper springs 150-1 to 150-4 and the housing 140.

In addition, for example, the lens moving apparatus 100 may further include a second damping member (not shown) disposed between the second frame connector 163 of the lower elastic member 160 and the housing 140.

In addition, for example, a damping member (not shown) may be further disposed between the inner surface of the housing 140 and the outer circumferential surface of the bobbin 110.

Next, the second coil 170 will be described.

The second coil 170 may be disposed on the upper surface of the housing 140 or the side portions of the housing 140.

For example, the second coil 170 may be disposed at the upper side of the side portions of the housing 140. The second coil 170 may be referred to as a sensing coil.

The second coil 170 may have a closed loop shape wound to rotate clockwise or counterclockwise about an optical axis, e.g., a ring shape. For example, the second coil 170 may have a ring shape to surround the outer surfaces of the first and second side portions 141 and 142 of the housing 140 clockwise or counterclockwise about the optical axis.

The second coil 170 may be located below the upper elastic member 150 and may be located above the magnet 130.

At the initial position of the AF movable portion, the second coil 170 may not overlap the magnet 130 in the direction perpendicular to the optical axis direction, thereby reducing mutual interference between the magnet 130 and the sensing coil 170.

At the initial position of the AF movable portion, the second coil 170 may be located to be spaced apart from the first coil 120 by a predetermined distance in the optical axis direction, and may not overlap the first coil 120 in the direction perpendicular to the optical axis direction. When the predetermined distance between the first coil 120 and the second coil 170 in the optical axis direction is maintained, it is possible to ensure linearity of the voltage induced in the second coil 170 by current of the first coil 120.

At the initial position of the AF movable portion, the second coil 170 may overlap the magnet 130 in the optical axis direction, without being limited thereto. In another embodiment, the second coil 170 may not overlap the magnet 130 in the optical axis direction.

The second coil 170 may be disposed on the outer surfaces of the side portions of the housing 140 such that at least a portion thereof is located outside the supporting member 220. For example, the outside of the supporting member 220 may be opposite to the center of the hollowness of the housing 140 with respect to the supporting member 220.

The second coil 170 may be a sensing coil (e.g., an AF sensing coil) for sensing the position or displacement of the AF movable portion, e.g., the bobbin 110. For example, the second coil 170 may be implemented in the form of an FPCB or fine pattern (FP) coil.

For example, when the AF movable portion moves by interaction between the first coil 120, to which the driving signal is provided, and the magnet 130, an induced voltage may be generated in the second coil 170 by interaction with the first coil 120. The level of the induced voltage of the second coil 170 may be changed according to displacement of the AF movable portion. By detecting the level of the induced voltage generated in the second coil 170, it is possible to detect displacement of the AF movable portion.

Figure 13:
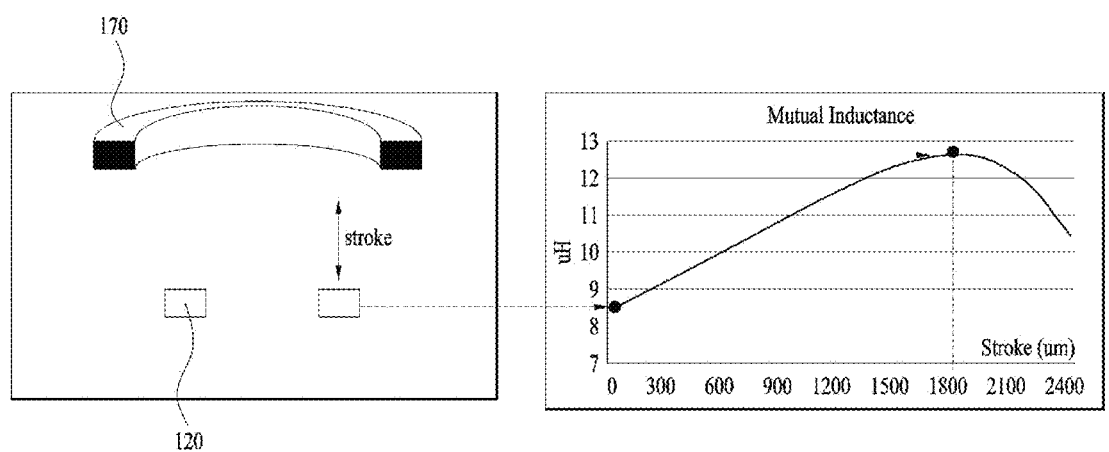
FIG. 13 is a view showing mutual inductance according to a distance between the first coil and the second coil.

FIG. 13 is a view showing mutual inductance according to a distance between the first coil 120 and the second coil 170. An X-axis represents movement displacement of an AF movable portion.

Referring to FIG. 13, as the distance between the first coil 120 and the second coil 170 decreases, mutual inductance between the first coil 120 and the second coil 170 may increase and the voltage induced in the second coil 170 may increase.

In contrast, as the distance between the first coil 120 and the second coil 170 increases, mutual inductance between the first coil 120 and the second coil 170 may decrease and the voltage induced in the second coil 170 may decrease.

Based on the level of the induced voltage generated in the second coil 170, displacement of the AF movable portion may be detected.

In general, for auto focus (AF) feedback control, since the AF movable portion, e.g., a position sensor for detecting displacement of the bobbin and a separate power connection structure for driving the position sensor are necessary, the price of the lens driving unit may increase and a difficulty in manufacturing process may occur.

In addition, a linear region (hereinafter referred to as a first linear region) of the graph showing the movement distance of the bobbin and the magnetic flux of the magnet detected by the position sensor may be limited by the positional relationship between the magnet and the position sensor.

In the embodiment, since a separate position sensor for detecting displacement of the bobbin 110 is not necessary, it is possible to reduce the cost of the lens moving apparatus and to improve the ease of the manufacturing process.

In addition, since mutual induction between the first coil 120 and the second coil 170 is used, the linear section of the graph between the movement distance of the bobbin 110 and the induced voltage of the second coil 170 may increase as compared to the first linear section. Therefore, the embodiment can secure a wide range of linearity, improve a process failure rate, and perform more accurate AF feedback control.

Next, the base 210, the third coil 230, the position sensor 240, the circuit board 250 and the amplifier 310 will be described.

The base 210 may be coupled with the cover member 300 to form a reception space between the bobbin 110 and the housing 140. The base 210 may include a hollowness corresponding to the hollowness of the bobbin 110 and/or the hollowness of the housing 140, and have a shape matching or corresponding to that of the cover member 300, e.g., a rectangular shape.

The base 210 may be located below the bobbin 110 and the housing 140, and may have a supporting groove or a supporting portion formed in a surface opposite to a portion on which a terminal surface 253 of the circuit board 250 is formed.

In order to avoid spatial interference with the supporting members 220-1 to 220-4, the corners of the base 210 may have grooves 212.

If the corners of the cover member 300 have a protruding shape, the protrusions of the cover member 300 may be coupled to the base 210 through the grooves 212.

The base 210 may include position sensor seating grooves 215-1 and 215-2 recessed from the upper surface thereof and having the position sensors 240a and 240b disposed therein.

In addition, a groove 215-3 in which the amplifier 310 is disposed may be provided in the upper surface of the base 210. For example, for ease of connection with the terminals 251, the groove 215-3 may be located in one area of the upper surface of the base 210 adjacent to the terminal surface 253 of the circuit board 250.

For example, the position sensor seating grooves 215-1 and 215-2 and the groove 215-3 may be disposed adjacent to different sides of the sides of the upper surface of the base 210.

The first and second position sensors 240a and 240b may be disposed in the position sensor seating grooves 215a and 215b of the base 210 located below the circuit board 250 and may be electrically connected to the circuit board 250. For example, the first and second position sensors 240a and 240b may be mounted on the back surface of the circuit board.

For example, each of the first and second position sensors 215a and 215b may receive the driving signal from the circuit board 250 and an output signal of each of the first and second position sensors 215a and 215b may be output to the circuit board 250.

The first and second position sensors 240a and 240b may detect displacement of the housing 140 relative to the base 210 in the direction (e.g., X-axis or Y-axis) perpendicular to the optical axis (e.g., Z-axis). For example, when the housing 140 moves in the second direction and/or the third direction, the first and second position sensors 240a and 240b may detect change in magnetic force emitted from the magnet 130 and output a signal according to the result of detection.

For example, the first and second position sensors 240a and 240b may be implemented as a Hall sensor alone or a driver including a Hall sensor. This is merely an example and any sensor capable of detecting a position in addition to magnetic force may be used. The first and second position sensors 240a and 240b may also be referred to as optical image stabilizer (OIS) position sensors.

The third coil 230 may be disposed at the upper side of the circuit board 250 and the first and second position sensors 240a and 240b and the amplifier 310 may be disposed at the lower side of the circuit board 250.

The circuit board 250 may be disposed on the upper surface of the base 210, and may include hollowness corresponding to the hollowness of the bobbin 110, the hollowness of the housing 140 and/or the hollowness of the base 210.

The circuit board 250 may include at least one terminal surface 253 bent from the upper surface thereof and a plurality of terminals 251 provided on the terminal surface 253. For example, the circuit board 250 may have the terminals provided on any two opposite sides of the upper surface thereof, without being limited thereto.

For example, the circuit board 250 may include first terminals electrically connected to the supporting members 221-1 to 220-4 electrically connected to the first coil 120 and the second coil 170, second terminals electrically connected to the third coils 230-1 to 230-4, and third terminals electrically connected to the amplifier 310.

The circuit board 250 may be a flexible printed circuit board (FPCB) without being limited thereto and the terminal of the circuit board 250 may be configured on the surface of the base 210 or a PCB using a surface electrode method.

The circuit board 250 may include through-holes 250a, through which the supporting members 220-1 to 220-4 pass. The supporting members 220-1 to 220-4 may be electrically connected to the lower surface (or a circuit pattern formed on the lower surface) of the circuit board 250 through the through-holes of the circuit board 250 using soldering.

In addition, in another embodiment, the circuit board 250 may not include the through-holes 250a, and the supporting members 220-1 to 220-4 may be electrically connected to the circuit pattern or the pad formed on the upper surface of the circuit board 250 through soldering.

A projection (not shown) for coupling with the circuit board 250 may be provided on the upper surface of the base 210, and the circuit board 250 may include a through-hole (not shown) engaged with and fixed to the projection of the base 210 through thermal fusion or an adhesive member.

The third coil 230 may be disposed on the upper surface of the circuit board 250 to correspond to or to be aligned with the magnet 130. The number of third coil 230 may be one or more and may be equal to the number of magnets 130, without being limited thereto.

For example, the third coil 230 may include a plurality of OIS coils 230-1 to 230-4 formed in a circuit member 231 or the board separately from the circuit board 250 without being limited thereto. In another embodiment, the OIS coils 230-1 to 230-4 may be spaced apart from each other on the circuit board 250 without a separate circuit member or a board.

The OIS coils 230-1 to 230-4 may be electrically connected to the circuit board 250, e.g., the terminals of the circuit board 250. The driving signal, e.g., driving current, may be provided to each of the OIS coils 230-1 to 230-4.

By electromagnetic force caused by interaction between the magnets 130 opposite to or aligned with each other and the OIS coils 230-1 to 230-4, to which the driving signal is provided, the housing 140 may move in the second direction and/or the third direction, and movement of the housing 140 may be controlled, thereby performing handshake correction.

By soldering or the conductive adhesive member, one end of the supporting member 220 may be coupled to the upper elastic member 150, and the other end of the supporting member 220 may be coupled to the circuit board 250, the circuit member 231 and/or the base 210.

A plurality of supporting members 220 may be provided and the plurality of supporting members 220-1 to 220-4 may be located to correspond to the second side portions 142 of the housing 140 to support the bobbin 110 and the housing 140 such that the bobbin 110 and the housing 140 move in the direction perpendicular to the first direction.

For example, each of the plurality of supporting members 220-1 to 220-4 may be disposed adjacent to any one of four second side portions 142. For example, the supporting members 220-1 to 220-4 may be located inside the second coil 170 having a ring shape.

Although one supporting member is disposed on each of the second side portions 142 of the housing 140 in FIG. 7, the embodiment is not limited thereto.

In another embodiment, two or more supporting members may be disposed on at least one of the second side portions 142 of the housing 140, and the upper elastic member 150 may include two or more upper springs separated and spaced apart from each other on at least one of the second side portions of the housing 140. For example, two supporting members disposed on any one of the second side portions of the housing 140 may be connected to any one of the two upper springs separated from each other on the second side portion.

One end of each of the supporting members 220-1 to 220-4 may be bonded to the outer frame 152 of the upper springs 150-1 to 150-4 disposed on the corresponding second side portion. The plurality of supporting members 220-1 to 220-4 may be spaced apart from the housing 140, and may not be fixed to the housing 140 but may be directly connected to the connector 530 of the outer frame 153 of the upper springs 150-1 to 150-4.

In another embodiment, the supporting member 220 may be disposed on the first side portions of the housing 140 in the form of a leaf spring.

The plurality of supporting members 220-1 to 220-4 and the upper springs 150-1 to 150-4 may transmit the driving signals from the circuit board 250 to the first coil 120, and the induced voltage output from the second coil 170 may be transmitted to the circuit board 250.

The plurality of supporting members 220-1 to 220-4 may be formed separately from the upper elastic member 150, and may be implemented as an elastically supportable member, e.g., a leaf spring, a coil spring or a suspension wire. In addition, in another embodiment, the supporting members 220-1 to 220-4 may be formed integrally with the upper elastic member 150.

Figure 9A:
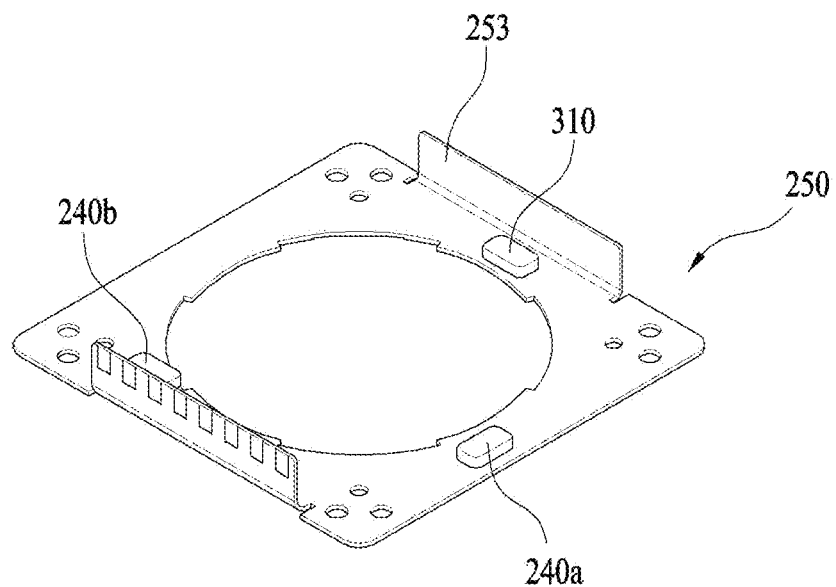
FIG. 9a is a view showing the first and second position sensors and the amplifier mounted on the circuit board.

FIG. 9a is a view showing the first and second position sensors 240a and 240b and the amplifier 310 mounted on the circuit board 250.

Referring to FIG. 9a, the first and second position sensors 240a and 240b and the amplifier 310 may be disposed on the first surface of the circuit board 250.

For example, the first surface of the circuit board 250 may be the lower surface of the circuit board 250 opposite to the upper surface of the base 210.

For example, each of the first and second position sensors 240a and 240b may be bonded to the lower surface of the circuit board 250 and may be electrically connected to at least one of the terminals of the circuit board 250.

For example, the amplifier 310 may be bonded to the lower surface of the circuit board 250 and may be electrically connected to at least another of the terminals of the circuit board 250.

The amplifier 310 may be formed in the form of a chip or an integrated circuit (IC), without being limited thereto.

Figure 9B:
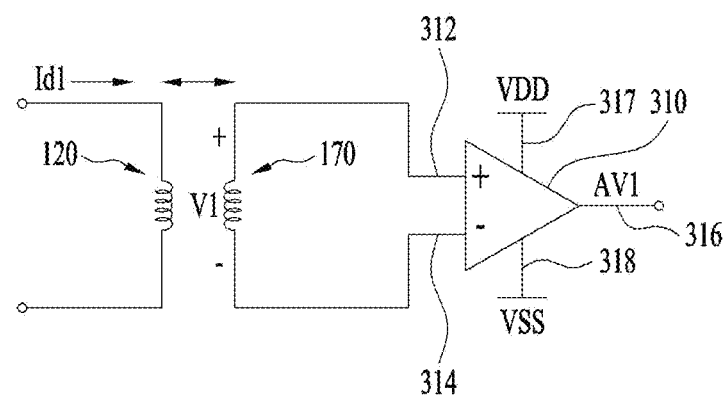
FIG. 9b is a view showing an conductible connection relationship between the second coil and the amplifier.

FIG. 9b is a view showing an conductible connection relationship between the second coil 170 and the amplifier 310.

Referring to FIG. 9b, the amplifier 310 includes a first input terminal 312, a second input terminal 314, an output terminal 316, and first and second power terminals 317 and 318.

A first power supply voltage VDD and a second power supply voltage VSS for amplification operation are provided to the first and second power terminals 317 and 318 of the amplifier 310. The first power supply voltage VDD may be provided to the first power terminal 317 and the second power supply voltage VSS may be provided to the second power terminal 318.

For example, the second power supply voltage VSS may be less than the first power supply voltage VDD. For example, the first power supply voltage VDD may be a positive voltage or may be connected to a positive voltage or the second power supply voltage VSS may be a negative voltage or may be connected to a negative voltage, without being limited thereto.

For example, the first power supply voltage VDD may be a positive voltage and the second power supply voltage VSS may be the ground or 0V.

The amplifier 310 amplifies the output signal V1 of the second coil 170 received through the first and second input terminals 312 and 314 and outputs an amplified signal AV1 according to the result of amplification. The amplified signal AV1 may be output to at least one of the terminals of the circuit board 250.

For example, one end of the second coil 170 may be connected to the first input terminal 312 of the amplifier 310, and the other end of the second coil 170 may be connected to the second input terminal 314 of the amplifier 310.

When the driving signal Id1 is provided to the first coil 120, the induced voltage V1 may be generated in the second coil 170, and the amplifier 310 may receive the induced voltage of the second coil 170 through the first and second input terminals 312 and 314, amplify the received induced voltage V1 and output an amplified signal V2 through the output terminal 316.

Figure 12:
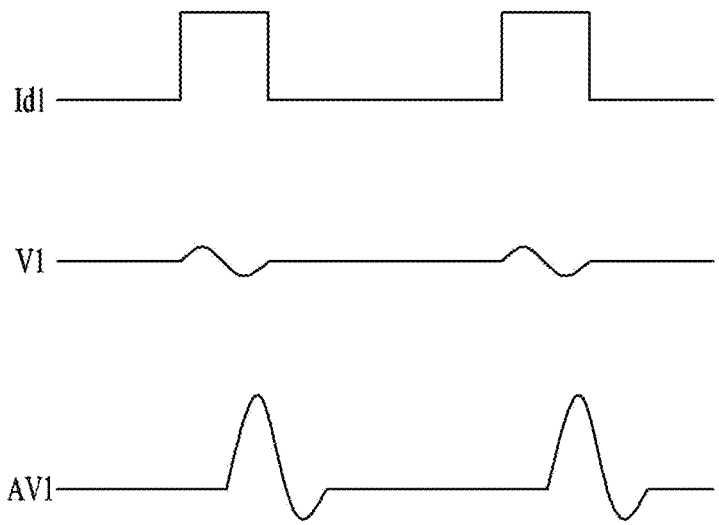
FIG. 12 is a view showing a driving signal of the first coil, an induced voltage of the second coil and an amplified signal of the amplifier.

FIG. 12 is a view showing the driving signal Id1 of the first coil 120, the induced voltage V1 of the second coil 170 and the amplified signal AV1 of the amplifier 310.

Referring to FIG. 12, the driving signal Id1 of the first coil 120 may be a pulse signal, e.g., a pulse width modulation (PWM) signal.

The induced voltage V1 may be generated in the second coil 170, by interaction with the first coil 120, to which the driving signal ID1 is provided.

The induced voltage V1 may include noise caused by a pattern and noise caused by an external environment (e.g., an external voltage). Such noise may cause errors in detection of displacement of the AF movable portion and reduce accuracy of the AF operation. For example, the noise caused by the pattern may include noise caused by the pattern of the second coil 170 or noise caused by the wire of the circuit board 250, without being limited thereto.

As shown in FIG. 12, the induced voltage V1 may include ripple caused by noise.

The amplifier 310 may amplify the induced voltage V1 with predetermined gain and output an amplified signal AV1 according to the result of amplification. For example, the predetermined gain may be 2× or 30×, without being limited thereto.

For example, the amplifier 310 may be a differential amplifier. For example, the first input terminal 312 of the amplifier 310 may be a positive (+) input terminal and the second input terminal 314 of the amplifier 310 may be a negative (−) input terminal.

For example, although the amplifier 310 is a differential amplifier, the embodiment is not limited thereto.

The level of the amplified signal AV1 of the amplifier 310 may be increased as compared to the induced signal V1, and ripple caused by the noise may be reduced. Therefore, upon comparison with the signal-to-noise ratio (SNR) of the induced voltage V1, the SNR of the amplified signal AV1 of amplifier 310 may be improved and influence of noise may be reduced.

Figure 10:
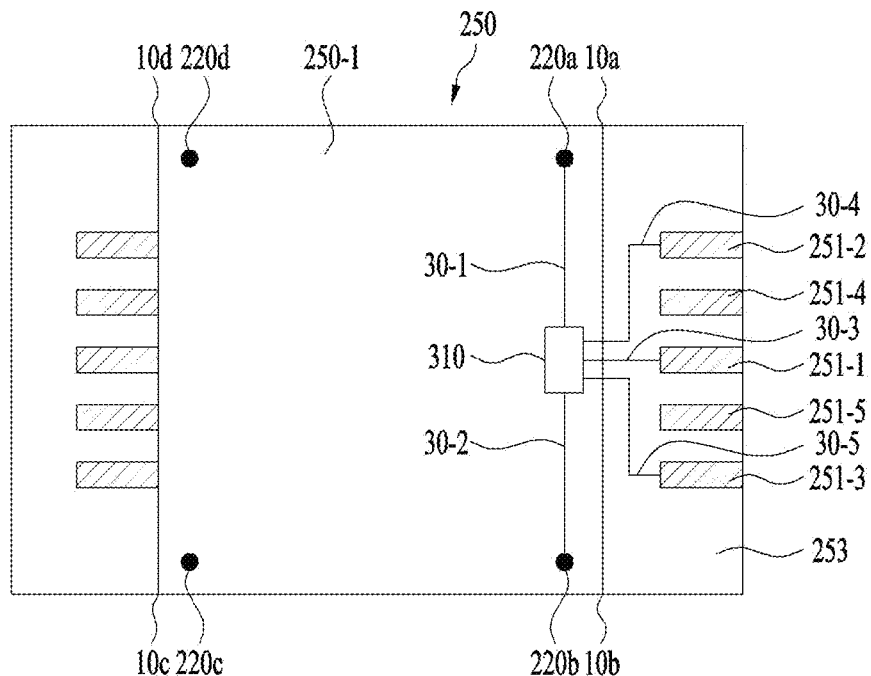
FIG. 10 is a view showing conductible connection between supporting members and the amplifier and conductible connection between the amplifier and terminals of the circuit board.

FIG. 10 is a view showing conductible connection between supporting members 220-1 to 220-4 and the amplifier 310 and conductible connection between the amplifier 310 and terminals 251-1 to 251-5 of the circuit board 250.

Referring to FIG. 10, each of the supporting members 220-1 to 220-4 may be bonded to any one adjacent area of the corners 10a to 10d of the lower surface of the circuit board 250 by penetrating through the circuit board 250. One end of each of the supporting members 220-1 to 220-4 may be bonded to any one of the pads 220a to 220d provided adjacent to the corners of the lower surface of the circuit board 250.

The first and second input terminals 312 and 314 of the amplifier 310 may be electrically connected to the supporting members (e.g., 220-3 and 220-4) electrically connected to the second coil 170.

For example, the first and second input terminals 312 and 314 of the amplifier 310 may be electrically connected to the first and second pads 220a and 220b of the circuit board 250, to which the supporting members (e.g., 220-3 and 220-4) electrically connected to the second coil 170 are bonded.

For example, the circuit board 250 may include a first wire 30-1 connecting the first input terminal 312 of the amplifier 310 with the first pad 220a of the circuit board 250 and second wires 30-1 and 30-2 connecting the second input terminal 314 of the amplifier 310 with the second pad 220b of the circuit board 250. The first wire 30-1 and the second wire 30-2 may have a straight-line shape without being limited thereto. In another embodiment, the first wire 30-1 and the second wire 30-2 may have a straight-line shape and/or a curved shape.

For example, the amplifier 310 may be disposed between the first and second pads 220a and 220b of the circuit board 250, and may be disposed on the lower surface of the circuit board 250 adjacent to the terminal surface 253 on which the terminals 251-1 to 251-5 are provided.

For example, the amplifier 310 may be disposed on the center of one area of the lower surface of the circuit board 250 located between the first and second pads 220a and 220b. For example, the distance between the amplifier 310 and the first pad 220a may be equal to the distance between the amplifier 310 and the second pad 220b.

In addition, for example, the length of the first wire 30-1 may be equal to that of the second wire 30-2. By making the length of the first wire 30-1 and the length of the second wire 30-2 equal, influence of noise by the wires 30-1 and 30-2 on the induced voltage of the second coil 170 may be reduced. For example, as the amplifier 310 differentially amplifies the induced voltage V1 input through the first wire 30-1 and the second wire 30-2, it is possible to reduce influence of noise.

The output terminal 316 of the amplifier 310 may be electrically connected to the first terminal 251-1 of the circuit board 250 through the third wire 30-3 provided on the circuit board 250.

In addition, the first power terminal 317 of the amplifier 310 and the second terminal 251-2 of the circuit board 250 may be electrically connected through the fourth wire 30-4 provided on the circuit board 250, and the second power terminal 318 of the amplifier 310 and the third terminal 251-3 of the circuit board 250 may be electrically connected through the fifth wire 30-5 provided on the circuit board 250.

The first terminal 251-1 of the circuit board 250 may be disposed between the second terminal 251-2 and the third terminal 251-3.

The circuit board 250 may include a first dummy terminal 251-4 disposed between the first terminal 251-1 and the second terminal 251-2 and a second dummy terminal 251-5 disposed between the first terminal 251-1 and the third terminal 251-3.

The first to third terminals 251-1 to 251-3 and the first and second dummy terminals 251-4 and 251-5 of the circuit board 250 may be arranged on the terminal surface 253 in a row in the direction perpendicular to the optical axis, e.g., in the X-axis or Y-axis direction.

The first and second dummy terminals 251-4 and 251-5 may be electrically disconnected from the first to third terminals 251-1 to 251-3. The first and second dummy terminals 251-4 and 251-5 may separate the first terminal 251-1 from the second and third terminals 251-2 and 251-3 and reduce influence of the voltages VDD and VSS input through the first and second terminals 251-2 and 251-3 on the amplified signal AV1 output from the first terminal 251-1.

That is, the first and second dummy terminals 251-4 and 251-5 may suppress noise generated in the amplified signal AV1 output from the first terminal 251-1 by the voltages VDD and VSS input through the first and second terminals 251-2 and 251-3.

Although one dummy terminal is disposed between the first terminal 251-1 and the second terminal 251-2 and between the first terminal 251-1 and the third terminal 251-3 in FIG. 10, the embodiment is not limited thereto.

In another embodiment, two or more dummy terminals may be disposed between the first terminal 251-1 and the second terminal 251-2 and between the first terminal 251-1 and the third terminal 251-3.

Figure 14A:
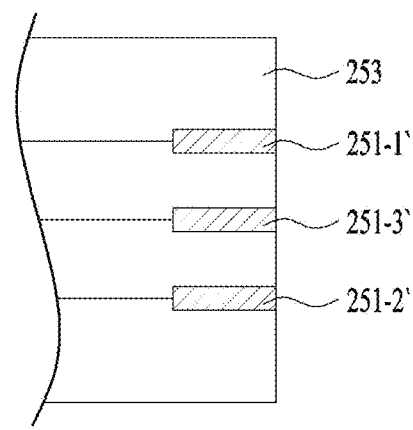
FIG. 14a is a view showing arrangement of first to third terminals according to another embodiment.

FIG. 14a is a view showing arrangement of first to third terminals 251-1' to 251-3' according to another embodiment.

Referring to FIG. 14a, the first terminal 251-1 may be electrically connected to the output terminal 316 of the amplifier 310, the second terminal 251-2' may be electrically connected to the first power terminal 317 of the amplifier 310, e.g., (+) power terminal, and the third terminal 251-3' may be electrically connected to the second power terminal 318 of the amplifier 310, e.g., (−) power terminal or the ground.

The second and third terminals 251-2' and 251-3' may be disposed on one side of the first terminal 251-2' and dummy terminals may not be disposed between the first to third terminals 251-1' to 251-3'. The third terminal 251-3' may be disposed between the first terminal 251-1' and the second terminal 251-2'.

By separating the first terminal 251-1' and the second terminal 251-2' from each other by the third terminal 251-3', it is possible to inhibit noise caused by the voltage VDD provided to the second terminal 251-2' from being generated in the amplified signal AV1 of the amplifier 310 output through the first terminal 251-1'.

Figure 14B:
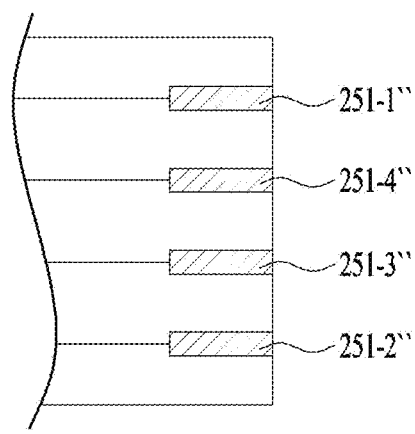
FIG. 14b is a view showing arrangement of first to third terminals and first and second dummy terminals according to another embodiment.

FIG. 14b is a view showing arrangement of first to third terminals 251-1" to 215-3" and a dummy terminal 251-4" according to another embodiment.

Referring to FIG. 14b, the first terminal 251-1" may correspond to the first terminal 251-1' of FIG. 14a, the second terminal 251-2" may correspond to the second terminal 251-2' of FIG. 14a, the third terminal 251-3" may correspond to the third terminal 251-3' of FIG. 14a, and the description of FIG. 14a is applicable thereto.

The dummy terminal 251-4" may be disposed between the first terminal 251-1" and the third terminal 251-3". The dummy terminal 251-4" may serve to inhibit noise from being generated in the amplified signal AV1 output from the first terminal 251-1" by the voltages VDD and VSS input through the first and second terminals 251-2 and 251-3.

Figure 11:
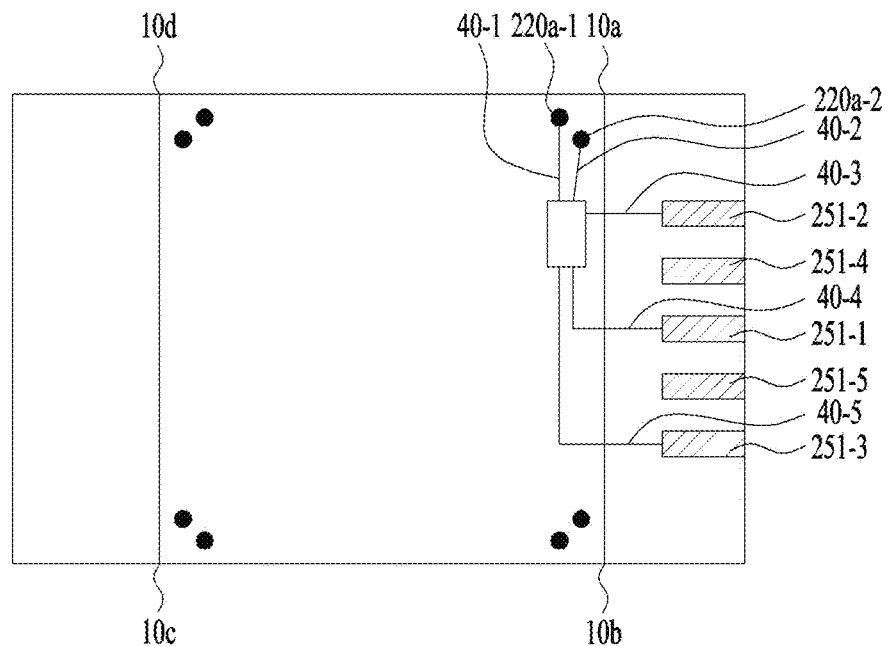
FIG. 11 is a view showing conductible connection between supporting members and the amplifier and conductible connection between the amplifier and terminals of the circuit board according to another embodiment.

FIG. 11 is a view showing conductible connection between the supporting members 220-1 to 220-4 and the amplifier 310 and conductible connection between the amplifier 310 and terminals 251-1 to 251-5 of the circuit board 250 according to another embodiment.

Referring to FIG. 11, two upper springs electrically connected to both ends of the second coil 170 may be disposed at the first corner of the corners of the housing 140. The two pads 220a-1 and 220-a-2 may be disposed adjacent to the second corner of the lower surface of the circuit board 250 corresponding to the first corner.

For example, two supporting members may be disposed on at least one of the second side portions of the housing 140 and two upper springs electrically connected to both ends of the second coil 170 may be disposed on at least one of the second side portions of the housing 140.

Two upper springs electrically connected to both ends of the second coil 170 may be electrically connected to two supporting members disposed on any one of the second side portions of the housing 140. The two supporting members electrically connected to the second coil 170 may be bonded to an area adjacent to any one of the corners 10a to 10d of the lower surface of the circuit board 250 by penetrating through the circuit board 250.

One end of each of two supporting members electrically connected to the second coil 170 may be bonded two pads 220a-1 and 220a-2 provided adjacent to the corner of the lower surface of the circuit board 250.

The first and second input terminals 312 and 314 of the amplifier 310 may be electrically connected to the first and second pads 220a-1 and 220a-2 of the circuit board 250.

For example, the circuit board 250 may include a first wire 40-1 connecting the first input terminal 312 of the amplifier 310 with the first pad 220a-1 of the circuit board 250 and a second wire 40-2 connecting the second input terminal 314 of the amplifier 310 with the second pad 220a-2 of the circuit board 250.

The amplifier 310 may be disposed adjacent to any one corner of the lower surface of the circuit board 250, on which the first and second pads 220a-1 and 220a-2 of the circuit board 250 are provided.

Since the amplifier 310 and the first and second pads 220a-1 and 220a-2 are disposed adjacent to any one corner of the circuit board 250, it is possible to reduce the lengths of the first wire 40-1 and the second wire 40-2 and to reduce noise generated in the amplified signal AV1 due to the wires 40-1 and 40-2.

As shown in FIG. 11, the output terminal 316 of the amplifier 310 and the first and second power terminals 317 and 318 may be electrically connected to the first to third terminals 251-1 to 251-3 of the circuit board 250 through the third to fifth wires 40-3 to 40-5 provided on the circuit board 250.

The circuit board 250 may include dummy terminals 251-4 and 251-5 disposed between the first terminal 251-1 and the second terminal 251-2 and between the first terminal 251-1 and the third terminal 251-3.

Meanwhile, the lens moving apparatus according to the above-described embodiment may be used in various fields such as camera modules or optical instruments.

Figure 15A:
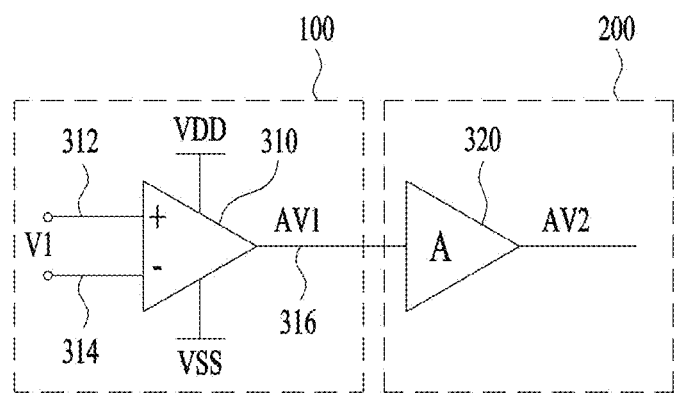
FIGS. 15a and 15b are block diagrams showing amplification of the induced voltage of the second coil by the amplifier of the lens moving apparatus and an amplifier of a camera module.
Figure 15B:
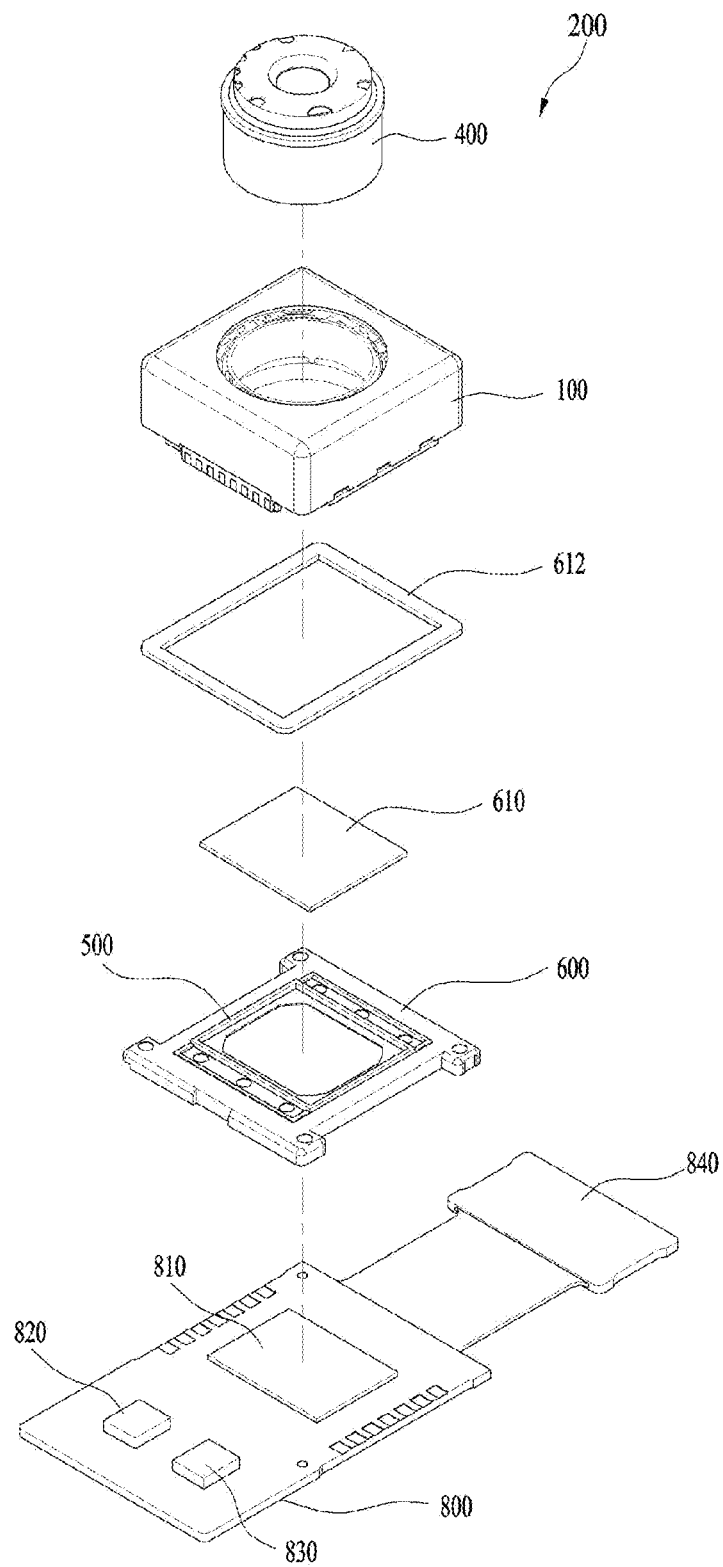

FIG. 15a is an exploded perspective view of a camera module 200 according to an embodiment, and FIG. 15b is a block diagram showing amplification of the induced voltage of the second coil by the amplifier 310 of the lens moving apparatus 100 and an amplifier 320 of a camera module 200.

Referring to FIG. 15a, the camera module 200 may include a lens barrel 400, a lens moving apparatus 100, an adhesive member 612, a filter 610, a first holder 600, a second holder 800, an image sensor 810, a motion sensor 820, a controller 830 and a connector 840.

The lens barrel 400 may be mounted in the bobbin 110 of the lens moving apparatus 100. In another embodiment, a lens may be directly mounted in the bobbin 110.

The first holder 600 may be disposed under the base 210 of the lens moving apparatus 100. The filter 610 may be mounted in the first holder 600, and the first holder 600 may include a protrusion 500 in which the filter 610 is seated.

The adhesive member 612 may couple or adhere the base 210 of the lens moving apparatus 100 to the first holder 600. The adhesive member 612 may serve to inhibit foreign materials from flowing into the lens moving apparatus 100 in addition to the above-described adhesive function. For example, the adhesive member 612 may be epoxy, a thermohardening adhesive or an ultraviolet hardening adhesive, etc.

The filter 610 may serve to block light in a specific frequency band of light passing through the lens or the lens barrel 400 from being input to the image sensor 810. The filter 610 may be an infrared ray (IR) cut filter, without being limited thereto. At this time, the filter 610 may be disposed to be parallel to the x-y plane.

A hollowness may be formed in a portion of the first holder 600 in which the filter 610 is mounted, such that light passing through the filter 610 is input to the image sensor 810.

The second holder 800 may be disposed below the first holder 600 and the image sensor 810 may be installed in the second holder 800. The image sensor 810 may be a portion in which an image included in light is formed by receiving light passing through the filter 610.

The second holder 800 may include various circuits or elements in order to convert the image formed by the image sensor 810 into an electrical signal and transmit the electrical signal to an external device.

The second holder 800 may have the image sensor installed therein, have a circuit pattern formed thereon, and may be implemented as a circuit board on which various elements may be coupled, such as a PCB or an FPCB.

The image sensor 810 may receive the image included in the light input through the lens moving apparatus 100 and convert the received image into an electrical signal.

The filter 610 and the image sensor 810 may be disposed to be spaced apart from and opposite to each other in a first direction.

The motion sensor 820 may be installed in the second holder 800, and may be electrically connected to the controller 830 through the wires or the circuit pattern provided on the second holder 800.

The motion sensor 820 outputs rotation angular speed information by movement of the camera module 200. The motion sensor 820 may be implemented as a 2-axis or 3-axis gyro sensor or an angular speed sensor. The motion sensor 820 may be configured separately from the controller 830 without being limited thereto. In another embodiment, the motion sensor may be configured to be included in the controller 830.

The controller 830 may be mounted on the second holder 800 and may be electrically connected to the first coil 120, the second coil 170, and the third coil 230, the first and second position sensors 240a and 240b, and the amplifier 310 of the lens moving apparatus 100.

For example, the second holder 800 may be electrically connected to the circuit board 250 of the lens moving apparatus 100, the controller 820 mounted on the second holder 800 may be electrically connected to the first coil 120, the second coil 170, the third coil 230, the first and second position sensors 240a and 240b, and the amplifier 310 through the terminals 251 of the circuit board 250.

For example, the controller 830 may include an AF driver, an OIS driver, first and second drivers, first to third amplifiers and a servo controller.

The AF driver may provide a first driving signal for driving the first coil 120.

The OIS driver may provide a second driving signal for driving the third coils 230-1 to 230-4.

The first driver may provide a third driving signal for driving a first position sensor 240a and the second driver may provide a fourth driving signal for driving a second position sensor 240b.

The first amplifier 320 (see FIG. 15a) may amplify an amplified signal AV1 of the amplifier 310 and output the amplified signal according to the result of amplification. The second amplifier may amplify the output signal of the first position sensor 240*a* and output an amplified signal according to the result of amplification. The third amplifier may amplify the output signal of the second position sensor 240*b* and output the amplified signal according to the result of amplification.

Referring to FIG. 15*b*, the induced voltage V1 of the second coil 170 may be primarily amplified by the amplifier 310 and thus the lens moving apparatus 100 may output the first amplified signal AV1 having an improved SNR.

The camera module 200 may receive the first amplified signal AV1 having the improved SNR from the lens moving apparatus 100, and the first amplifier 320 may secondarily amplify the first amplified signal AV1 by predetermined gain A and output a second amplified signal AV2.

The gain of the first amplifier 200 of the camera module 200 may be greater than that of the amplifier 310 of the lens moving apparatus 100. For example, the amplification factor of the amplifier 310 of the lens moving apparatus 100 may be less than that of the first amplifier 320 of the camera module 200.

Since the camera module 200 receives the first amplified signal AV1 having the improved SNR from the lens moving apparatus 100 and amplifies the received first amplified signal, it is possible to reduce influence of noise generated in the lens moving apparatus 100. Therefore, the embodiment can improve accuracy of AF operation.

The servo controller may output a first control signal for controlling the AF driver based on the amplified signal AV2 of the first amplifier 320 and the rotation angular speed information received from the motion sensor 820 and perform AF feedback operation through the first control signal.

In addition, the servo controller may output a second control signal for controlling the OIS driver based on the amplified signals of the second and third amplifiers and the rotation angular speed information received from the motion sensor 820 and perform OIS feedback operation through the second control signal.

The connector 840 may be electrically connected to the second holder 800, and may include a port for conductible connection with an external device.

Figure 16:
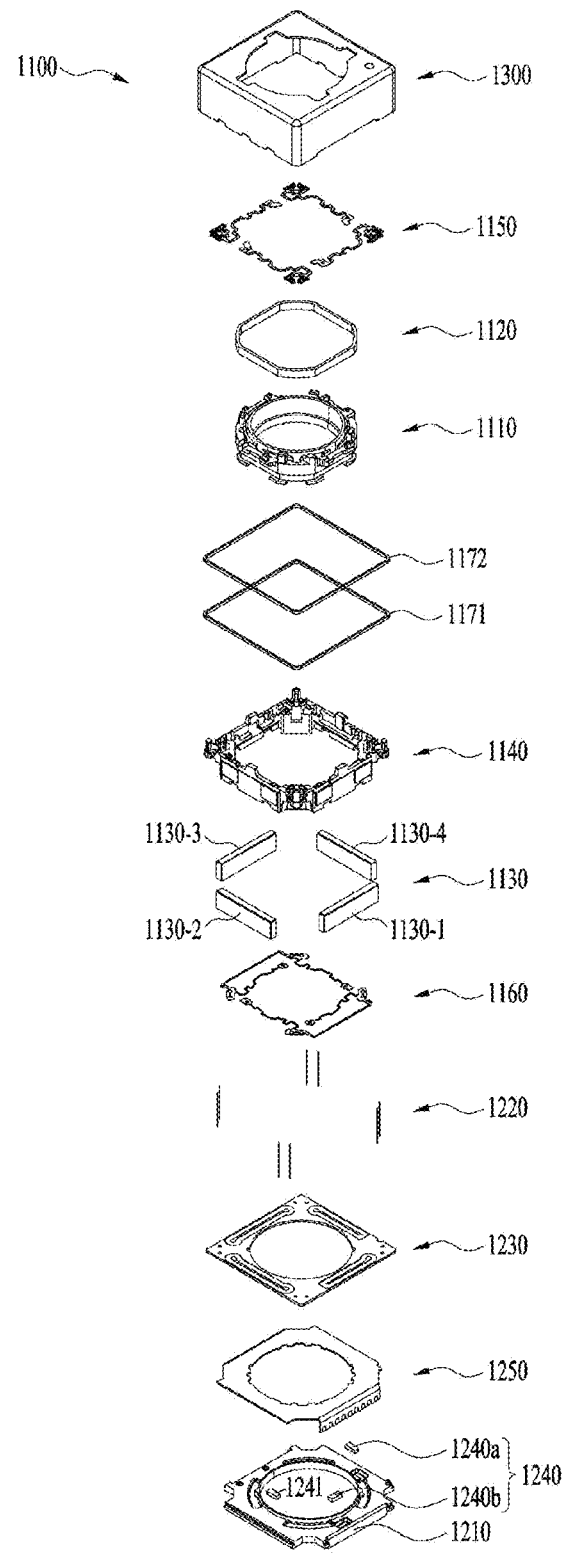
FIG. 16 is an exploded perspective view of a lens moving apparatus according to another embodiment.
Figure 17:
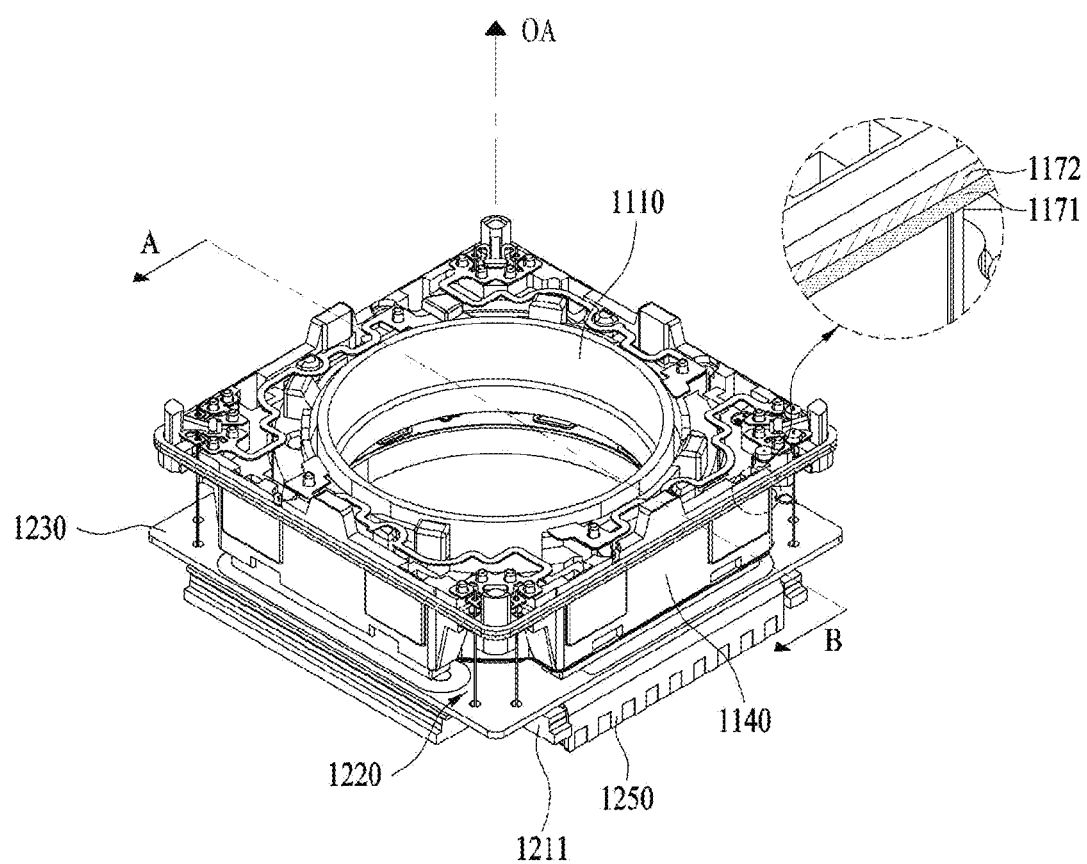
FIG. 17 is an assembled perspective view of the lens moving apparatus of FIG. 16 except for a cover.

FIG. 16 is an exploded perspective view of a lens moving apparatus 1100 according to another embodiment, and FIG. 17 is an assembled perspective view of the lens moving apparatus 1100 of FIG. 16 except for a cover 1300.

Referring to FIGS. 16 and 17, the lens moving apparatus 1100 includes a bobbin 1110, a first coil 1120, a magnet 1130, a housing 1140, an upper elastic member 1150, a lower elastic member 1160, a first sensing coil 1171, a sensing coil 1172, a supporting member 1220, a third coil 1230, a circuit board 1250, position sensors 1240 and a detector 1241. The lens moving apparatus 100 may further include a cover member 1300 and a base 1210.

The first sensing coil 1171 may be referred to as a second coil, the second sensing coil 1172 may be referred to as a third coil, and the third coil 1230 may be referred to as a fourth coil.

The cover member 1300 receives the other elements 1110, 1120, 1130, 1140, 1150, 1160 and 1250 in a reception space formed together with the base 1210.

The cover member 1300 may be a box having an open lower portion and including an upper plate and side plates, a lower portion of the cover member 1300 may be coupled with an upper portion of the base 1210. The shape of an upper end of the cover member 300 may be polygonal, for example, rectangular or octagonal.

The cover member 1300 may include a hollowness formed in the upper end thereof to expose a lens (not shown) coupled to the bobbin 1110. In addition, a window made of a light transmissive material may be further provided in the hollowness of the cover member 1300 in order to inhibit foreign materials such as dust or moisture from permeating into the camera module.

The cover member 1300 may be made of a nonmagnetic material such as SUS in order to inhibit the cover member from being adhered to the magnet 1130 or may be made of a magnetic material to function as a yoke.

The bobbin 1110 may be disposed inside the housing 1140, and may move in an optical-axis (OA) direction or a first direction (e.g., a Z-axis direction) by electromagnetic interaction between the first coil 1120 and the magnet 130.

A lens may be directly installed in the bobbin 1110, without being limited thereto. In another embodiment, the bobbin 1110 may include a lens barrel (not shown) in which at least one lens is installed, and the lens barrel may be coupled to the inside of the bobbin 1110 using various methods.

The bobbin 1110 may have a hollowness in which the lens or the lens barrel will be installed. The shape of the hollowness of the bobbin 1110 may be equal to the shape of the lens or the lens barrel and may be, for example, circular, elliptical or polygonal, without being limited thereto.

Figure 18A:
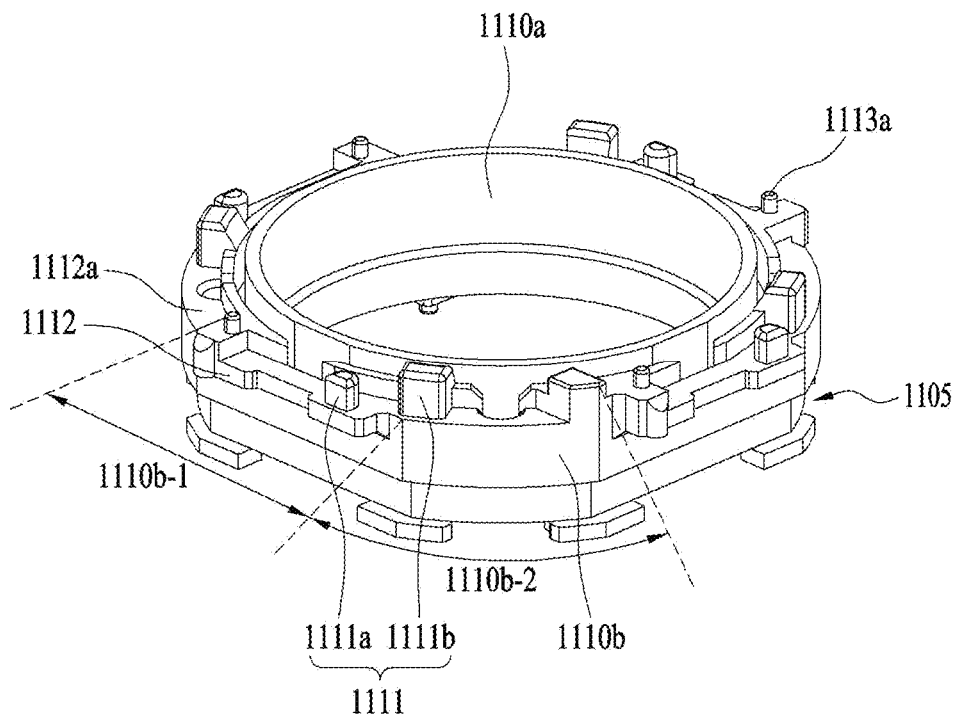
FIG. 18a is a first perspective view of a bobbin shown in FIG. 16.
Figure 18B:
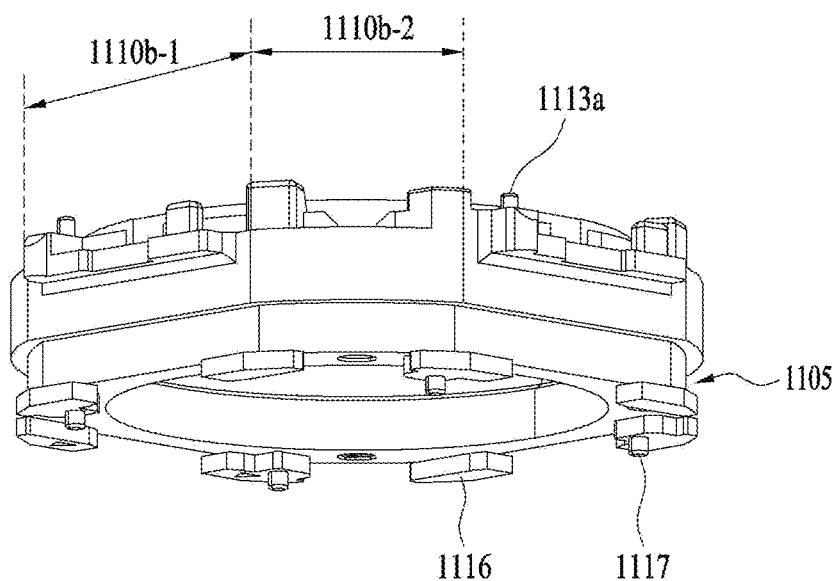
FIG. 18b is a second perspective view of the bobbin shown in FIG. 16.

FIG. 18*a* is a first perspective view of the bobbin 1110 shown in FIG. 16, and FIG. 18*b* is a second perspective view of the bobbin 1110 shown in FIG. 16.

Referring to FIGS. 18*a* and 18*b*, the bobbin 1110 may include a first protrusion 1111 protruding from an upper surface of the bobbin 1110 in a first direction and a second protrusion 1112 protruding from an outer circumferential surface of the bobbin 110 in a second direction and/or a third direction.

The first protrusion 1111 of the bobbin 1110 may include a guide portion 1111*a* and a first stopper 1111*b*. The guide portion 1111*a* of the bobbin 1110 serves to guide the installation position of the upper elastic member 1150. For example, the guide portion 111*a* of the bobbin 1110 may guide a first frame connector 1153 of the upper elastic member 1150.

The second protrusion 1112 of the bobbin 1110 may protrude from the outer circumferential surface of the bobbin 1110 in the second direction and/or the third direction perpendicular to the first direction. In addition, a first engagement projection 1113*a* engaged with a through-hole 1151*a* of a first inner frame 1151 of the upper elastic member 1150 may be provided on an upper surface 1112*a* of the second protrusion 1112 of the bobbin 1110.

The first stopper 1111*b* of the first protrusion 111 and the second protrusion 1112 of the bobbin 1110 may serve to inhibit the upper surface of the bobbin 1110 from directly colliding with the inside of the cover member 1300 even when the bobbin 1110 moves beyond a prescribed range by external impact while the bobbin 1110 moves in the first direction for the autofocus function.

The bobbin 1110 may include a second engagement projection 1117 engaged with and fixed to the through-hole 1161*a* of the lower elastic member 1160.

The bobbin 1110 may include a second stopper 1116 protruding from the lower surface thereof.

The second stopper 1116 of the bobbin 1110 may serve to inhibit the lower surface of the bobbin 1110 from directly colliding with the base 1210, the third coil 1230 or the circuit board 1250 even when the bobbin 1110 moves beyond a prescribed range by external impact while the bobbin 1110 moves in the first direction for the autofocus function.

The outer circumferential surface 1110*b* of the bobbin 1110 may include first side portions 1110*b*-1 and second side portions 1110*b*-2 located between the first side portions 1110*b*-1.

The first side portions 1110*b*-1 of the bobbin 1110 may correspond to or be opposite to the magnet 1130 and may correspond to or be opposite to the first side portions 1141 of the housing 1140.

Each of the second side portions 1110*b*-2 of the bobbin 1110 may be disposed between two adjacent first side portions. The outer circumferential surface of each of the first side portions 1110*b*-1 of the bobbin 1110 may be planar. The outer circumferential surface of each of the second side portions 1110*b*-2 of the bobbin 1110 may be curved, without being limited thereto. In another embodiment, the outer circumferential surface of each of the second side portions 1110*b*-2 of the bobbin 1110 may be planar.

A groove 1105 in which the first coil 1120 will be seated or disposed may be provided in the outer circumferential surface of the bobbin 1110. For example, the groove 1105 may be provided in the outer surfaces of the first and second side portions 1110*b*-1 and 1110*b*-2 of the bobbin 1110.

The first coil 1120 is disposed on the outer circumferential surface 1110*b* of the bobbin 1110.

The first coil 1120 may be an AF driving coil for performing electromagnetic interaction with the magnet 1130 disposed in the housing 1140.

In order to generate electromagnetic force by electromagnetic interaction with the magnet 1130, a driving signal (e.g., driving current or voltage) may be applied to the first coil 1120.

By electromagnetic force due to interaction between the first coil 1120 and the magnet 1130, an AF movable portion may move in the first direction. By controlling the driving signal applied to the first coil 1120 to control electromagnetic force, it is possible to control movement of the AF movable portion in the first direction and thus to perform an autofocus function.

The AF movable portion may include the bobbin 1110 elastically supported by upper and lower elastic members 1150 and 1160 and elements installed in the bobbin 1110 to move along with the bobbin 1110. For example, the AF movable portion may include the bobbin 1110, the first coil 1120, and a lens (not shown) installed in the bobbin 1110.

For example, the first coil 1120 may be wound to surround the outer circumferential surface of the bobbin 1110 to rotate about an optical axis (OA) in a clockwise or counterclockwise direction. In another embodiment, the first coil 1120 may be implemented in a coil ring shape wound clockwise or counterclockwise about an axis perpendicular to the optical axis OA, and the number of coil rings may be equal to the number of magnets 1130, without being limited thereto.

The first coil 1120 may be electrically connected to at least one of the upper or lower elastic members 1150 or 1160.

The housing 140 receives the bobbin 1110, in which the first coil 1120 is disposed or mounted, and supports the magnet 1130, the first sensing coil 1171 and the second sensing coil 1172.

Figure 19A:
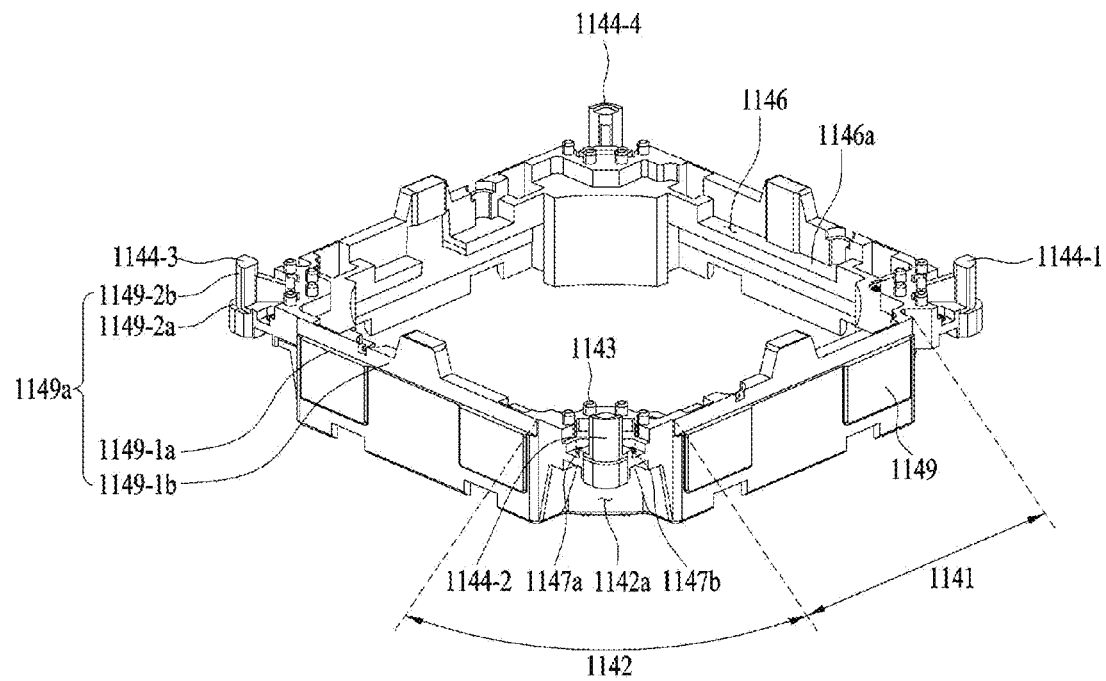
FIG. 19a is a first perspective view of a housing shown in FIG. 16.
Figure 19B:
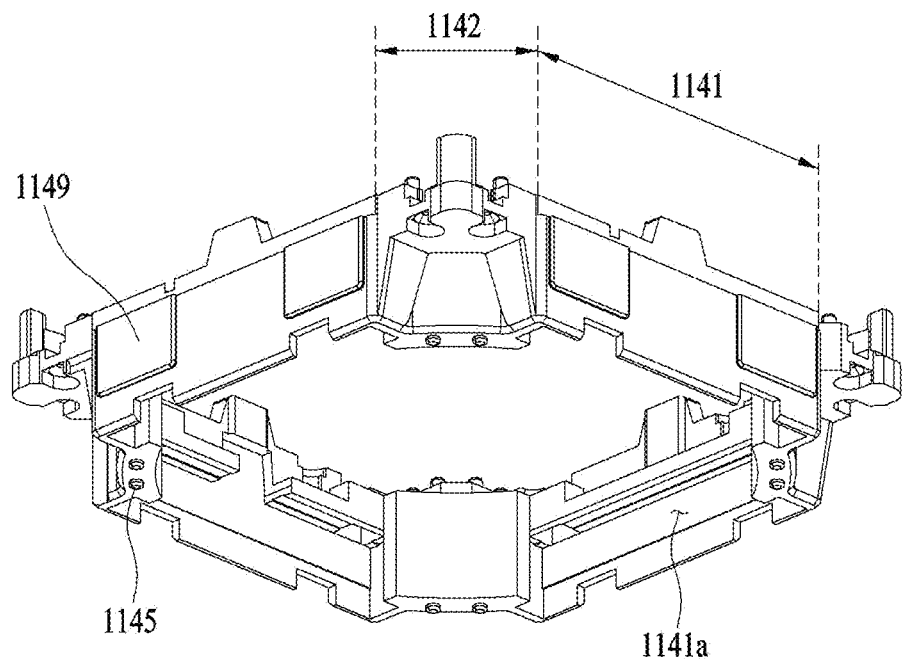
FIG. 19b is a second perspective view of the housing shown in FIG. 16.
Figure 20:
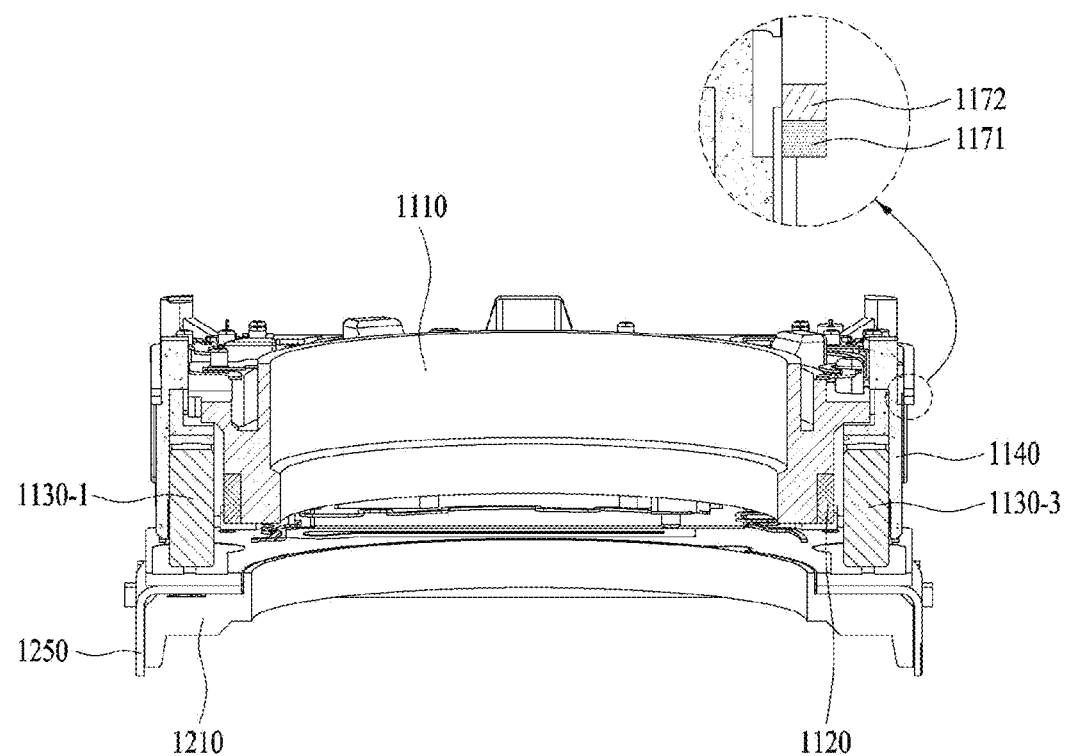
FIG. 20 is a cross-sectional view of the lens moving apparatus shown in FIG. 17 taken along line A-B.

FIG. 19*a* is a first perspective view of the housing 1140 shown in FIG. 16, FIG. 19*b* is a second perspective view of the housing 1140 shown in FIG. 16, and FIG. 20 is a cross-sectional view of the lens moving apparatus 1100 shown in FIG. 17 taken along line A-B.

Referring to FIGS. 19*a*, 19*b* and 20, the housing 1140 may have a hollow pillar shape and may include the plurality of side portions 1141 and second side portions 1142 forming the hollowness.

For example, the housing 1140 may include the first side portions 1141 spaced apart from each other and the second side portions 1142 spaced apart from each other.

Each of the first side portions 1141 of the housing 1140 may be disposed or located between two adjacent second side portions 1142 to connect the second side portions 1142 to each other, and may include a plane having a certain depth.

For example, the first side portions of the housing 1140 may be replaced with side portions and the second side portions 142 may be located at the corners of the housing 1140 and replaced with corner portions.

The magnet 1130 may be disposed or installed on the first side portions 1141 of the housing 1140, and a supporting member 1220 may be disposed on the second side portions 1141 of the housing 1140.

The housing 1140 may include first seating grooves 1146 provided at the positions corresponding to the first and second protrusions 1111 and 1112 of the bobbin 1110.

For example, when a state in which the bottom surfaces of the first protrusions 1111 and 1112 of the bobbin 1110 and the bottom surfaces 1146 of the first seating grooves 1146 of the housing 1140 are in contact with each other is set as the initial position of the bobbin 1110, the autofocus function may be controlled in a single direction (e.g., a positive Z-axis direction at the initial position).

However, for example, when a state in which the bottom surfaces of the first protrusions 1111 and 1112 of the bobbin 1110 and the bottom surfaces 1146 of the first seating grooves 1146 of the housing 1140 are spaced apart from each other is set as the initial position of the bobbin 1110, the autofocus function may be controlled in both directions (e.g., a positive Z-axis direction at the initial position and a negative Z-axis direction at the initial position).

The housing 1140 may include magnet seating portions 1141*a* provided in the inner surfaces of the first side portions 1141, in order to support or receive the magnets 1130-1 to 1130-4.

The first side portions 1141 of the housing 1140 may be disposed in parallel to the side plates of the cover member 1300. Through-hole 1147*a* and 1147*b*, through which the supporting member 1220 passes, may be provided in the second side portions 1142 of the housing 1140.

In addition, second stoppers 1144-1 to 1144-4 may be provided on the upper surface of the housing 1140, in order to inhibit the upper surface of the housing 1140 from directly colliding with the upper inner surface of the cover member 1300. The second stoppers 1144-1 to 1144-4 may be disposed on the corners of the upper surface of the housing 1140.

The housing 1140 may include at least one first upper supporting projection 1143 on the upper surfaces of the second side portions 142, for engagement with the through-hole 1152*a* of the first outer frame 1152 of the upper elastic member 1150, and second lower supporting projections 1145 on the lower surfaces of the second side portions 1142, for engagement with and fixing to the through-hole 1162*a* of the second outer frame 1162 of the lower elastic member 1160.

In order not only to secure a passage, through which the supporting member 1220 passes, but also to secure a space filled with silicon capable of damping, the housing 1140 may include grooves 1142*a* provided in the second side portions 1142. For example, the groove 1142a of the housing 1140 may be filled with damping silicon.

The housing 1140 may include third stoppers 1149 protruding from the side surfaces of the first side portions 1141 in the second or third direction. The third stoppers 1149 may inhibit the housing 1140 from colliding with the inner surface of the cover member 1300 when the housing 1140 moves in the direction perpendicular to the optical axis, for example, the second and third directions.

The housing 1140 may further include a fourth stopper (not shown) protruding from the lower surface thereof, and the fourth stopper of the housing 1140 may inhibit the bottom surface of the housing 1140 from colliding with the base 1210, the third coil 1230 and/or the circuit board 1250.

By such a configuration, the housing 1140 may be spaced apart downwardly from the base 1210 and may be spaced apart upwardly from the cover member 1300. Since the housing 140 is spaced apart from the base and the cover member 1300, handshake correction operation of controlling displacement of the housing 1140 in the direction perpendicular to the optical axis OA may be performed.

For example, the magnets 1130-1 to 1130-4 are received inside the first side portions 1141 of the housing 1140 without being limited thereto. In another embodiment, the magnets 1130-1 to 1130-4 may be disposed outside the first side portions 1141 of the housing 1140.

For example, at the initial position of the AF movable portion, the magnet 1130 may overlap the first coil 1120 in the direction perpendicular to the optical axis (OA) or may be aligned with the first coil 1120. Here, for the initial position of the AF movable portion, refer to the description of the initial position of the AF movable portion described in FIGS. 1 to 14b.

For example, at the initial position of the movable portion, the magnets 1130-1 to 1130-4 may overlap the first coil 1120 in the direction perpendicular to the optical axis (OA), for example, in the second or third direction.

The magnets 1130-1 to 1130-4 may have a shape corresponding to that of the first side portions 1141 of the housing 1140, e.g., a rectangular parallelepiped shape, without being limited thereto.

The magnets 1130-1 to 1130-4 may be a unipolar magnet or a bipolar magnet having an S-pole surface opposite to the first coil and an N-pole outer surface thereof. However, the embodiment is not limited thereto and the S- and N-poles are reversely disposed.

In the embodiment, the number of magnets 1130-1 to 1130-4 is 4, but the embodiment is not limited thereto and the number of magnets 1130 may be at least two. The surface of the magnets 1130-1 to 1130-4 opposite to the first coil 120 may be planar, but the embodiment is not limited thereto and the surface of the magnets 1130-1 to 1130-4 opposite to the first coil 120 may be curved.

Coil seating portions 1149a in which the first sensing coil 1171 and the second sensing coil 1172 are disposed or seated may be provided in the first and second side portions 1141 and 1142 of the housing 1140.

The coil seating portions 1149a may be formed by recessing portions of the side surfaces of the first and second side portions 1141 and 1142 of the housing 1140.

Alternatively, in another embodiment, the coil seating portions may be formed by recessing the edges of the upper surface of the housing 1140.

For example, the coil seating portions 1149a of the housing 1140 may be located in the edge region of the upper surface of the housing 1140 adjacent to the corners where the upper surfaces and the outer surfaces of the first and second side portions 1141 and 1142 meet.

For example, the coil seating portions 1149a of the housing 1140 and the upper surface 140 may have stairs in a vertical direction or the first direction.

For example, the coil seating portions 1149a of the housing 1140 may include supporting surfaces 1149-1a and 1149-2a located below the upper surfaces of the first and second side portions 1141 and 1142 of the housing 1140 and side surfaces 1149-1b and 1149-2b located between the upper surface of the housing 1140 and the supporting surfaces 1149-la and 1149-2a of the housing 1140.

For example, the supporting surfaces 1149-la and 1149-2a of the coil seating portions 1149a of the housing 1140 may be located below the upper surface of the housing 1140 and the stairs may be present in the first direction between the supporting surfaces 1149-la and 1149-2a of the coil seating portions 1149a and the upper surface of the housing 1140.

For example, the stairs between the supporting surfaces 1149-la and 1149-2a of the coil seating portions 1149a and the upper surface of the housing 1140 may be equal to or greater than a sum of the thicknesses of the first sensing coil 1171 and the second sensing coil 1172, without being limited thereto.

The second stoppers 1144-1 to 1144-4 of the housing 1140 may be disposed on the corners of the upper surface of the housing 1140 and protrude upwardly from the upper surface of the housing 1140, thereby inhibiting the first sensing coil 1171 and the second sensing coil 1172 disposed in the coil seating portions 1149a from being detached from the housing 1140.

The first sensing coil 1171 and the second sensing coil 1172 may be disposed on the upper surface of the housing 1140 or the upper outer surfaces of the first and second side portions 1141 and 1142 of the housing 1140. By placing the first and second sensing coils 1171 and 1172 as far as away as possible from the third coil 1230, it is possible to minimize influence on the voltage induced in the first and second sensing coils 1171 and 1172 by interference with the third coil 1230.

For example, the first sensing coil 1171 and the second sensing coil 1172 may be disposed in the coil seating portions 1149a of the housing 1140, without being limited thereto.

For example, in another embodiment, the first sensing coil 1171 and the second sensing coil 1172 may be disposed on the inner surfaces of the first and second side portions 1141 and 1142 of the housing 1140.

Each of the first sensing coil 1171 and the second sensing coil 1172 may be wound on the outer surfaces of the first and second side portions 1141 and 1142 of the housing 1140 in a clockwise or counterclockwise direction with respect to the optical axis OA. For example, each of the first sensing coil 1171 and the second sensing coil 1172 may have a closed loop shape wound on the upper portion of the outer portion of the housing 1140 to rotate clockwise or counterclockwise about the optical axis, e.g., a coil ring shape. For example, in FIG. 16, the first sensing coil 1171 and the second sensing coil 1172 may have a rectangular ring shape without being limited thereto. In another embodiment, the first sensing coil 1171 and the second sensing coil 1172 may have a circular or elliptical shape.

Figure 23A:
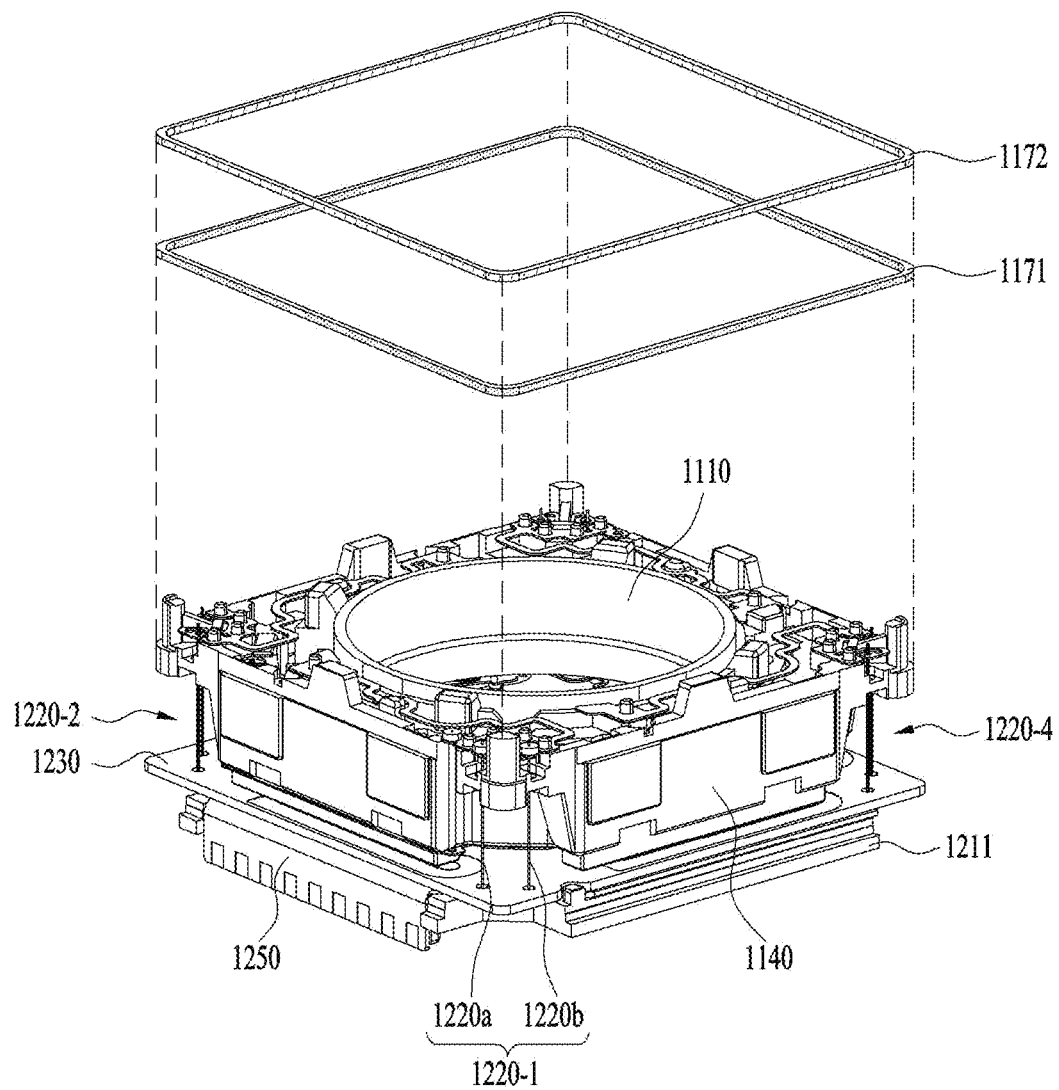
FIGS. 23a to 23b are views showing embodiments of arrangement of a first sensing coil and a second sensing coil disposed in the housing of FIG. 17.
Figure 23B:
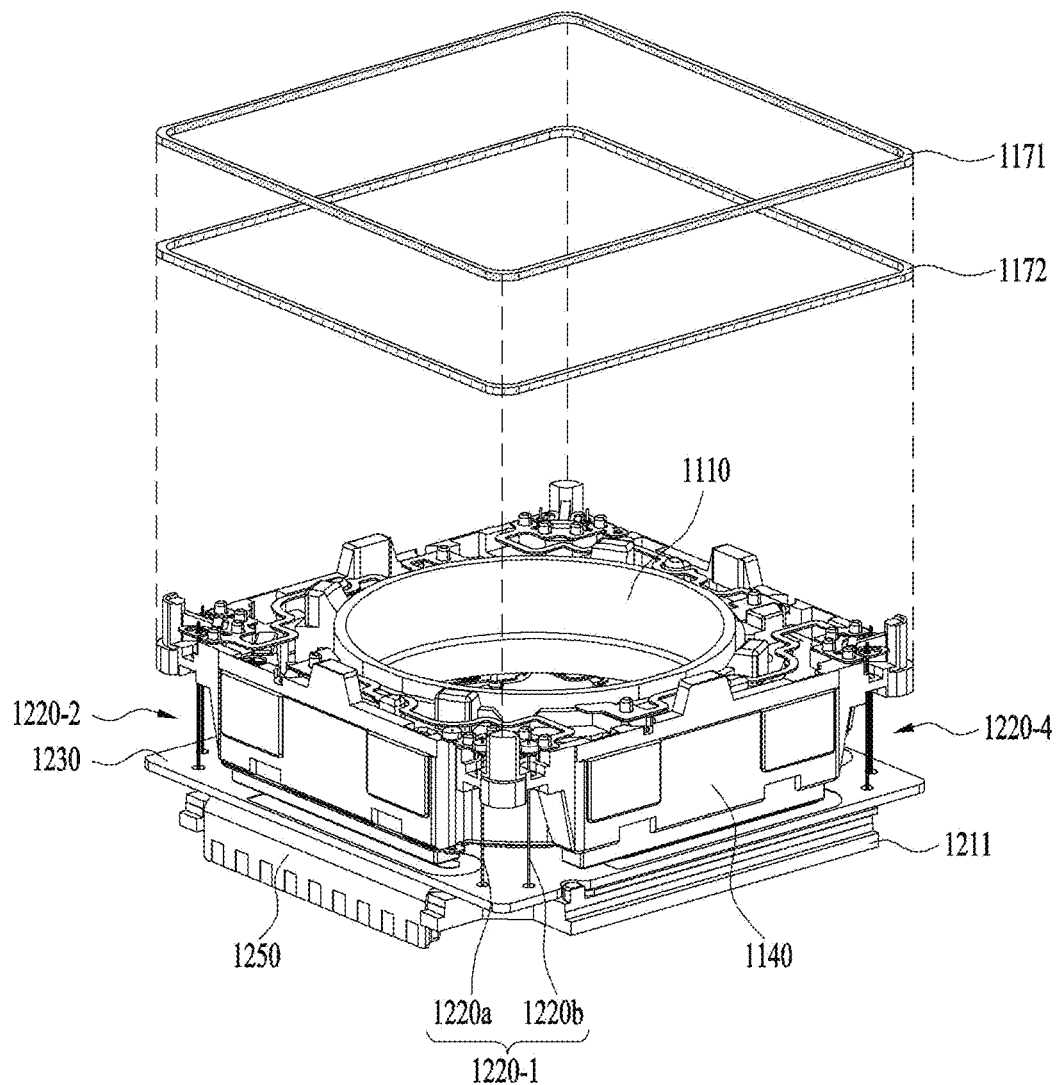

FIGS. 23a to 23b are views showing embodiments of arrangement of the first sensing coil 1171 and the second sensing coil 1172 disposed in the housing 1140 of FIG. 17.

Referring to FIG. 23a, the second sensing coil 1172 may be disposed on the first sensing coil 1171 and may be in contact with the first sensing coil 1171 and the second sensing coil 1172.

For example, the lower surface of the first sensing coil 1171 may be in contact with the supporting surfaces 1149-1a and 1149-2a of the seating portions 1149a of the housing 1140, and the lower surface of the second sensing coil 1172 may be in contact with the upper surface of the first sensing coil 1171.

In another embodiment, the first sensing coil 1171 may be disposed under the second sensing coil 1172 to be spaced apart from the second sensing coil 1172.

In order to easily induce a voltage due to mutual induction, the second and third coils 1171 and 1172 may be disposed in the same form as the winding form of the first coil 1120.

For example, when the first coil 1120 has a ring shape wound in the clockwise or counterclockwise direction with respect to the optical axis, each of the first sensing coil 1171 and the second sensing coil 1172 may have a ring shape wound on the outer side portion of the housing 1140 to rotate in the clockwise or counterclockwise direction with respect to the optical axis.

For example, each of the first sensing coil 1171 and the second sensing coil 1172 may have a ring shape to surround the side surfaces 1149-1b and 1149-2b of the seating portions 1149 of the housing 1140, and may be in contact with the side surfaces 1149-1b and 1149-2b of the seating portions 1149 of the housing 1140.

Referring to FIG. 23b, the first sensing coil 1171 may be disposed on the second sensing coil 1172. In another embodiment, the second sensing coil 1172 may be disposed under the first sensing coil 1171 to be spaced apart from the first sensing coil 1171.

In another embodiment, the second sensing coil 1172 may be disposed on the outer portion of the first sensing coil 1171 or may be disposed to surround the outer portion of the first sensing coil 1171.

For example, the second sensing coil 1172 may be disposed outside the first sensing coil 1171. By making the distance between the first sensing coil 1171 and the first coil 1120 and the distance between the second sensing coil 1172 and the first coil 1120 equal or similar, it is possible to make the levels of the voltages induced in the first sensing coil 1171 and the second sensing coil 1172 equal or similar.

By making the levels of the voltages induced in the first sensing coil 1171 and the second sensing coil 1172 equal or similar, the embodiment can facilitate calibration for noise removal.

In another embodiment, the first sensing coil 1171 may be disposed on the outer portion of the second sensing coil 1172 or may be disposed to surround the outer portion of the second sensing coil 1172. For example, the first sensing coil 1171 may be disposed outside the second sensing coil 1172. By making the distance between the first sensing coil 1171 and the first coil 1120 and the distance between the second sensing coil 1172 and the first coil 1120 equal or similar, it is possible to make the levels of the voltages induced in the first sensing coil 1171 and the second sensing coil 1172 equal or similar.

The first sensing coil 1171 and the second sensing coil 1172 may be fixed or coupled to the coil seating portions 1149a of the housing 1140 using epoxy, a thermohardening adhesive or an ultraviolet hardening adhesive, etc.

Figure 24A:
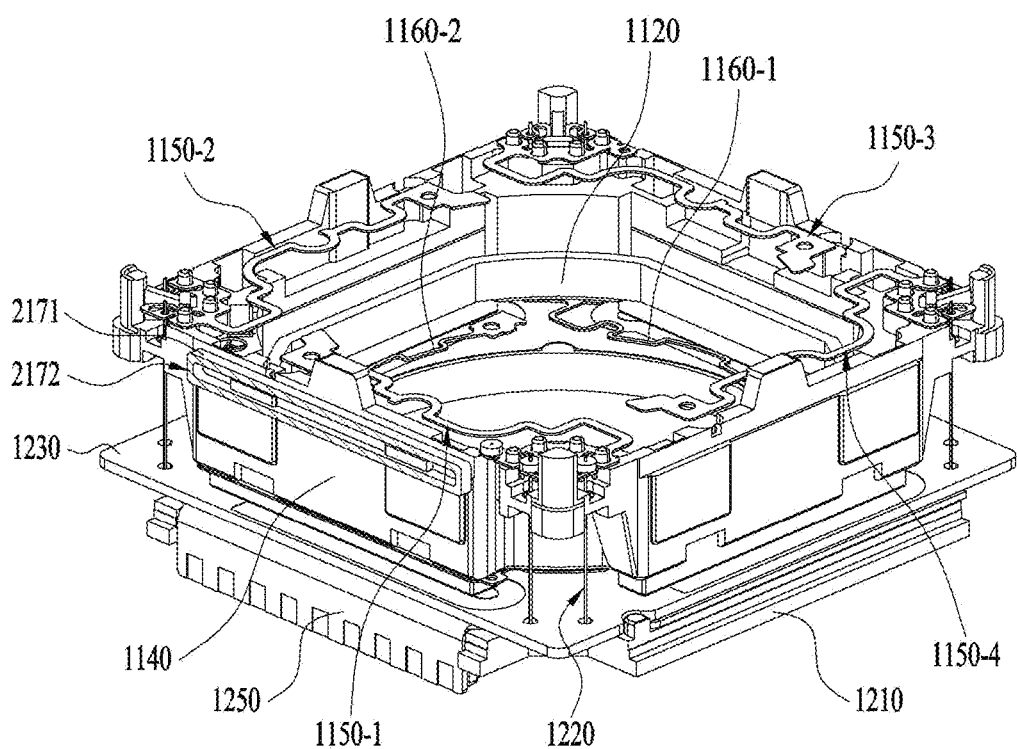
FIG. 24a is a view showing arrangement of a first sensing coil and a second sensing coil according to another embodiment.
Figure 24B:
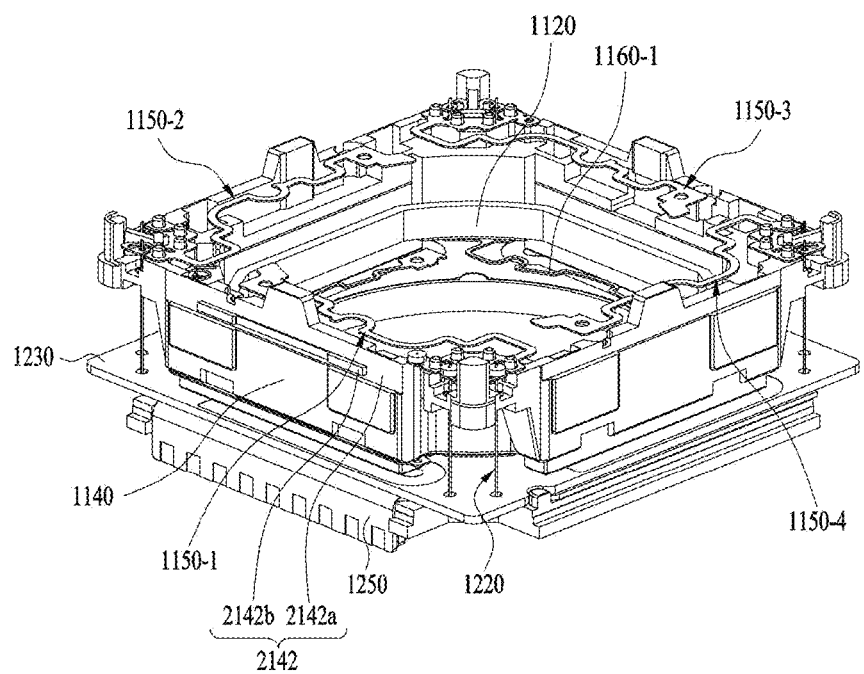
Figure 24C:
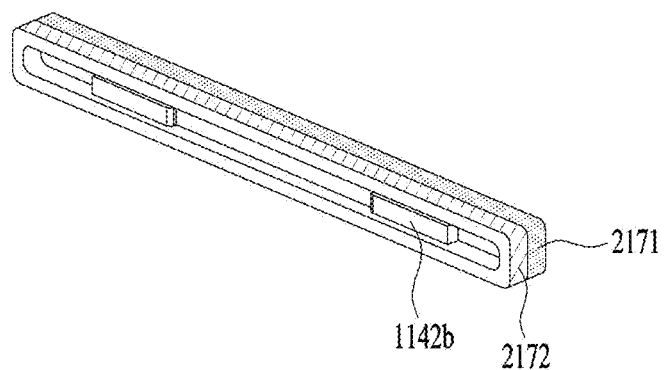

FIG. 24a is a view showing arrangement of a first sensing coil 2171 and a second sensing coil 2172 according to another embodiment, FIG. 24b is a perspective view except for the first sensing coil 2171 and the second sensing coil 2172 of FIG. 24a, and FIG. 24c is a view showing an embodiment of the first sensing coil 2171 and the second sensing coil 2172 shown in FIG. 24a.

Referring to FIGS. 24a to 24c, the first sensing coil 2171 and the second sensing coil 2172 may be disposed on the outer surface of any one of the first side portions of the housing 1140 and may have a ring shape.

Each of the first sensing coil 2171 and the second sensing coil 2172 may have a coil ring shape wound in the clockwise or counterclockwise direction with respect to the axis perpendicular to the optical axis OA.

Referring to FIG. 24a, seating portions 2142 in which the first and second sensing coils 2171 and 2172 are seated may be provided in the outer surface of any one first side portion of the housing 1140.

For example, the seating portions 2142 of the housing 1140 may include a groove 2142a recessed from the outer surface of any one first side portion of the housing 1140 in order to seat the first and second sensing coils 2171 and 2172 and a projection 2142b protruding from the groove 2142a in order to fix the first and second sensing coils 2171 and 2172. The first and second sensing coils 2171 and 2172 may be coupled to, installed on or wound on the projection 2142b.

For example, each of the first sensing coil 2171 and the second sensing coil 2172 may have a closed curve shape including straight lines and curved lines and may be inserted into the projection 2142b to be disposed in the groove 2142a.

The first sensing coil 2171 may be disposed in the groove 2142a to be in contact with the first side portions of the housing 1140 and the second sensing coil 2172 may be disposed outside the first sensing coil 2171, without being limited thereto.

In another embodiment, the second sensing coil 2172 may be disposed in the groove 2142a to be in contact with the first side portions of the housing 1140 and the first sensing coil 2171 may be disposed outside the second sensing coil 2172.

The upper elastic member 1150 and the second lower elastic member 1160 may be coupled to the bobbin 1110 and the housing 1140 to flexibly support the bobbin 1110.

Figure 21:
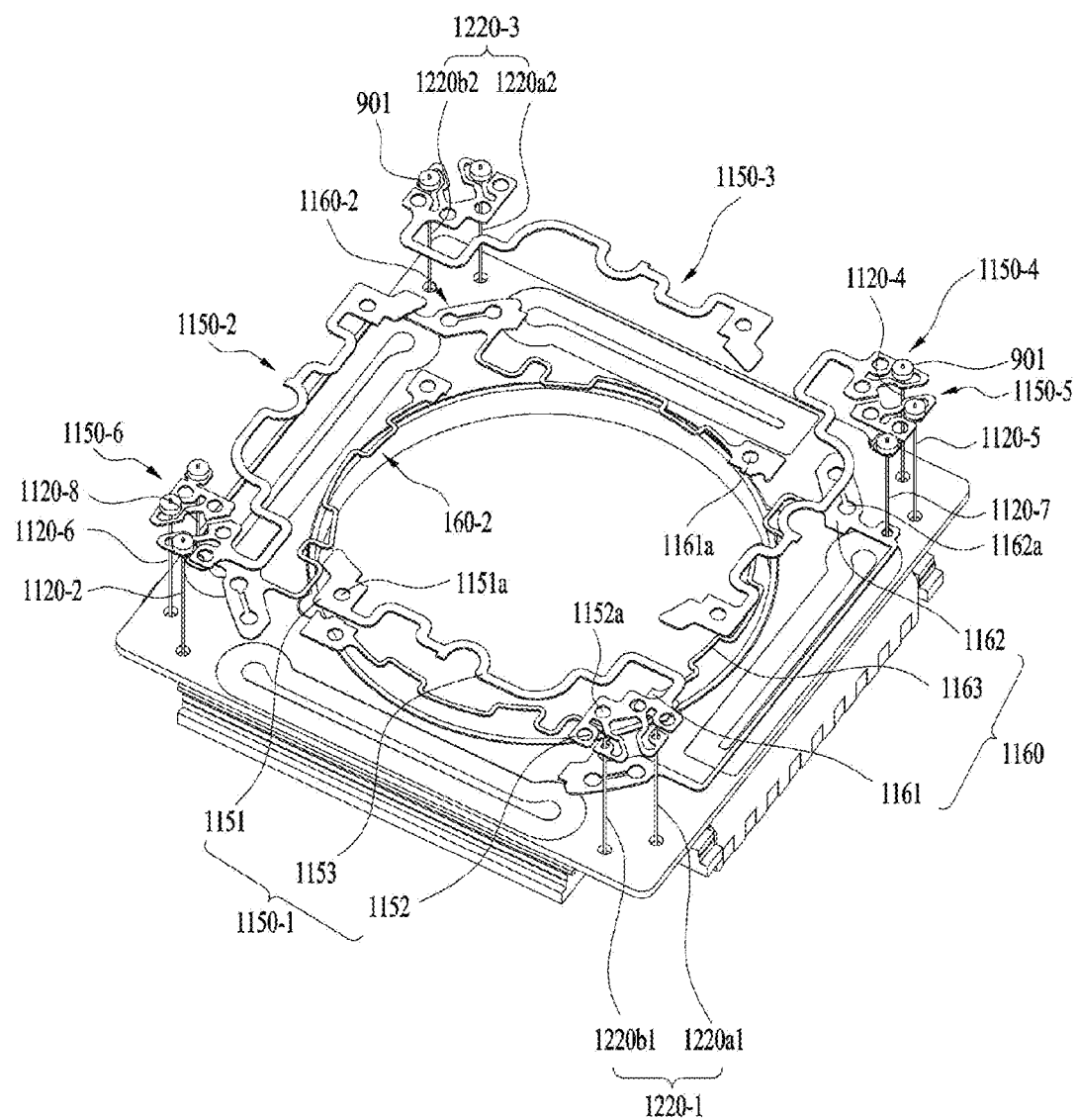
FIG. 21 is an assembled perspective view of an upper elastic member, a lower elastic member, a third coil, a circuit board, a base and a supporting member of FIG. 16.
Figure 22:
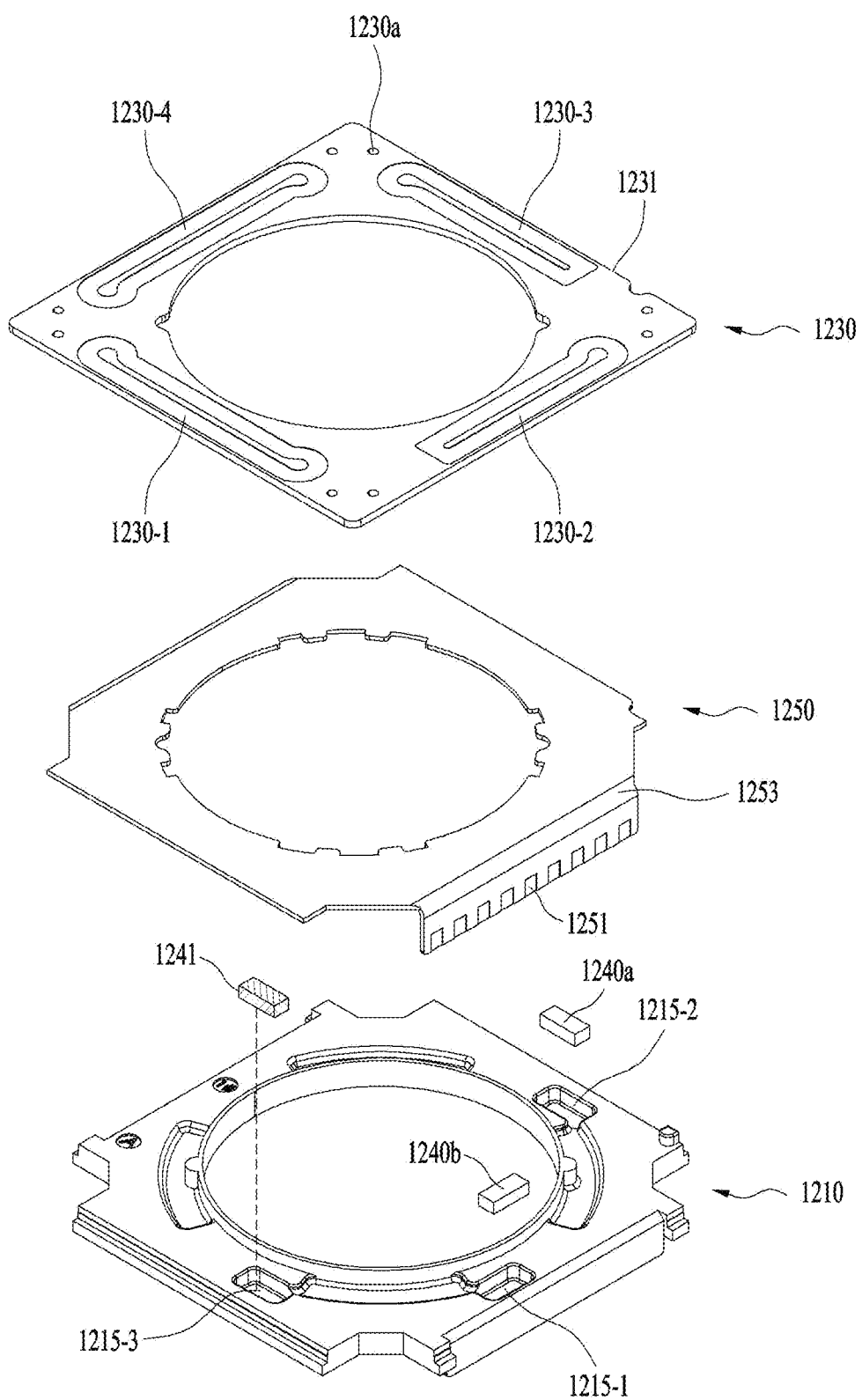
FIG. 22 is an exploded perspective view of the third coil, the circuit board, the base, and first and second position sensors.

FIG. 21 is an assembled perspective view of the upper elastic member 1150, the lower elastic member 1160, the third coil 1230, the circuit board 1250, the base 1210 and the supporting member 1220 of FIG. 16, and FIG. 22 is an exploded perspective view of the third coil 1230, the circuit board 1250, the base 1210, and first and second position sensors 1240a and 1240b.

Referring to FIGS. 21 and 22, the upper elastic member 1150 may include a plurality of divided upper springs 1150-1 to 1150-6. For example, the upper elastic member 1150 may include the first to sixth upper springs 1150-1 to 1150-6 spaced apart from each other.

Each of the first to fourth upper springs 1150-1 to 1150-4 may include a first inner frame 1151 coupled to the bobbin 1110, a first outer frame 1152 coupled to the housing 1140, and a first connector 1153 connecting the first inner frame 1151 with the first outer frame 1152.

For example, by an adhesive member such as epoxy or thermal fusion, the through-hole 1151a of the first inner frame 1151 and the first engagement projection 1113a of the bobbin 1110 may be engaged with each other, and the through-hole 1152a of the first outer frame 1152 and the first upper supporting projection 1143 of the housing 1140 may be engaged with each other.

Each of the fifth and sixth upper springs 1150-5 and 1150-6 may not be coupled to the bobbin 1110 but may be coupled to only the housing 140, without being limited thereto. In another embodiment, the fifth and sixth upper springs may be coupled to both the bobbin and the housing.

The lower elastic member 1160 may include a plurality of divided lower springs.

For example, the lower elastic member 1160 may include a first lower spring 1160-1 and a second lower spring 1160-2 spaced apart from each other.

Each of the first and second lower springs 1160-1 and 1160-2 may include a second inner frame 1161 coupled to the bobbin 1110, a second outer frame 1162 coupled to the housing 1140 and a second connector 1163 connecting the second inner frame 1161 with the second outer frame 1162.

The first coil 1120 may be connected to any two of the first and second inner frames of the upper and lower elastic members 1150 and 1160.

For example, both ends of the first coil 120 may be connected or bonded to the second inner frames of the first and second lower springs 1160-1 to 1160-2, by soldering or a conductive adhesive member.

The first sensing coil 1171 may be connected to the other two of the first and second inner frames of the upper and lower elastic members 1150 and 1160, and the second sensing coil 1172 may be connected to the other two of the first and second inner frames of the upper and lower elastic members 1150 and 1160.

For example, the first sensing coil 1171 may be connected to the first inner frames of two of the first to fourth upper springs 1150-1 to 1150-4 by soldering or a conductive adhesive member.

The second sensing coil 1172 may be connected to the first inner frames of the other two of the first to fourth upper springs 1150-1 to 1150-4 by soldering or a conductive adhesive member.

For example, the first sensing coil 1171 may be connected or bonded to the first and second upper springs 1150-1 and 1150-2, and the second sensing coil 1172 may be connected or bonded to the third and fourth upper springs 1150-3 and 1150-4.

The base 1210 may be located under the bobbin 1110 and the housing 1140, and may have a supporting groove in a surface opposite to a portion in which the terminal surface 1253 of the circuit board 1250 is formed.

In addition, the base 1210 may include seating grooves 1215a and 1215b recessed from the upper surface thereof to have the position sensors 1240a and 1240b disposed therein.

The first and second position sensors 1240a and 1240b may be disposed in the seating grooves 1215a and 1215b of the base 1210 located under the circuit board 1250 and may be electrically connected to the circuit board 1250.

When the housing 1140 moves in the second direction and/or the third direction, the first and second position sensors 1240a and 1240b may detect change in magnetic force emitted from the magnet 1130.

For example, the first and second position sensors 1240a and 1240b may be implemented as a Hall sensor alone or as a driver including a Hall sensor. This is merely an example and any sensor capable of detecting a position in addition to magnetic force may be used. The first and second position sensors 1240a and 1240b may also be referred to as optical image stabilizer (OIS) position sensors.

The third coil 1230 may be disposed at the upper side of the circuit board 1250 and the first and second position sensors 1240a and 1240b may be disposed at the lower side of the circuit board 250.

The circuit board 1250 may be disposed on the upper surface of the base 1210, and may include a hollowness corresponding to the hollowness of the bobbin 1110, the hollowness of the housing 1140 and/or the hollowness of the base 1210.

The circuit board 250 may include at least one terminal surface 1253 bent from the upper surface thereof, electrically connected to the supporting member 220 and having formed thereon a plurality of terminals 1251 or pins for receiving electrical signals from the outside or providing electrical signals to the outside.

The circuit board 1250 may be a flexible printed circuit board (FPCB) without being limited thereto and the terminal of the circuit board 1250 may be configured on the surface of the base 1210 or a PCB using a surface electrode method.

The third coil 1230 may be disposed on the upper surface of the circuit board 1250 to correspond to or to be aligned with the magnet 1130. The number of third coil 1230 may be one or more and may be equal to the number of magnets 1130, without being limited thereto.

For example, the third coil 1230 may include a plurality of OIS coils 1230-1 to 1230-4 formed in a circuit member 1231 (or the board) separately from the circuit board 1250, without being limited thereto. In another embodiment, the OIS coils 1230-1 to 1230-4 may be spaced apart from each other on the circuit board 1250 without a separate circuit member or a board.

The OIS coils 1230-1 to 1230-4 may be electrically connected to the circuit board 1250.

The driving signal, e.g., driving current, may be provided to the OIS coils 1230-1 to 1230-4. By electromagnetic force due to interaction between the magnet 1130 and the OIS coils 1230-1 to 1230-4, to which the driving signal is provided, the housing 1140 may move in the direction perpendicular to the optical axis, e.g., the second direction and/or the third direction, for example, the x-axis and/or y-axis direction. Handshake correction may be performed by controlling movement of the housing 1140. The driving signal applied to the OIS coils 1230-1 to 1230-4 may be an AC signal, e.g., a PWM signal. For example, the driving signal applied to the OIS coils 1230-1 to 1230-4 may include an AC signal and a DC signal.

By soldering or a conductive adhesive member 901, one end of each of the supporting members 1220-1 to 1220-6 may be coupled to each of the upper springs 1150-1 to 1150-6 and the other end thereof may be bonded to the circuit board 1259, the circuit member 231 and/or the base 1210.

In addition, one end of each of the supporting members 1220-7 and 1220-8 may be coupled to each of the upper springs 1150-5 and 1150-6 and the other end thereof may be coupled to each of the upper springs 1160-1 and 1160-2. The supporting member 1120 may support the bobbin 110 and the housing 1140 such that the bobbin 1110 and the housing 1140 are movable in the direction perpendicular to the first direction.

A plurality of supporting members 1220 may be provided and each of the plurality of supporting members 1220-1 to 1220-8 may be disposed in each of the second side portions of the housing 1140.

Although the first supporting member 1220-1 may include two wires 1220a1 and 1220b1 and the third supporting member 1220-3 may include two wires 1220a2 and 1220b2 in order to symmetrically place the supporting members in FIG. 21, the embodiment is not limited thereto and the supporting members may be symmetrically disposed in various forms, such that the supporting members may support the housing in a balanced manner. At least one of the two wires 1220a1 and 1220b1 or 1220a2 and 1220b2 may be electrically connected to the circuit board.

The plurality of supporting members 1220-1 to 1220-8 may be formed by a member separately from the upper elastic member 1150 and may be implemented as an elastically supportable member, e.g., a left spring, a coil spring, a suspension wire, etc. The supporting member 1220 according to another embodiment may be formed integrally with the upper elastic member 1150.

For example, each of the first to sixth supporting members 1220-1 to 1220-6 may electrically connect any one of the first to sixth upper springs 1150-1 to 1150-6 with the circuit board 1250.

The seventh support 1220-7 connects the fifth upper spring 1150-5 with the first lower elastic member 1160-1, and the eighth member 1220-8 connects the sixth upper spring 1150-6 with the second lower elastic member 1160-2.

For example, the first coil 1120 connected to the first and second lower springs 1160-1 and 1160-2 may be electrically connected to the circuit board 1250 by the seventh and eighth supporting members 1220-7 and 1220-8 and the fifth and sixth upper springs 1150-5 and 1150-6.

The first sensing coil 1171 connected to the first and second upper springs 1150-1 and 1150-2 may be connected to the circuit board 1250 by the first and second supporting members 1220-1 and 1220-2.

The second sensing coil 1172 connected to the third and fourth upper springs 1150-3 and 1150-4 may be electrically connected to the circuit board 1250 by the third and fourth supporting members 1220-3 and 1220-4.

In order to absorb and damp vibration of the bobbin 1110, the lens moving apparatus 1100 may further include a first damping member (not shown) disposed between each of the upper springs 1150-1 to 1150-6 and the housing 1140.

For example, the first damping member (not shown) may be disposed in a space between the first connector 1153 of each of the upper springs 1150-1 to 1150-4 and the housing 1140.

In addition, for example, the lens moving apparatus 1100 may further include a second damping member (not shown) disposed between the second connectors 1163 of the lower elastic members 1160-1 to 1160-2 and the housing 1140.

In addition, for example, the lens moving apparatus 1100 may further include a damping member (not shown) disposed between the inner surface of the housing 1140 and the outer circumferential surface of the bobbin 1110.

In addition, the lens moving apparatus 1100 may further include a damping member (not shown) disposed in a portion where the supporting member 1220 and the upper elastic member 1150 are coupled or bonded.

In addition, the lens moving apparatus 1100 may further include a damping member (not shown) disposed in a portion where the circuit board 1250, the circuit member 1231 1231 and/or the base 1210 and the supporting member 1220 are coupled or bonded.

Figure 25A:
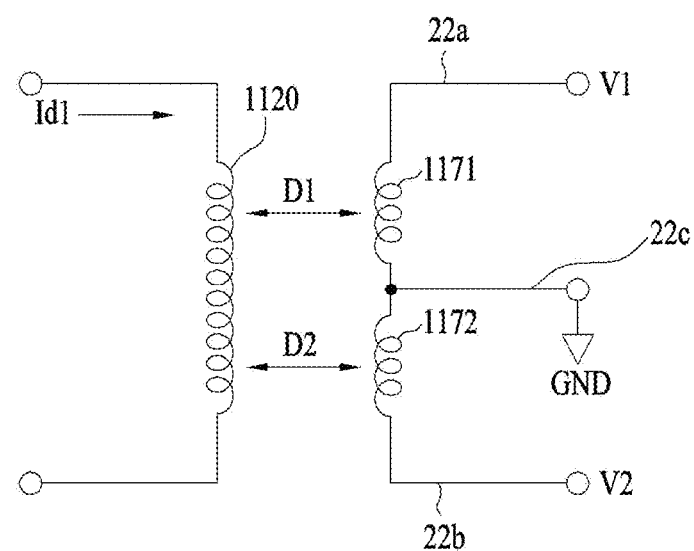
FIGS. 25a and 25b are views showing embodiments of the first coil, the first sensing coil and the second sensing coil shown in FIG. 16.
Figure 25B:
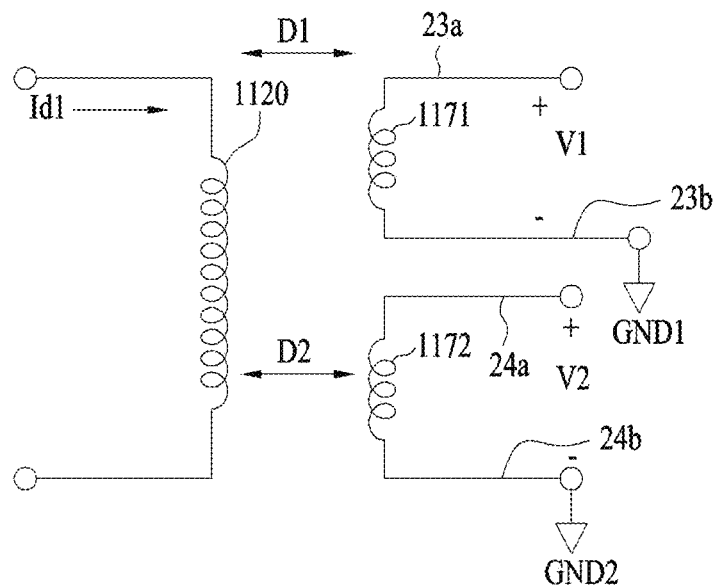

FIG. 25a shows one embodiment of the first coil 1120, the first sensing coil 1171, and the second sensing coil 1172 shown in FIG. 16, and FIG. 25b shows another embodiment of the first coil 1120, the first sensing coil 1171, and the second sensing coil 1172 shown in FIG. 16.

In FIG. 25a, one end of the first sensing coil 1171 and one end of the second sensing coil 1172 may be connected to each other. For example, a node, to which the first sensing coil 1171 and the second sensing coil 1172 are commonly connected, may serve as an intermediate tap 22c and a ground voltage GND may be provided thereto. Conductible connection of FIGS. 25a and 25b may be provided on the circuit board 1250 or the second holder 800 of the camera module 200.

When a first driving signal Id1 is provided to the first coil 1120, a first induced voltage V1 may be generated between one end 22a of the first sensing coil 1171 and the intermediate tap 22c, and a second induced voltage V2 may be generated between one end 22b of the second sensing coil 1172 and the intermediate tap 22c.

In FIG. 25b, the first sensing coil 1171 and the second sensing coil 1172 are electrically disconnected from each other. When the first driving signal ID1 is provided to the first coil 1120, the first induced voltage V1 may be generated at both ends 23a and 23b of the first sensing coil 1171, and the second induced voltage V2 may be generated at both ends 24a and 24b of the second sensing coil 1172.

The first driving signal Id1 may be provided from the circuit board 1250 to the first coil 1120. The first driving signal Id1 applied to the first coil 120 may be an AC signal, e.g., AC current or an AC voltage. For example, the first driving signal Id1 may be a sine signal or a pulse signal (e.g., pulse width modulation (PWM) signal).

In another embodiment, the first driving signal Id1 applied to the first coil 1120 may include an AC signal and a DC signal. When the AC signal, e.g., AC current, is applied to the first coil 1120, electromotive force or a voltage is induced in the first sensing coil 1171 and the second sensing coil 1172 by mutual induction. The frequency of the PWM signal may be 20 kHz or more and may be 500 kHz or more for reduction of current consumption.

As the first coil 1120 disposed in the bobbin 1110 moves in the optical-axis direction by electromotive force due to interaction with the magnet, the distance D1 between the first coil 1120 and the first sensing coil 1171 and the distance D2 between the first coil 1120 and the second sensing coil 1172 may be changed.

As the first and second distances D1 and D2 are changed, the first induced voltage V1 may be induced in the first sensing coil 1171 and the second induced voltage V2 may be induced in the second sensing coil 1172.

Each of the first sensing coil 1171 and the second sensing coil 1172 may be an induced coil in which the induced voltage is generated in order to detect the position or displacement of the movable portion, e.g., the bobbin.

For example, the position or displacement of the movable portion may be detected using the first induced voltage V1 induced in the first sensing coil 1171 and the second induced voltage V2 induced in the second sensing coil 1172.

The detector 1241 detects displacement of the movable portion based on the result of comparing the first induced voltage V1 with the second induced voltage V2. The detector 1241 may be electrically connected to the circuit board 1250 as shown in FIG. 22.

For example, a groove 1215-3 in which the detector 1241 is seated may be provided in the upper surface of the base 1210, and the detector 1241 may be bonded to the lower surface of the circuit board 1250 and electrically connected to the terminals 1251 of the circuit board 1250.

For example, the detector 1241 may be electrically connected to the terminals of the circuit board 1250 electrically connected to the first sensing coil 1171 and the second sensing coil 1172.

Figure 29:
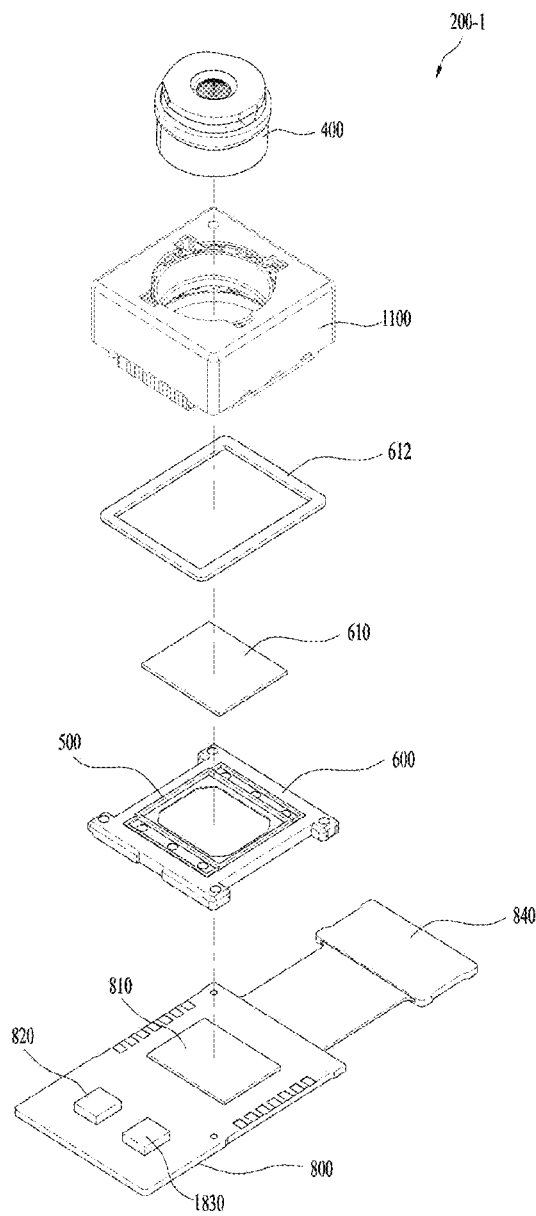
FIG. 29 is an exploded perspective view of a camera module according to another embodiment.

In another embodiment, the detector 1241 may not be disposed on the circuit board 1250, but may be included in the controller 1830 of the camera module 200 shown in FIG. 29.

Figure 26A:
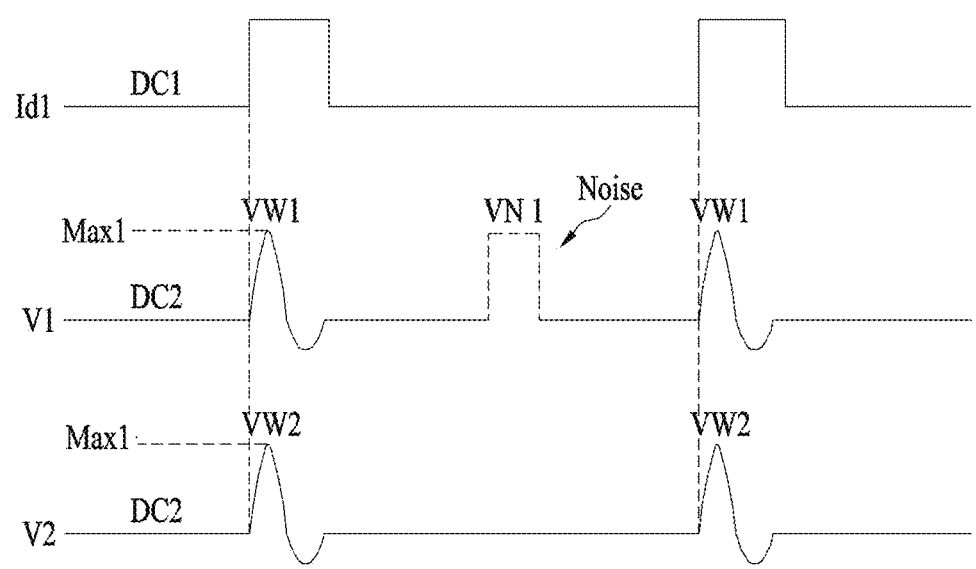
FIGS. 26a and 26b are views showing embodiments of the waveforms of the first induced voltage of the first sensing coil and the second induced voltage of the second sensing coil generated in response to a first driving signal.

FIG. 26a shows an embodiment of the waveforms of the first induced voltage V1 of the first sensing coil 1171 and the second induced voltage V2 of the second sensing coil 1172 generated in response to the first driving signal Id1.

Referring to FIG. 26a, the first driving signal Id1 applied to the first coil 1120 may be current or a voltage including a DC signal (e.g., DC1) and an AC signal (e.g., a pulse signal).

In response to the first driving signal Id1 which is a pulse wave, the first induced voltage V1 which is an AC signal may be generated in the first sensing coil 1171 and the second induced voltage V2 which is an AC signal may be generated in the second sensing coil 1172.

When the number of turns of the first sensing coil 1171 and the number of turns of the second sensing coil 1172 are the same, the thickness and materials of the second and third coils 11711 and 1172 are equal to each other, and when the third and second distances are the same, the first induced voltage V1 and the second induced voltage V2 may be equal to each other. For example, the maximum values of the first and second induced voltages V1 and V2 may be Max1.

Even if the numbers of turns are not equal, considering the ratio of the number of turns of the first sensing coil 1171 to the number of turns of the second sensing coil 1172, the first induced voltage V1 of the first sensing coil 1171 and the second induced voltage V2 of the second sensing coil 1172 may be generated according to the ratio of the number of turns of the first sensing coil 1171 to the number of turns of the second sensing coil 1172.

At least one of the first induced voltage V1 of the first sensing coil 1171 or the second induced voltage V2 of the second sensing coil 1172 may be influenced by noise due to the surrounding environments of the first and second sensing coils 1171 and 1172.

For example, noise due to the surrounding environment may include noise caused by a receiver, a speaker or a vibration motor of a camera module, in which the lens moving apparatus is installed, or circuit noise. Such noise may obstruct accurate detection of displacement of the movable portion. Accuracy of AF operation may be deteriorated by influence of such noise.

As shown in FIG. 26a, the first induced voltage V1 of the first sensing coil 1171 may include a component or voltage VN1 (hereinafter referred to as a noise voltage) caused by noise. In contrast, the second induced voltage V1 of the second coil 1172 may not be influenced by noise and may not include a noise voltage.

For example, the noise voltage VN1 may be present between the first induced voltage waves VW1 of the first induced voltage V1 generated in response to the first driving signal Id1 in time, without being limited thereto. For example, the noise voltage VN1 may not be generated by overlapping or synchronization with the first induced voltage waves VW1 in time.

Since at least a portion of the noise voltage VN1 overlaps the first induced voltage waveforms VW1 in time not to be generated in the first sensing coil 1171, when the first sensing coil 1171 and the second sensing coil 1172 are equal to each other in terms of the number of turns, the thickness and the material, the first induced voltage VW1 of the first sensing coil 1171 and the second induced voltage VW2 of the second sensing coil 1172 may be equal to each other.

The second induced voltage V2 of FIG. 26a may not include the noise voltage VN1, without being limited thereto. In another embodiment, the second induced voltage V2 may include the noise voltage and the first induced voltage V1 may not include the noise voltage. In another embodiment, both the first induced voltage V1 and the second induced voltage V2 may respectively include noise voltages. At this time, the noise voltages respectively included in the first induced voltage V1 and the second induced voltage V2 may not overlap each other in time, without being limited thereto.

The first induced voltage waveform VW1 and the second induced voltage waveform VW2 shown in FIG. 26a respectively include an upper portion and a lower portion of the DC voltage DC2 and the absolute value of the maximum value Max1 of the upper portion is greater than the absolute value of the minimum value of the lower portion, without being limited thereto. In another embodiment, the absolute value of the maximum value Max1 of the upper portion may be less than or equal to the absolute value of the minimum value of the lower portion.

Figure 26B:
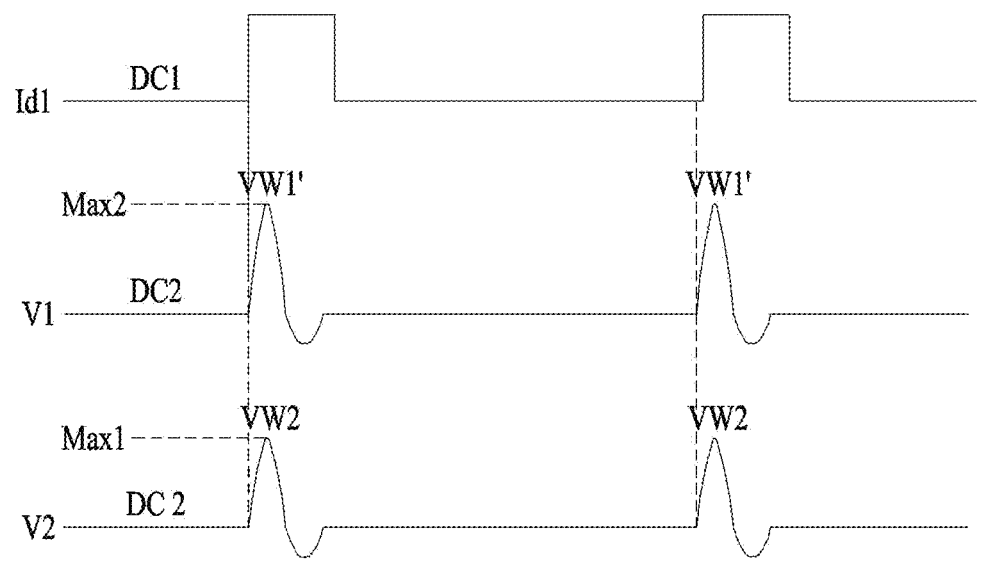

FIG. 26b shows another embodiment of the waveforms of the first induced voltage V1 of the first sensing coil 1171 and the second induced voltage V2 of the second sensing coil 1172 generated in response to the first driving signal Id1.

In FIG. 26b, the first induced voltage V1 of the first sensing coil 1171 may include a noise voltage and may not be influenced by the noise of the second induced voltage V2.

In FIG. 26b, the noise voltage may be generated by overlapping with the first induced voltage waveform VW1 of the first induced voltage V1 in time.

Accordingly, in FIG. 26b, the waveform VW1' of the first voltage V1 generated in the first sensing coil 1171 may be the result of summing the noise voltage and the first induced voltage waveforms VW1 generated by mutual induction with the first coil 1120.

The waveform VW1' of the first voltage V1 generated in the first sensing coil 1171 of FIG. 26b is different from the second induced voltage waveforms VW2 of the second induced voltage V2 of the second sensing coil 1172.

For example, the first voltage V1 of the first sensing coil 1171 is the sum of the first induced voltage VW1 and the noise voltage, the maximum value Max2 of the first voltage V1 of the first sensing coil 1171 may be greater than the maximum value Max of the second induced voltage waveforms VW2.

Figure 27:
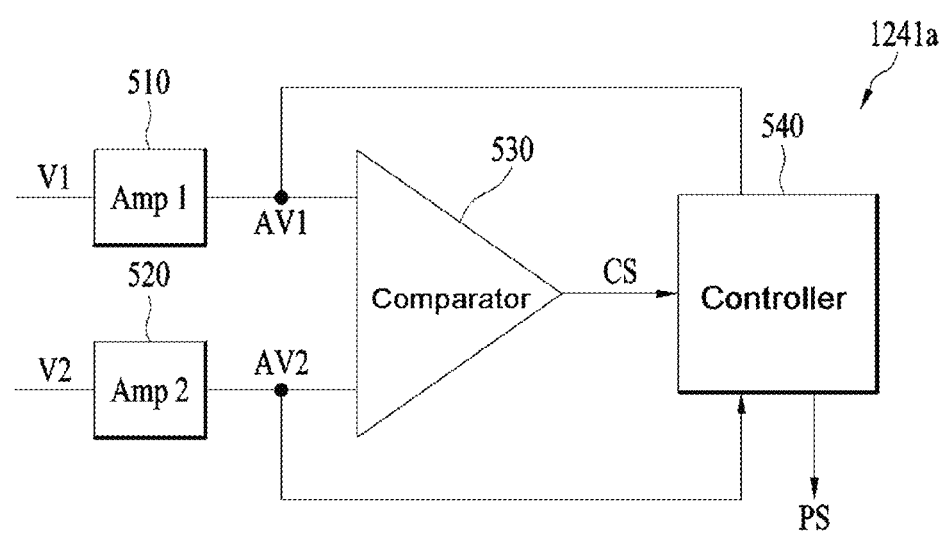
FIG. 27 is a view showing an embodiment of a detector shown in FIG. 22.

FIG. 27 shows an embodiment 1241a of the detector 1241 shown in FIG. 22.

Referring to FIG. 27, the detector 1241a may include a comparator 530 for comparing the first induced voltage V1 with the second induced voltage V2 and outputting a comparison signal CS according to the result of comparison and a controller 540 for generating a detected signal Ps based on the comparison signal CS and outputting the generated detected signal Ps.

Since the first induced voltage V1 and the second induced voltage V2 are small, in order to make a difference therebetween large enough to compare the first and second induced voltages, the embodiment may include amplifiers 510 and 520 for amplifying the first induced voltage V1 and the second induced voltage V2.

For example, the detector 1241a may further include a first amplifier 510 for amplifying the first induced voltage V1 and outputting a first amplified signal AV11 and a second amplifier 520 for amplifying the second induced voltage V2 and outputting a second amplified signal AV21.

For example, the comparator 530 may output the comparison signal CS according to the result of comparing the first and second amplified signals AV1 and AV2. The comparator 520 shown in FIG. 27 may be an analog comparator for comprising the first and second induced voltages V1 and V2 which are analog signals.

The amplification factor or gain of each of the first and second amplifiers 510 and 520 may be based on the number of turns of the first and second sensing coils 1171 and 1172.

For example, a first ratio of the amplification factor or gain of the first amplifier 510 to the number of turns of the first sensing coil 1171 may be equal to a second ratio of the amplification ratio or gain of the second amplifier 520 to the number of turns of the second sensing coil 1172. Alternatively, for example, a ratio of the first ratio to the second ratio or a difference between the first ratio and the second ratio may have a certain value.

For example, if there is no influence of noise, even when the numbers of turns of the first and second sensing coils 1171 and 1172 are different from each other, by controlling the amplification rate or gain of the first and second amplifiers 510 and 520, the first amplified signal AV1 and the second amplified signal AV2 may be controlled to be equal to each other or to have a certain voltage ratio.

The comparator 530 compares the first induced voltage V1 with the second induced voltage V2 and outputs the comparison signal CS according to the result of comparison.

The comparator 530 may output the comparison signal CS according to the result of comparing the levels of the first and second amplified voltages AV1 and AV2.

For example, the comparator 530 may output the comparison signal CS according to the result AV1-AV2 of subtracting the second amplified voltage AV2 from the first amplified voltage AV1.

The controller 540 outputs the detected signal Ps based on the comparison signal CS.

For example, if the comparison signal CS is in a reference error range, the controller 540 may determine that the first induced voltage V1 of the first coil 1171 and the second induced voltage of the second coil 1172 are not influenced by noise and output any one of the first induced voltage V1 or the second induced voltage V2 as the detected signal Ps or output the average value of the first induced voltage V1 and the second induced voltage V2 as the detected signal Ps. In addition, the controller 540 may detect displacement of the movable portion based on the detected signal Ps and control displacement of the movable portion.

In addition, for example, the controller 540 may correct the first induced voltage V1 or the second induced voltage V2 based on the comparison signal CS when the comparison signal CS is out of the reference error range, output the corrected first induced voltage V1 or the corrected second induced voltage V2 as the detected signal Ps, detect displacement of the movable portion based on the detected signal Ps, and control displacement of the movable portion.

Here, the reference error range is an error range in which it may be determined that the first induced voltage V1 and the second induced voltage V2 may be substantially equal, and may be determined according to the levels of the first and second induced voltages V1 and V2. The lower limit of the error range may be a negative value and the upper limit of the error range may be a positive value.

For example, if the comparison signal CS according to the result V1-V2 of subtracting the second induced voltage V2 from the first induced voltage V1 has a positive value outside the reference error range, the controller 540 may determine that the first induced voltage V1 includes noise, correct the first induced voltage V1 based on the level of the comparison signal CS, and output the corrected first induced voltage V1 as the detected signal Ps or output the second induced voltage V2 without noise as the detected signal Ps.

In contrast, if the comparison signal CS according to the result V1-V2 of subtracting the second induced voltage V2 from the first induced voltage V1 has a negative value outside the reference error range, the controller 540 may determine that the second induced voltage V2 includes noise, correct the second induced voltage V2 based on the level of the comparison signal CS, and output the corrected second induced voltage V2 as the detected signal Ps or output the first induced voltage V1 without noise as the detected signal Ps.

The lens moving apparatus 100 according to the embodiment of FIG. 1 may include the amplifier 310 for amplifying the induced voltage of the sensing coil 170 and outputting the amplified signal AV1.

The lens moving apparatus 1100 according to the embodiment of FIG. 27 may include a first amplifier 510 for amplifying the first induced voltage V1 of the first sensing coil 1171 and outputting a first amplified signal and a second amplifier 520 for amplifying the second induced voltage V2 of the second sensing coil 1172 and outputting a second output signal AV2.

In addition, the detector according to another embodiment may include the first amplifier 510 and the second amplifier 520 of FIG. 27 disposed on the circuit board 1250, the comparator 530 and the controller 540 of FIG. 27 may be omitted, and the comparator 530 and the controller 540 may be disposed in the camera module (e.g., the second holder 600 of the camera module) or the optical instrument.

Figure 28:
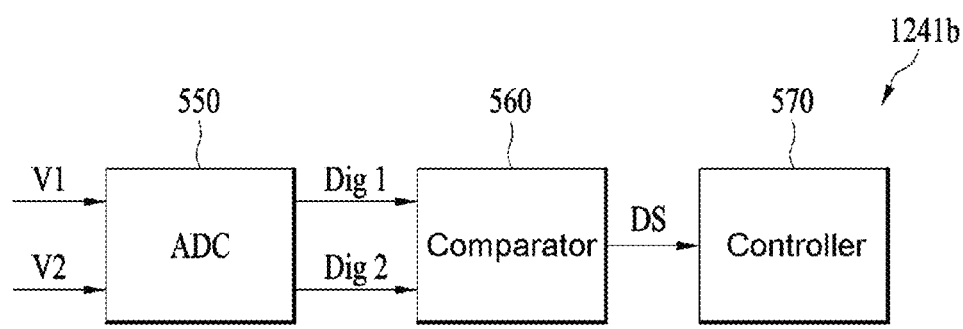
FIG. 28 is a view showing another embodiment of the detector shown in FIG. 22.

FIG. 28 shows another embodiment 1241b of the detector 1241 shown in FIG. 22.

Referring to FIG. 28, the detector 1241b may include an analog-to-digital converter 550, a comparator 560 and a controller 570.

The analog-to-digital converter 550 outputs a first digital signal Dig1 according to the result of analog-to-digital converting the first induced voltage V1 and a second digital signal Dig2 according to the result of analog-to-digital converting the second induced voltage V2.

For example, the analog-to-digital converter 550 may output the first and second digital signals Dig1 and Dig2 according to the result of removing the lower portions of the first and second induced voltage waveforms VW1, VW2 and VW1' of FIGS. 26a and 26b and analog-to-digital converting only the upper portions of the first and second induced voltage waveforms VW1, VW2 and VW1'.

The comparator 560 compares the first digital signal Dig with the second digital signal Dig2 and outputs a comparison signal DS according to the result of comparison. At this time, the comparison signal DS is a digital signal.

If the value of the comparison signal DS is 0, the controller 570 may determine that the first induced voltage V1 of the first coil 1171 and the second induced voltage of the second coil 1172 are not influenced by noise, output any one of the first induced voltage V1 or the second induced voltage V2 as the detected signal Ps, detect displacement of the movable portion based on the detected signal Ps, and control displacement of the movable portion.

If the value of the comparison signal DS is a positive value, the controller 570 may determine that the first induced voltage V1 includes noise, correct the first digital signal Dig1 based on the level of the comparison signal DS, and output the corrected first digital signal Dig1 as the detected signal Ps or output the second digital signal Dig2, which is not influenced by noise, as the detected signal.

In contrast, if the value of the comparison signal DS is a negative value, the controller 570 may determine that the second induced voltage V2 includes noise, correct the second digital signal Dig2 based on the level of the comparison signal DS, and output the corrected second digital signal Dig2 as the detected signal Ps or output the first digital signal Dig1, which is not influenced by noise, as the detected signal.

The voltage induced in the sensing coil by mutual induction with the first coil, to which the driving signal is applied, is influenced by noise caused by the surrounding environment. The embodiment may include two sensing coils, e.g., the first and second sensing coils 1171 and 1172, and generate a detected signal for detecting displacement of the movable portion based on the result of comparing the first and second induced voltages V1 and V2 in the first and second sensing coils 1171 and 1172, thereby determining influence of noise caused by the surrounding environment and removing noise. Therefore, it is possible to accurately detect the position of the movable portion and to increase accuracy of AF operation.

Figure 30A:
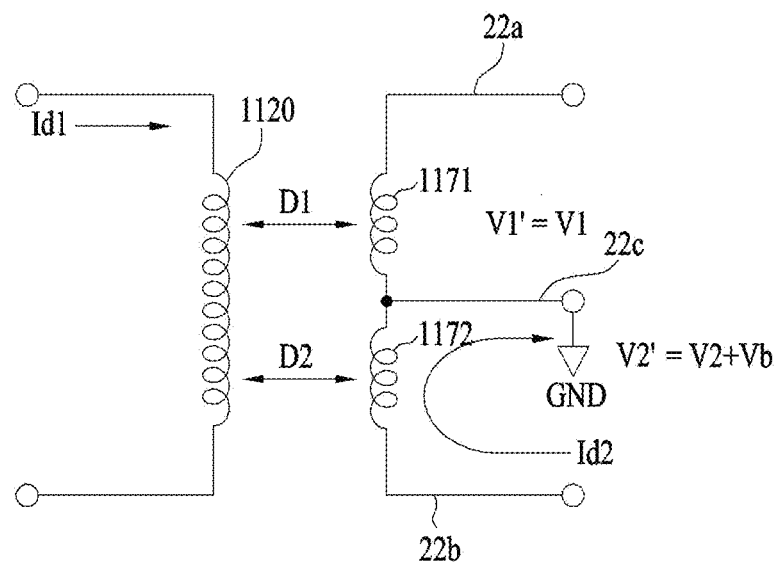
FIGS. 30a and 30b are views showing embodiments of a first coil and first and second sensing coils for temperature compensation.
Figure 30B:
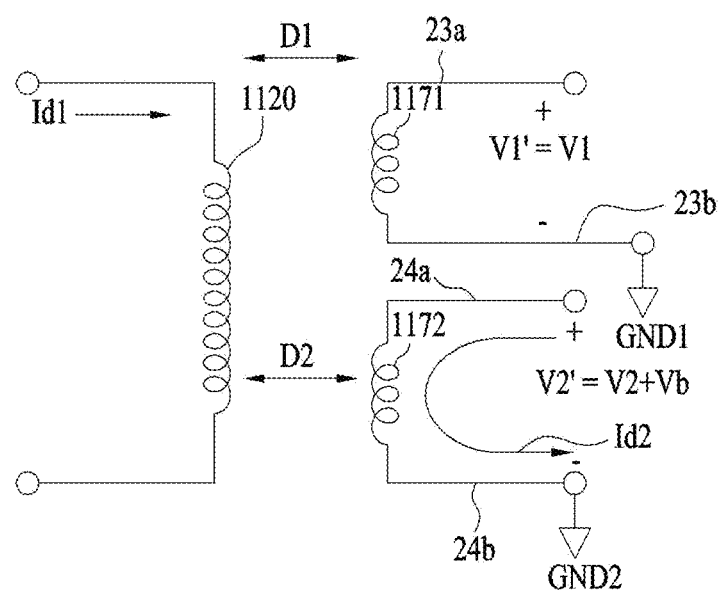

FIG. 30a shows an embodiment of the first coil 1120 and the first and second sensing coils 1171 and 1172 for temperature compensation, and FIG. 30b shows another embodiment of the first coil 1120 and the first and second sensing coils 1171 and 1172 for temperature compensation.

FIG. 30a may be the same as the arrangement of the first coil 1120 and the first and second sensing coils 1171 and 1172 shown in FIG. 25a, and FIG. 30b may be the same as the arrangement of the first coil 1120 and the first and second sensing coils 1171 and 1172 shown in FIG. 25b.

Although the driving signal is not applied to the second sensing coil 1172 in FIGS. 25a and 25b, a second driving signal Id2 for temperature compensation may be applied to the second sensing coil 1172 in FIGS. 30a and 30b.

Referring to FIGS. 30a and 30b, a first voltage V1' generated in the first sensing coil 1171 may be the first induced voltage V1 generated by mutual induction with the first coil 1120 (V'=V1).

A second voltage V2' generated in the second sensing coil 1172 may be a sum of the second induced voltage V2 generated by mutual induction with the first coil 1120 and a voltage Vb generated by the second driving signal Id2 (V2'=V2+Vb).

The voltage Vb of the second sensing coil 1172 may be a voltage due to voltage drop generated by the second driving signal Id2 and a resistance component of the second sensing coil 1172.

The second driving signal Id2 is applied to the second sensing coil 1172.

The second driving signal Id2 may be an AC signal, e.g., AC current or an AC voltage. For example, the second driving signal Id2 may be a sine wave signal or a pulse signal (e.g., a PWM) signal. Alternatively, for example, the second driving signal Id2 may include an AC signal or a DC signal.

For example, in FIG. 30a, the second driving signal Id2 may be current flowing from one end 22b of the second sensing coil 1172 to the intermediate tap 22c. In FIG. 30b, the second driving signal Id2 may be current flowing from one end 24a of the second sensing coil 1172 to the other end 24b.

Figure 31A:
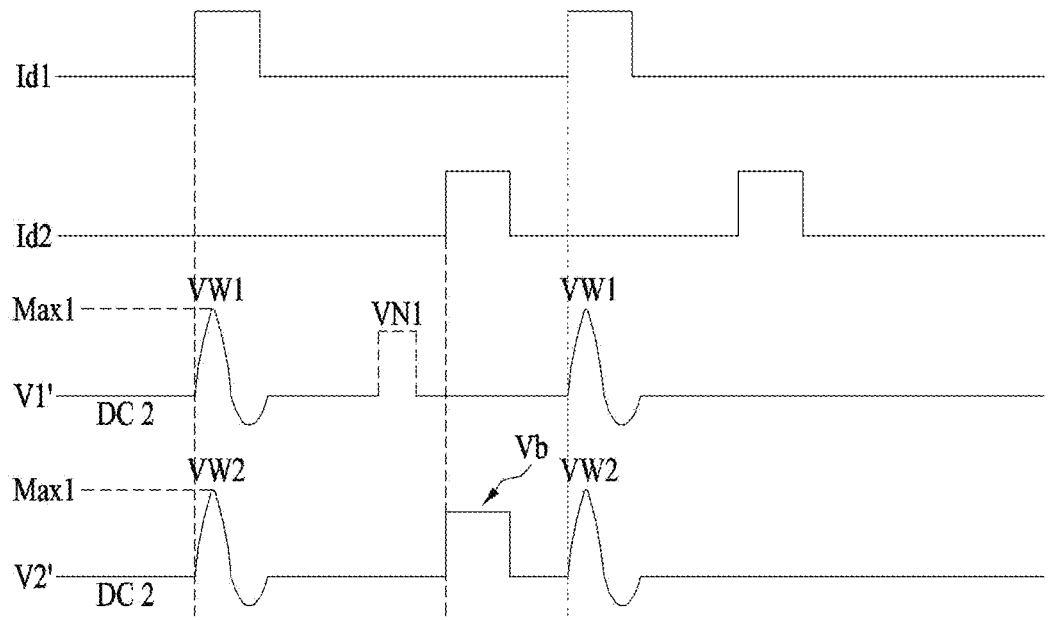
FIGS. 31a to 31d are views showing embodiments of a first voltage generated in the first sensing coil and a second voltage generated in the second sensing coil according to the first driving signal and the second driving signal of FIGS. 30a and 30b.

FIG. 31a shows an embodiment of the first voltage V1' generated in the first sensing coil 1171 and the second voltage V2' generated in the second sensing coil 1172 according to the first driving signal Id1 and the second driving signal Id2 of FIGS. 30a and 30b.

Referring to FIG. 31a, the first driving signal Id1 and the second driving signal Id2 may not overlap in time. For example, the first driving signal Id1 and the second driving signal Id2 may not be synchronized with each other in time.

For example, the first driving signal Id2 and the second driving signal Id1 may be different from each other in terms of phase. In addition, for example, the first driving signal Id2 and the second driving signal Id1 may not be equal in period without being limited thereto, and may be equal in period.

Since an interval in which the first driving signal Id1 is provided to the first coil 1120 and an interval in which the second driving signal Id2 is provided to the second sensing coil 1172 are different from each other in time, the second induced voltage of the second sensing coil 1172 generated by the first driving signal Id1, e.g., the second induced voltage waveform VW2, and the voltage Vb of the second sensing coil 1172 generated by the second driving signal Id2 may be generated not to overlap with each other in time.

Figure 31B:
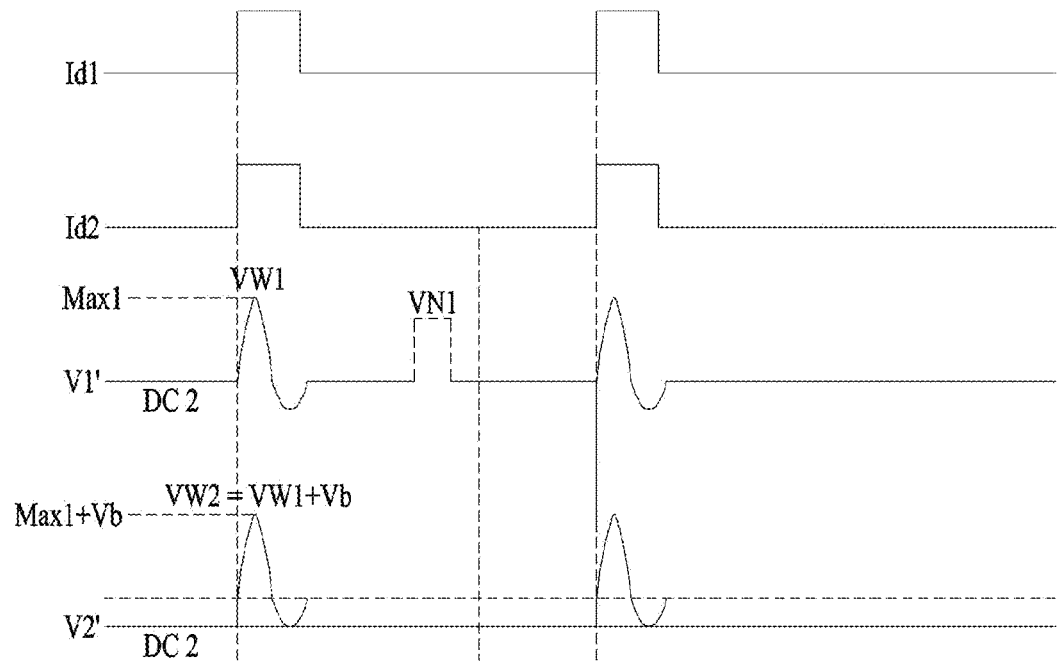

FIG. 31b shows another embodiment of the first voltage V1' generated in the first sensing coil 1171 and the second voltage V2' generated in the second sensing coil 1172 according to the first driving signal Id1 and the second driving signal Id2 of FIGS. 30a and 30b.

Referring to FIG. 31b, the first driving signal Id1 and the second driving signal Id2 may overlap in time. For example, the first driving signal Id1 and the second driving signal Id2 may be synchronized with each other in time.

For example, the first driving signal Id1 and the second driving signal Id2 may be equal to each other in phase. In addition, for example, the first driving signal Id2 and the second driving signal Id2 may be equal to each other in period without being limited thereto and may be different from each other in period.

Since an interval in which the first driving signal Id1 is provided to the first coil 1120 and an interval in which the second driving signal Id2 is provided to the second sensing coil 1172 are synchronized with each other in time, the second induced voltage of the second sensing coil 1172 by the first driving signal Id1, e.g., the second induced voltage waveform VW2, and the voltage Vb of the second sensing coil 1172 generated by the second driving signal Id2 may be summed.

In FIGS. 31a and 31b, the noise voltage VN1 caused by the surrounding environment may be generated not to overlap the first induced voltage waveform VW1 in time.

The description of the noise voltage VN1, the detector 1241, noise determination and removal described in FIGS. 26a to 26b and 27 to 28 is equally applicable to FIGS. 31a and 31b.

Figure 31C:
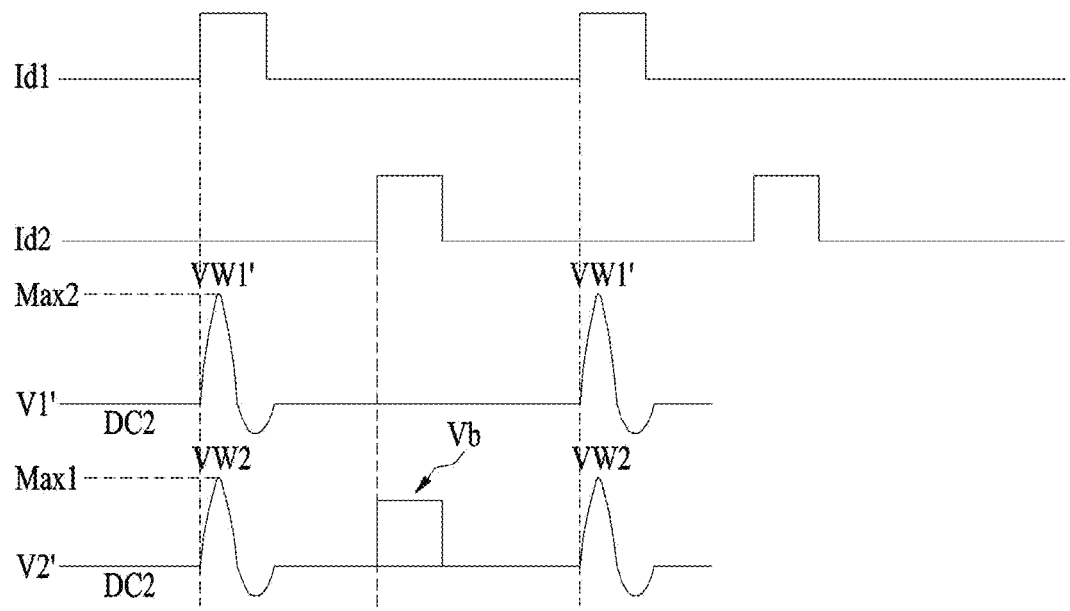
Figure 31D:
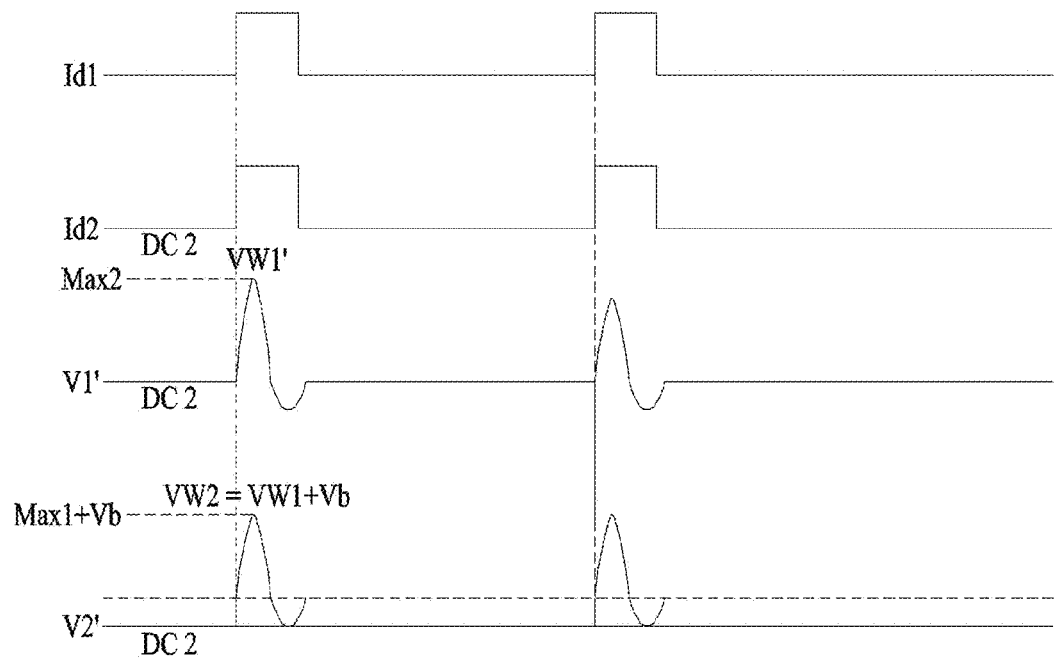

FIG. 31c shows another embodiment of the first voltage V1' generated in the first sensing coil 1171 and the second voltage V2' generated in the second sensing coil 1172 according to the first driving signal Id1 and the second driving signal Id2 of FIGS. 30a and 30b. In FIGS. 31c and 31d, the noise voltage may be generated to overlap or be synchronized with the first induced voltage waveform VW1 of the first sensing coil 1171 in time.

Referring to FIG. 31c, the first driving signal Id1 and the second driving signal Id2 are not synchronized with each other in time and the noise voltage may be added to the first induced voltage by mutual induction with the first coil 1171.

In FIG. 31c, the first voltage V1' generated in the first sensing coil 1171 may be a sum of the first induced voltage V1 by mutual induction with the first coil 1171, e.g., the first induced voltage waveform, and the noise voltage caused by noise.

For example, the first induced voltage waveform VW1' of the first voltage V1' of the first sensing coil 1171 may be the first induced voltage waveform influenced by noise.

In FIG. 31c, the second voltage V2' generated in the second coil 1172 may be equal to that described in FIG. 31a.

FIG. 31d shows another embodiment of the first voltage V1' generated in the first sensing coil 1171 and the second voltage V2' generated in the second sensing coil 1172 according to the first driving signal Id1 and the second driving signal Id2 of FIGS. 30a and 30b.

Referring to FIG. 31d, the first driving signal Id1 and the second driving signal Id2 are synchronized with each other in time and the noise voltage may be generated to overlap the first induced voltage waveform of the first induced voltage V1 of the first sensing coil 1171 in time.

The first voltage V1' generated in the first sensing coil 1171 of FIG. 31d may be equal to that described in FIG. 31c.

The second voltage V2' generated in the second sensing coil 1172 of FIG. 31d may be equal to that described in FIG. 31b.

Although the noise voltage is generated in the first sensing coil 1171 and the noise voltage is not generated in the second sensing coil 1172 in FIGS. 31a to 31d, the embodiment is not limited thereto. In another embodiment, the noise voltage may not be generated in the first sensing coil 1171 and may be generated in the second sensing coil 1172. In another embodiment, the noise voltage may be generated in each of the first sensing coil 1171 and the second sensing coil 1172.

In general, for AF feedback control, since the AF movable portion, for example, the position sensor capable of detecting displacement of the bobbin and a separate power control structure for driving the position sensor are required, the price of the lens moving apparatus may increase and a difficulty in manufacturing process may occur.

In addition, a linear region (hereinafter referred to as a first linear region) of the graph between the movement distance of the bobbin and the magnetic flux of the magnet detected by the position sensor may be limited by the positional relationship between the magnet and the position sensor.

In the embodiment, since displacement of the bobbin is detected by the first and second induced voltages V1 and V2 induced in the first and second sensing coils 1171 and 1172 and a separate position sensor for detecting displacement of the bobbin 1110 is not necessary, it is possible to reduce the cost of the lens moving apparatus and to improve the ease of the manufacturing process.

In addition, since mutual induction between the first coil 1120 and the first and second sensing coils 1171 and 1172 is used, the linear region of the graph between the movement distance of the bobbin 1110 and the first and second induced voltages V1 and V2 may increase as compared to the first linear region. Accordingly, the present embodiment can secure a wide range of linearity, improve a process failure rate and more accurately perform AF feedback control.

Figure 32:
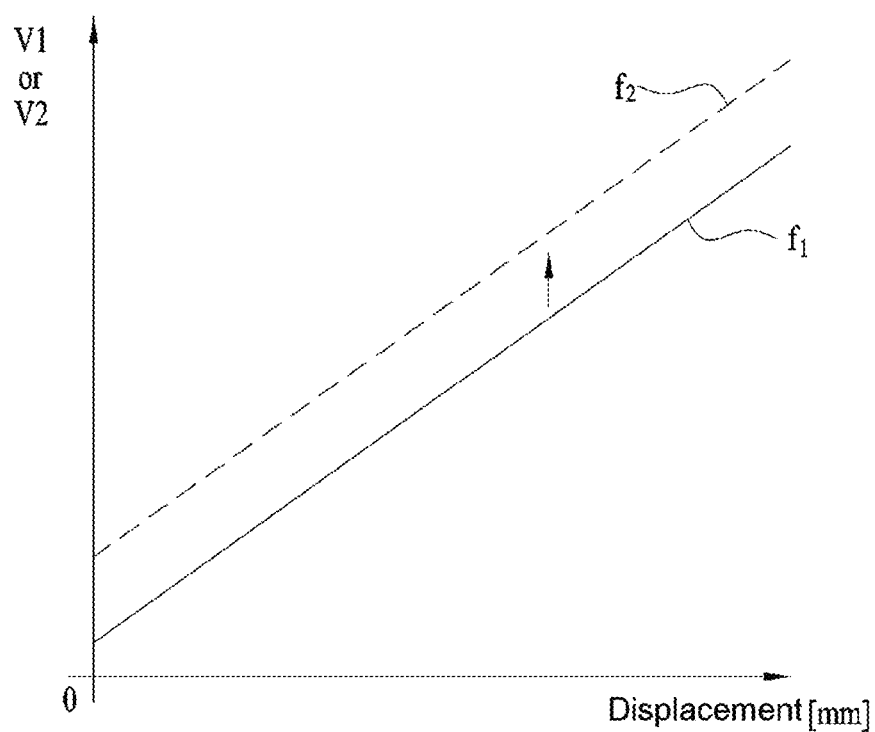
FIG. 32 is a view showing change in first or second induced voltage generated in the first sensing coil or the second sensing coil shown in FIGS. 25a and 25b according to ambient temperature.

FIG. 32 is a view showing change in first or second induced voltage V1 or V2 generated in the first sensing coil 1171 or the second sensing coil 1172 shown in FIGS. 25a and 25b according to ambient temperature.

In FIG. 32, the abscissa represents displacement of the movable portion and the ordinate represents the first induced voltage V1 or the second induced voltage V2 of the first sensing coil 1171 or the second sensing coil 1172.

f1 denotes the first or second induced voltage V1 or V2 generated in the first or second sensing coil 1171 or 1172 when the ambient temperature is 25° C. and f2 denotes the first or second induced voltage V1 or V2 generated in the first or second sensing coil 1171 or 1172 when the ambient temperature is 65° C.

Referring to FIG. 32, the first or second induced voltage V1 or V2 may increase as the ambient temperature increases. Since the first induced voltage V1 and the second induced voltage V2 induced in the first sensing coil 1171 and the second sensing coil 1172 are changed according to change in ambient temperature, the focal point of the lens mounted in the lens moving apparatus may be changed when AF feedback driving is performed.

For example, by AF feedback driving, the lens mounted in the lens moving apparatus has a first focal point at 25° C. and a second focal point different from the first focal point at 65° C.

The first and second induced voltages generated in the first and second sensing coils 1171 and 1172 at 65° C. may increase as compared to the first induced voltage generated in the first sensing coil at 25° C., and the lens of the lens moving apparatus moves by AF feedback driving based on the increased first and second induced voltages.

Not only the first and second induced voltages V1 and V2 of the first and second sensing coils 1171 and 1172 but also the focal length of the lens mounted in the lens moving apparatus are simultaneously influenced by change in ambient temperature.

For example, if the ambient temperature increases, it is possible to expand or contract the lens mounted in the lens moving apparatus and to increase or decrease the focal length of the lens. Expansion or contraction of the lens may be determined according to the type of the lens.

By compensating for AF feedback driving considering change in first and second induced voltages and/or change in focal length of the lens according to change in ambient temperature, the embodiment can suppress change in focal point of the lens according to change in ambient temperature.

Change in ambient temperature should be detected for compensation for change in ambient temperature. In the embodiment, the second driving signal Id2 may be applied to the second sensing coil 1172 and change in ambient temperature may be detected based on the first voltage V1' generated in the first sensing coil 1171 and the second voltage V2' generated in the second sensing coil 1172.

The voltage Vb generated in the second sensing coil 1172 by the second driving signal Id2 is influenced by change in ambient temperature.

The material of the first and second sensing coils 1171 and 1172 may be metal having a resistance value changed by temperature change, e.g., copper (Cu). For example, the temperature resistance coefficient of copper (Cu) may be 0.00394Ω/° C. Accordingly, as the ambient temperature increases, the resistance value of the second sensing coil 1172 may increase and the voltage Vb generated by the second driving signal Id2 may increase. In contrast, when the ambient temperature decreases, the voltage Vb generated by the second driving signal Id2 may decrease. That is, the resistance value of the second sensing coil 1172 and the voltage Vb generated by the second driving signal 12 may be measured in real time and continuously and the changed value of the measured voltage Vb may be monitored, thereby measuring change in ambient temperature.

Since the first and second induced voltages V1 and V2 of the first sensing coil 1171 and the second sensing coil 1172 are equally influenced by change in ambient temperature, a difference between the first induced voltage V1 and the second induced voltage V2 may be constant even when the ambient temperature is changed. For example, when the numbers of turns of the first sensing coil 1171 and the second sensing coil 1172 are the same, change in the first induced voltage V1 and change in the second induced voltage V2 due to change in ambient temperature may be the same.

As described above, the voltage Vb of the second sensing coil 1172 generated by the second driving signal Id2 may be changed by influence according to change in ambient temperature.

Change in difference between the voltage V1' generated in the first sensing coil 1171 and the second voltage V2' generated in the second sensing coil 1172 may be change in voltage Vb of the second sensing coil 1172 according to change in ambient temperature.

Based on change in difference between the voltage V1' generated in the first sensing coil 1171 and the second voltage V2' generated in the second sensing coil 1172 (e.g., change in Vb), the first induced voltage V1 or V1' generated in the first sensing coil 1171 or the second induced voltage V2 or V2' generated in the second sensing coil 1172 may be corrected or compensated.

For example, it is assumed that, when the ambient temperature is a room temperature (e.g., 25° C.), the difference Vb between the second voltage V2' of the second sensing coil 1172 and the voltage V1' of the first sensing coil 1171 is a first reference voltage.

The first induced voltage V1 or V1' of the first sensing coil 1171 or the second induced voltage V2 or V2' of the second sensing coil 1172 may be corrected or compensated, based on a degree of increase or decrease in the difference between the second voltage V2' of the second sensing coil 1172 and the voltage V1' of the first sensing coil 1171 as compared to the first reference voltage as the ambient temperature increases or decreases.

Since the first driving signal Id1 and the second driving signal Id2 use an AC signal (e.g., a PWM signal), the lens moving apparatus 100 shown in FIG. 16 may include a capacitor connected to the first sensing coil 1171 and the second sensing coil 1172 in order to remove the noise component (e.g., PWM noise) included in the first and second induced voltages V1 and V2.

Figure 33:
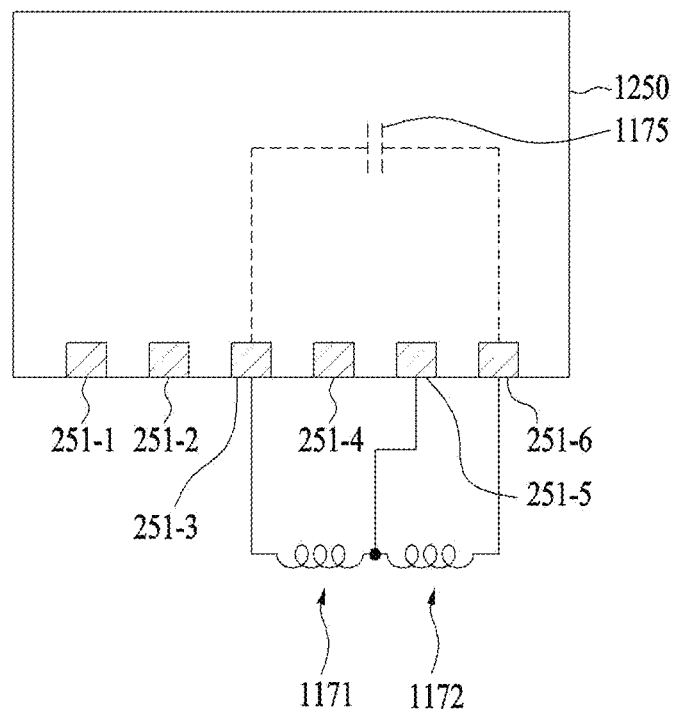
FIG. 33 is a view showing a capacitor for removing a noise component.

FIG. 33 is a view showing a capacitor 1175 for removing a noise component.

Referring to FIG. 33, the first and second sensing coils 1171 and 1172 shown in FIGS. 25*a* and 30*a* may be connected to the terminals 251-3, 251-5 and 251-6 of the circuit board 1250.

For example, one end 22*a* of the first sensing coil 1171 may be connected to the third terminal 251-3 of the circuit board 1250, one end 22*b* of the second sensing coil 1172 may be connected to the sixth terminal 251-6 of the circuit board 1250, and the intermediate tap 22*c* may be connected to the fifth terminal 251-5 of the circuit board 1250.

On end of the capacitor 1175 may be connected to the third terminal 251-3 of the circuit board 1250 and the other end of the capacitor 1175 may be connected to the sixth terminal 251-6 of the circuit board 1250.

In order to remove the noise component, the lens moving apparatus 1100 according to the embodiment may further include a first capacitor (not shown) connected to the first sensing coil 1171 shown in FIGS. 25*b* and 30*b* in parallel or in series and a second capacitor connected to the second sensing coil 1172 in parallel or in series.

The first and second sensing coils 1171 and 1172 and the capacitor 1175 may function as an LC low pass filter, and the cutoff frequency of the low pass filter may be determined based on the frequency of each of the first driving signal Id1 and the second driving signal Id2.

In general, the equivalent circuit diagram of the coil is composed of a resistance component, an inductance component and a capacitance component. The coil may cause a resonance phenomenon at a magnetic resonance frequency. At this time, current flowing in the coil and a voltage thereof may be maximized.

In order to inhibit the autofocus function and the handshake correction function of the lens moving apparatus 1100 from deteriorating, the magnetic resonance frequencies of the first coil 1120 and the first and second sensing coils 1171 and 1172 may be different from each other, and the magnetic resonance frequency of the first and second sensing coils 1171 and 1172 and the third coil 1230 may be different from each other.

For example, in order to suppress audio noise, the difference between the magnetic resonance frequency of the first coil 1120 and the magnetic resonance frequency of the first and second sensing coils 1171 and 1172 may be 20 kHz or more. For example, the difference between the magnetic resonance frequency of the first coil 1120 and the magnetic resonance frequency of the first and second sensing coils 1171 and 1172 may be 20 kHz to 3 MHz, and the difference between the magnetic resonance frequency of the first and second sensing coils 1171 and 1172 and the magnetic resonance frequency of the third coil 1230 may be 20 kHz to 3 MHz.

The magnetic resonance frequency of the third coil 1230 may be designed to be higher than that of the first coil 1120. In addition, the magnetic resonance frequency of the third coil 1230 may be higher than that of the first and second sensing coils 1171 and 1172.

The difference between the magnetic resonance frequency of the third coil 1230 and the magnetic resonance frequency of the first coil 1120 may be 20 kHz or more, in order to suppress induction of the voltage in the first coil 1120 and the first and second sensing coils 1171 and 1172 by the driving signal (e.g., the PWM signal) applied to the third coil 1230.

FIG. 29 is an exploded perspective view of a camera module 200-1 according to another embodiment. In FIG. 29, the same reference numerals as FIG. 15*b* indicate the same elements and a description of the same elements may be simplified or omitted.

Referring to FIG. 29, the camera module 200-1 may include a lens or a lens barrel 400 in which the lens is installed, a lens moving apparatus 1100, a first holder 600, a filter 610, an adhesive member 612, a second holder 800, an image sensor 810, a sensor 820, a controller 1830 and a connector 840.

The controller 1830 may include at least one of an AF controller for AF feedback driving or an OIS controller for performing OIS feedback control.

The controller 1830 may be installed in the second holder 800.

The AF controller may be electrically connected to the first coil 1200 and the first and second sensing coils 1171 and 1172 of the lens moving apparatus 1100.

The AF controller may provide the first driving signal Id1 to the first coil 1120.

The AF controller may detect displacement of the AF movable portion based on the detected signal Ps received from the detector 1241 of the lens moving apparatus 1100 and control displacement of the AF movable portion according to the result of detection.

In another embodiment, the detector 1241 of the lens moving apparatus 1100 may be omitted, the AF controller may include the detector 1241 of the lens moving apparatus 1100, and the AF controller may include the embodiments 1241*a* and 1241*b* described in FIG. 27 or 28.

In addition, the OIS controller may be electrically connected to the position sensors 240*a* and 240*b* and the OIS coils 1230-1 to 1230-4 of the third coil 1230.

The OIS controller may provide the driving signal to the OIS coils 1230-1 to 1230-4, detect displacement of the OIS movable portion based on outputs received from the position sensors 240*a* and 240*b*, and perform OIS feedback control of the OIS movable portion according to the result of detection. At this time, the OIS movable portion may include the AF movable portion and elements mounted in the housing 1140.

The connector 840 may be electrically connected to the second holder 800 and may include a port for conductible connection with an external device.

Instead of the capacitor described in FIG. 33 being disposed on the circuit board 1250 of the lens moving apparatus 1100, in order to remove PWM noise, the camera module 200-1 may further include a capacitor disposed in the second holder 800 and electrically connected to both ends of each of the first and second sensing coils 1171 and 1172.

Figure 34:
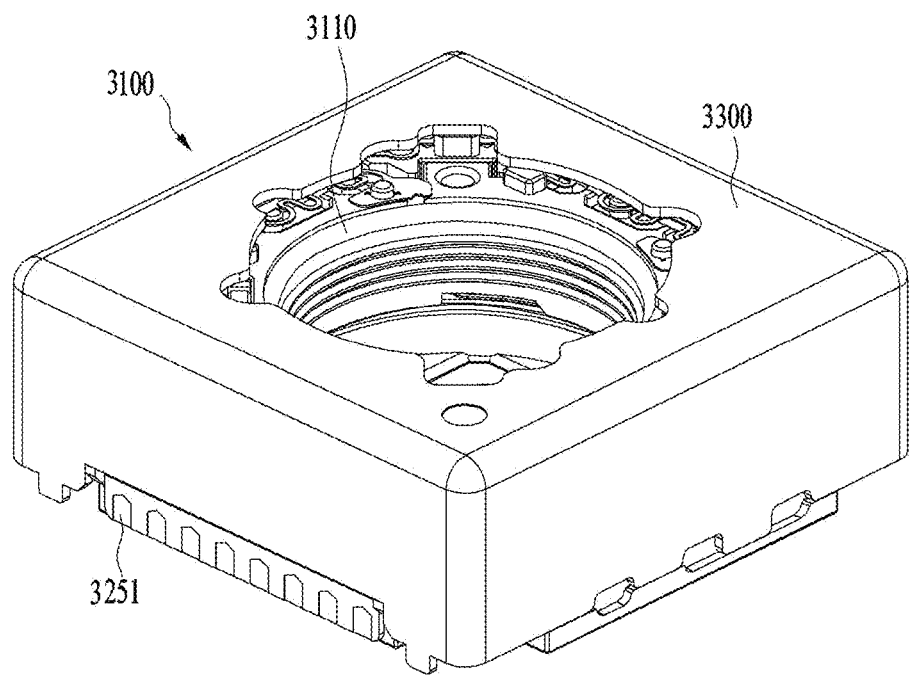
FIG. 34 is a perspective view of a lens moving apparatus according to an embodiment.
Figure 35:
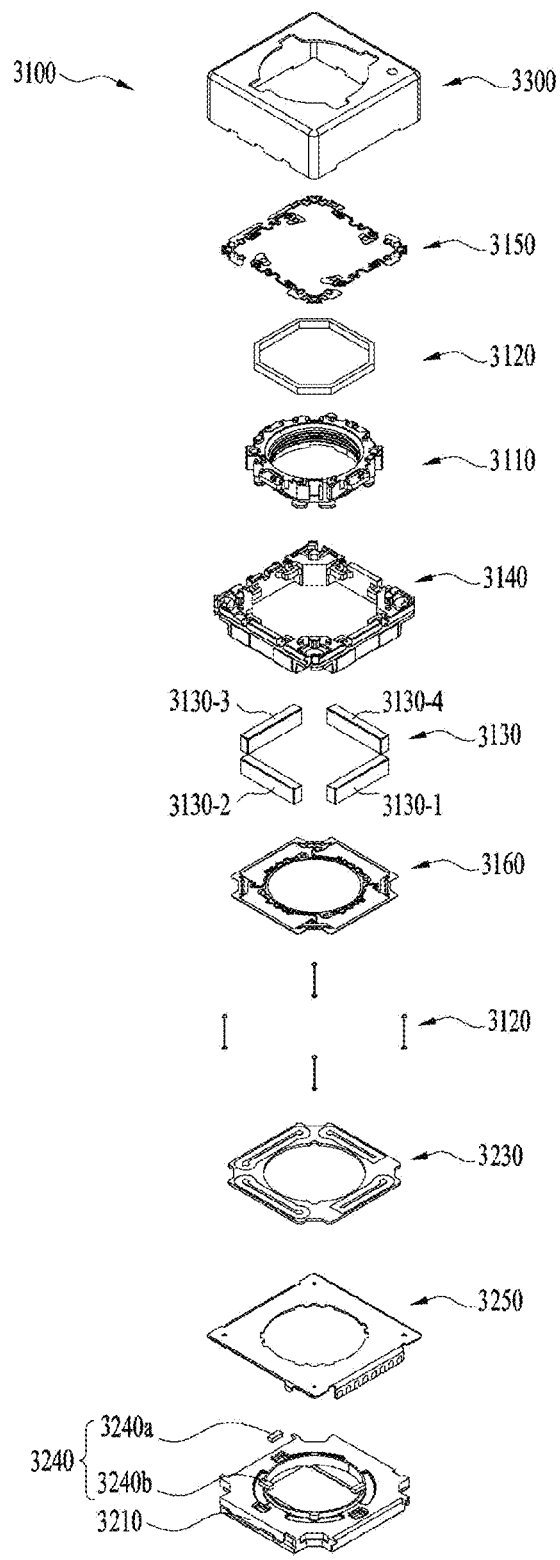
FIG. 35 is an exploded perspective view of the lens moving apparatus shown in FIG. 34.
Figure 36:
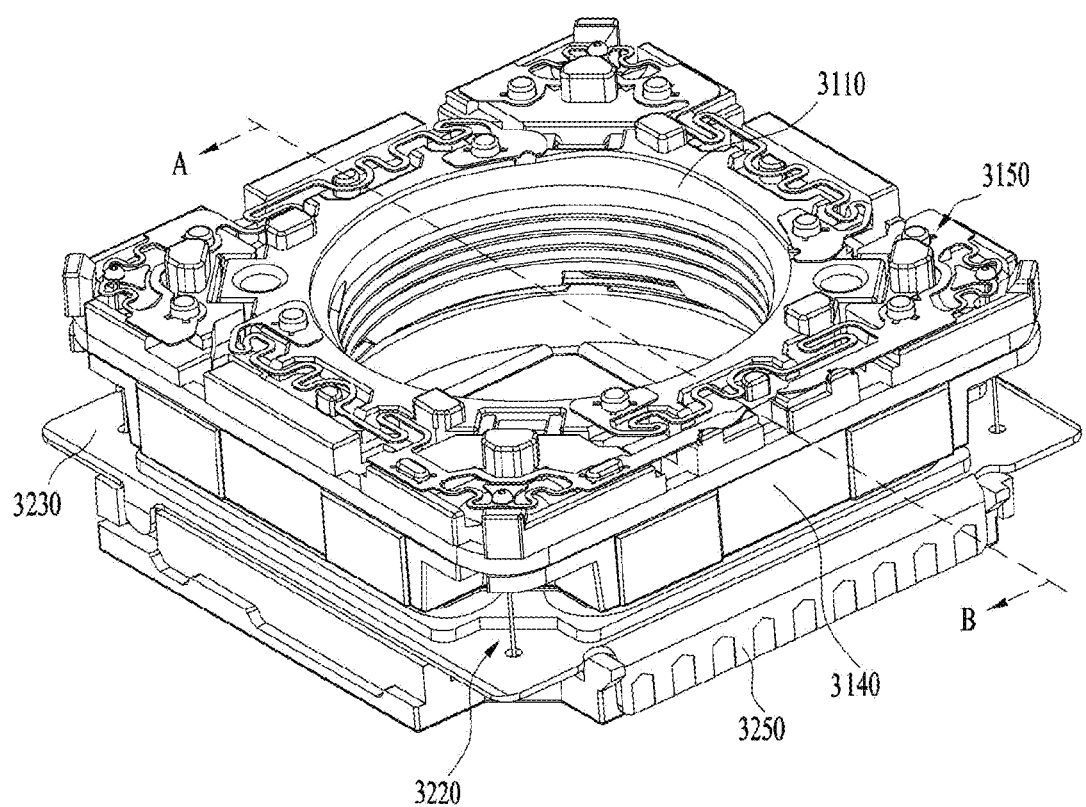
FIG. 36 is an assembled perspective view of the lens moving apparatus of FIG. 34 except for a cover member of FIG. 35.

FIG. 34 is a perspective view of a lens moving apparatus 3100 according to an embodiment, FIG. 35 is an exploded perspective view of the lens moving apparatus 3100 shown in FIG. 34, and FIG. 36 is an assembled perspective view of the lens moving apparatus 3100 of FIG. 34 except for a cover 3300.

Referring to FIGS. 34 to 36, the lens moving apparatus 3100 includes a cover member 3300, a bobbin 3110, a first coil 3120, a magnet 3130, a housing 3140, an upper elastic member 3150, a lower elastic member 3160, a base 3310, a plurality of supporting members 3220 and a circuit board 3250.

The lens moving apparatus 3100 may include a third coil 3230 interacting with the magnet 3130 for handshake correction. In addition, the lens moving apparatus 3100 may further include a position sensor 3240 for feedback OIS operation. A description of the cover member 300 of FIG. 1 or the cover member 1300 of FIG. 16 is applicable to the cover member 3300.

Next, the bobbin 3110 will be described.

The bobbin 3110 may be disposed inside the housing 3140 and may be moved in a first direction, e.g., a z-axis direction, by electromagnetic interaction between the first coil 3120 and the magnet 3130.

For example, when the driving signal, e.g., driving current, is supplied to the first coil 3120, the bobbin 3110 may rise from an initial position and, when supply of the driving signal is stopped, the bobbin 3120 falls, thereby implementing an autofocus function.

In addition, for example, when forward driving current is applied, the bobbin 3110 may be moved upward from the initial position and, when backward current is applied, the bobbin 3110 may be moved downward from the initial position.

The bobbin 3110 may have a hollowness in which the lens or the lens barrel will be mounted. The shape of the hollowness may be circular, elliptical or polygonal without being limited thereto.

Although not shown, the bobbin 3110 may include a lens barrel (not shown) in which at least one lens is installed. The lens barrel may be coupled to the inside of the bobbin 110 in various manners.

Figure 37A:
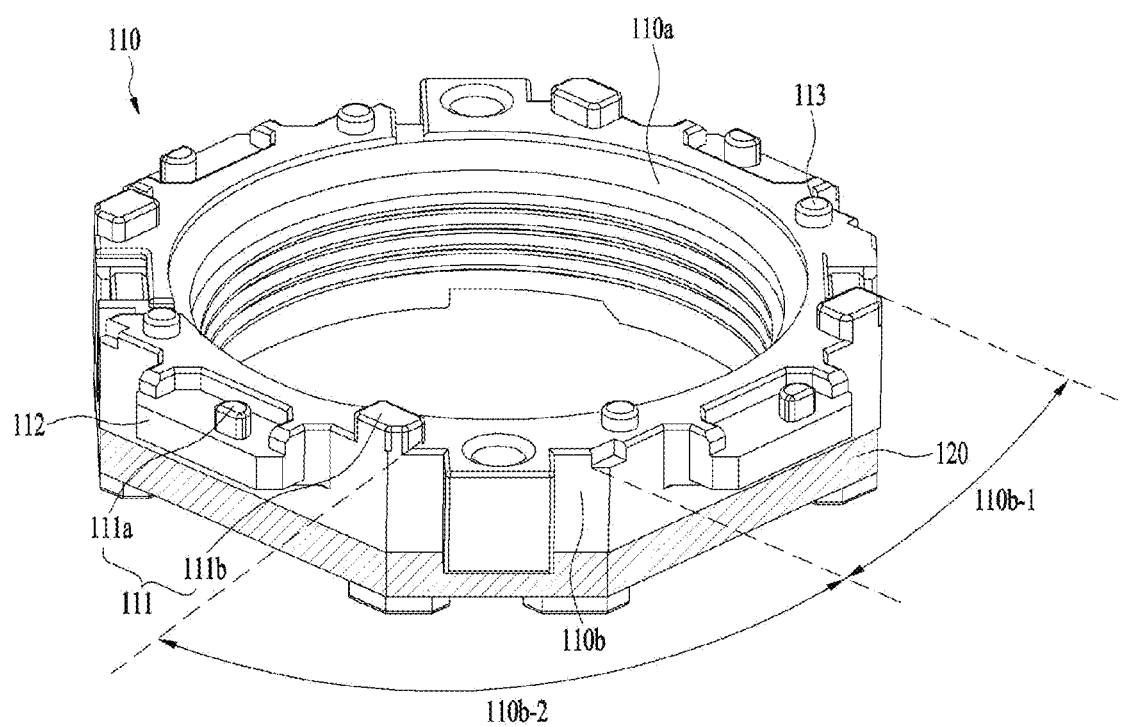
FIG. 37a is a first perspective view of a bobbin and a first coil shown in FIG. 34.
Figure 37B:
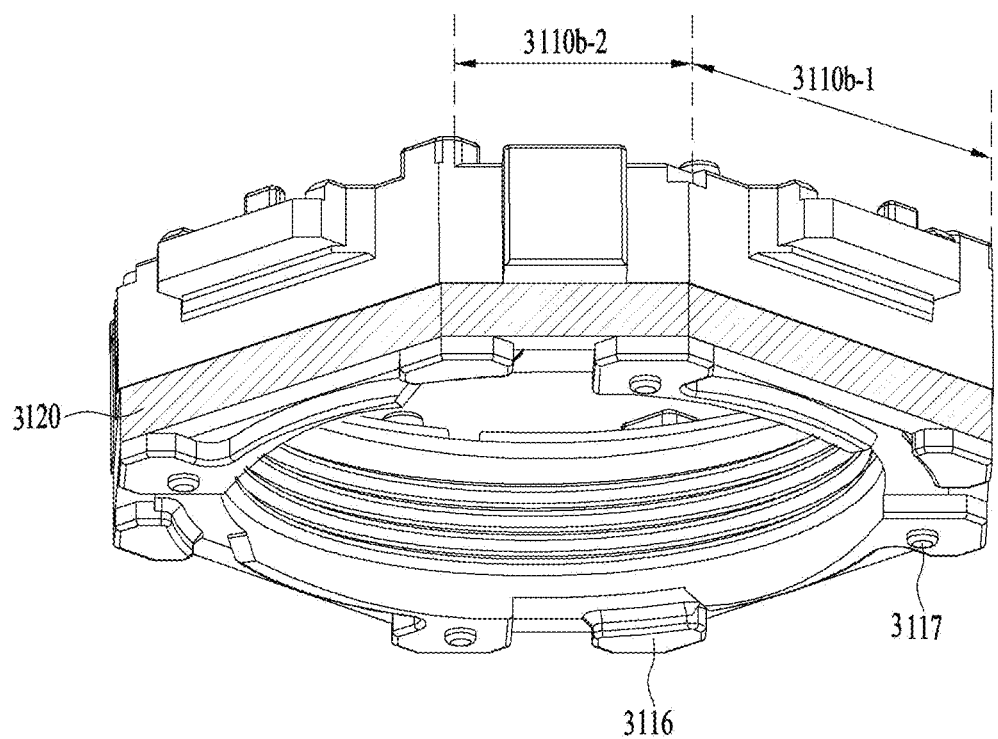
FIG. 37b is a second perspective view of the bobbin and the first coil shown in FIG. 34.

FIG. 37*a* is a first perspective view of the bobbin 3110 and the first coil 3120 shown in FIG. 34, and FIG. 37*b* is a second perspective view of the bobbin 3110 and the first coil 3120 shown in FIG. 34.

Referring to FIGS. 37*a* and 37*b*, the bobbin 3110 may include a first protrusion 3111 protruding from the upper surface thereof in a first direction and a second protrusion 3112 protruding from the outer circumferential surface of the bobbin 3110 in a second direction and/or a third direction.

The first protrusion 3111 of the bobbin 3110 may include a guide portion 3111*a* and a first stopper 3111*b*. The guide portion 3111*a* of the bobbin 3110 may serve to guide the installation position of the upper elastic member 3150. For example, the guide portion 311*a* of the bobbin 3110 may guide a first frame connector 3153 of the upper elastic member 3150.

The second protrusion 3112 of the bobbin 3110 may protrude from the outer circumferential surface of the bobbin 3110 in the second direction and/or the third direction perpendicular to the first direction.

In addition, a first upper supporting projection 3113 engaged with a through-hole 3151*a* of a first inner frame 3151 of the upper elastic member 3150 may be provided on the upper surface of the bobbin 3110.

The first stopper 3111*b* and the second protrusion 3111*b* of the bobbin 3110 may serve to inhibit the upper surface of the bobbin 3110 from directly colliding with the inside of the cover member 3300 even when the bobbin 3110 moves beyond a prescribed range by external impact in the case where the bobbin 3110 moves in the first direction for the autofocus function.

The bobbin 3110 may include a first lower supporting projection 3117 formed on a lower surface thereof to be engaged with and fixed to the through-hole 3161*a* of the lower elastic member 3160.

The bobbin 3110 may include a second stopper 3116 protruding from the lower surface thereof. The second stopper 3116 may serve to inhibit the lower surface of the bobbin 3110 from directly colliding with the base 3210, the third coil 3230 or the circuit board 3250 even when the bobbin 3110 moves beyond a prescribed range by external impact in the case where the bobbin 3110 moves in the first direction for the autofocus function.

The outer circumferential surface 3110*b* of the bobbin 3110 may include first side portions 3110*b*-1 and second side portions 3110*b*-2 located between the first side portions 3110*b*-1.

The first side portions 3110*b*-1 of the bobbin 3110 may correspond to or be opposite to the magnet 3130. Each of the second side portions 3110-*b* of the bobbin 3110 may be disposed between two adjacent first side portions.

The outer circumferential surface of each of the first side portions 3110*b*-1 of the bobbin 3110 may be planar and the outer circumferential surface of each of the second side portions 3110*b*-2 may be curved, without being limited thereto.

The bobbin 3110 may include at least one first coil groove (not shown), in which the first coil 3120 is disposed or installed, in the outer circumferential surface 3110*b* thereof. For example, the first coil groove may be provided in the first side portions and the second side portions of the bobbin 3110. The shape and number of first coil grooves may correspond to the shape and number of first coils 3120 disposed on the outer circumferential surface 3110*b* of the bobbin 3110. In another embodiment, the bobbin 3110 may not include the first coil groove and the first coil 3120 may be directly wound on and fixed to the outer circumferential surface of the bobbin 3110.

Next, the first coil 3120 will be described.

The first coil 3120 may be disposed on the outer circumferential surface 3110b of the bobbin 3110, and may be a driving coil for performing electromagnetic interaction with the magnet 1330 disposed in the housing 3140.

In order to generate electromagnetic force by interaction with the magnet 3130, a driving signal (e.g., driving current or voltage) may be applied to the first coil 3120.

The driving signal applied to the first coil 3120 may be an AC signal (e.g., AC current). For example, the driving signal provided to the first coil 3120 may be a sine wave signal or a pulse signal (e.g., a pulse width modulation (PWM) signal).

In another embodiment, the driving signal applied to the first coil 3120 may include an AC signal and a DC signal.

By electromagnetic force due to interaction between the first coil 3120 and the magnet 3130, an AF movable portion may move in the first direction.

By controlling the driving signal applied to the first coil 3120 to control electromagnetic force due to interaction between the first coil 3120 and the magnet 3130, it is possible to control movement of the AF movable portion in the first direction and thus to perform an autofocus function.

The AF movable portion may include the bobbin 3110 elastically supported by upper and lower elastic members 3150 and 3160 and elements installed in the bobbin 110 to move along with the bobbin 3110. For example, the AF movable portion may include the bobbin 3110, the first coil 3120, and a lens (not shown) installed in the bobbin 3110.

The first coil 3120 may be wound to surround the outer circumferential surface of the bobbin 3110 to rotate clockwise or counterclockwise about an optical axis. In another embodiment, the first coil 3120 may be implemented in a coil ring shape wound clockwise or counterclockwise about an axis perpendicular to the optical axis, e.g., a coil ring shape, and the number of coil rings may be equal to the number of magnets 3130, without being limited thereto.

The first coil 3120 may be electrically connected to at least one of the upper or lower elastic member 3150 or 3160 and may be electrically connected to the circuit board 3250 through the upper or lower elastic member 3150 or 3160 and the supporting members 3220.

The housing 3140 receives the bobbin 3110, in which the first coil 3120 is disposed, and supports the magnet 3130.

Figure 38A:
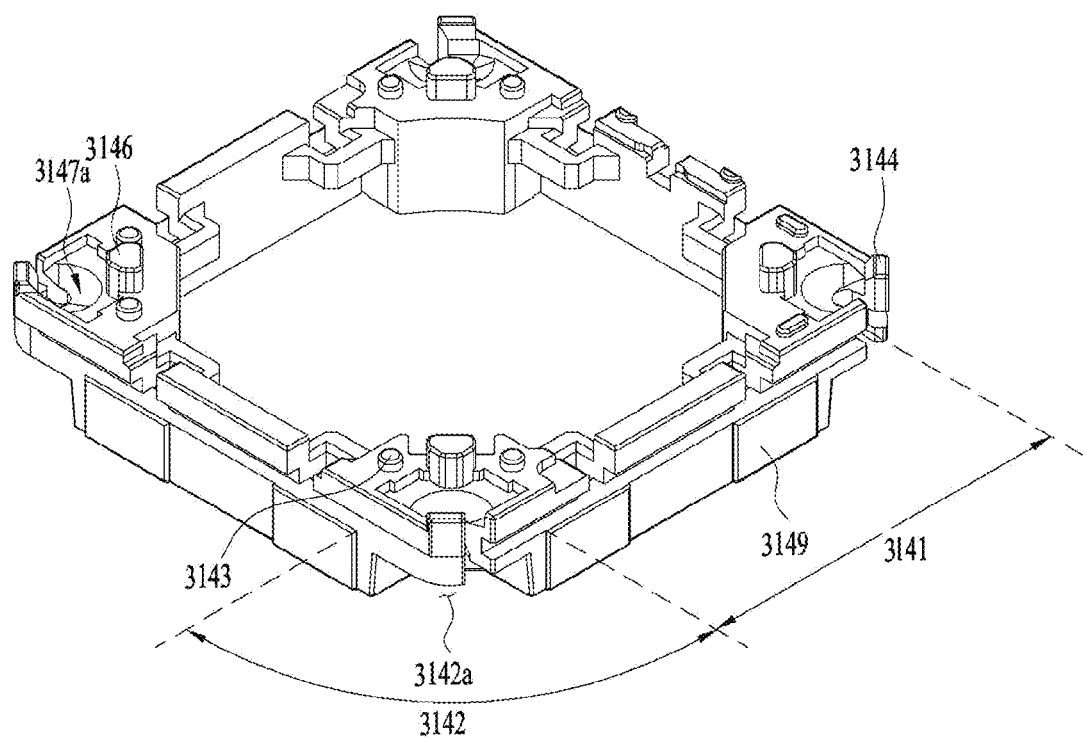
FIG. 38a is a first perspective view of a housing shown in FIG. 34.
Figure 38B:
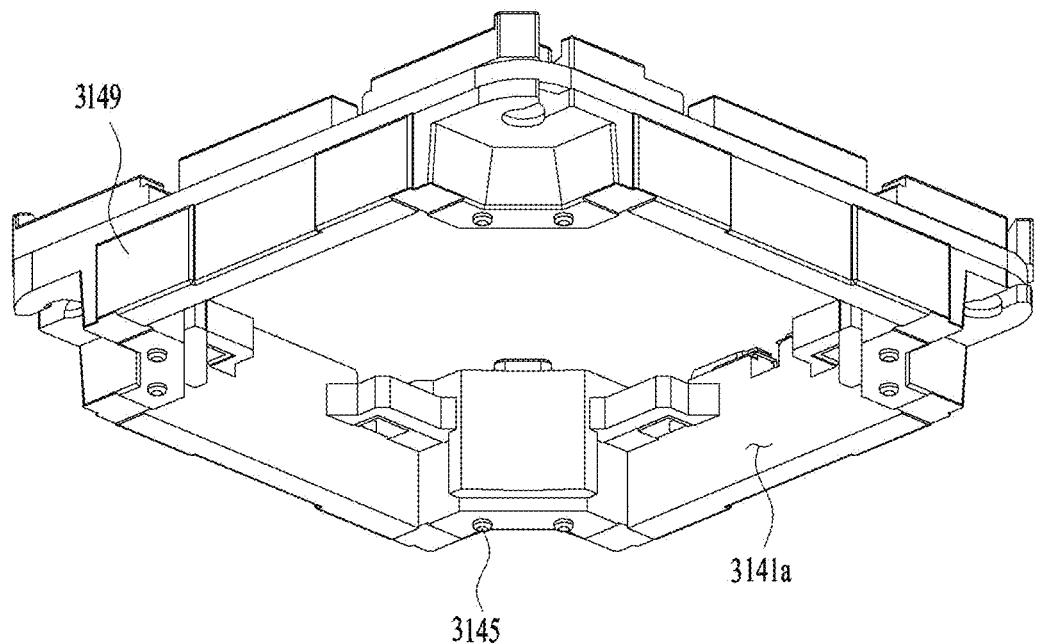
FIG. 38b is a second perspective view of the housing shown in FIG. 34.
Figure 39:
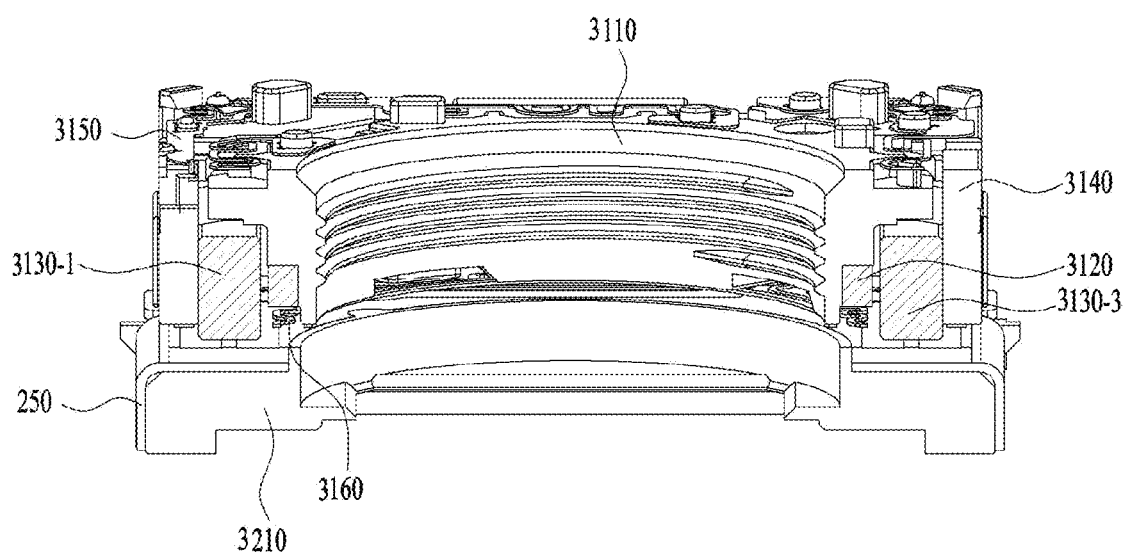
FIG. 39 is a cross-sectional view of the lens moving apparatus shown in FIG. 36 taken along line A-B.

FIG. 38a is a first perspective view of the housing 3140 shown in FIG. 34, FIG. 38b is a second perspective view of the housing 3140 shown in FIG. 34, and FIG. 39 is a cross-sectional view of the lens moving apparatus 3100 shown in FIG. 36 taken along line A-B.

Referring to FIGS. 38a, 38b and 39, the housing 3140 may have a hollow pillar shape and may include the plurality of side portions 3141 and second side portions 3142 forming the hollowness.

For example, the housing 3140 may include the first side portions 3141 spaced apart from each other and the second side portions 3142 spaced apart from each other. Each of the first side portions 3141 of the housing 3140 may be disposed or located between two adjacent second side portions 3142 to connect the second side portions 3142 to each other, and may include a plane having a certain depth.

The magnet 3130 may be disposed or installed on the first side portions 3141 of the housing 3140, and a supporting member 3220 may be disposed on the second side portions 3142 of the housing 3140.

The housing 3140 may include a magnet seating portion 3141a provided in the inner surfaces of the first side portions 3141 in order to support or receive the magnets 3130-1 to 3130-4.

The first side portions 3141 of the housing 3140 may be disposed in parallel to the side plate of the cover member 3300. A through-hole 3147a, through which the supporting member 3220 passes, may be provided in the second side portions 3142 of the housing 3140.

In addition, a second stopper 3144 may be provided on the upper surface of the housing 3140, in order to inhibit direct collision with the inner surface of the cover member 3300.

The housing 3140 may include at least one second upper supporting projection 3143 on the upper surfaces of the second side portions 3142, for engagement with the through-hole 3152a of the first outer frame 3152 of the upper elastic member 3150, and second lower supporting projections 3145 on the lower surfaces of the second side portions 3142, for engagement with and fixing to the through-hole 3162a of the second outer frame 3162 of the lower elastic member 3160.

In order not only to secure a passage, through which the supporting member 3220 passes, but also to secure a space filled with silicon capable of damping, the housing 3140 may include grooves 3142a provided in the second side portions 3142. For example, the grooves 3142a of the housing 3140 may be filled with damping silicon.

The housing 3140 may include third stoppers 3149 protruding from the side surfaces of the first side portions 3141. The third stoppers 3149 may inhibit the housing 3140 from colliding with the inner surface of the side plate of the cover member 3300 when the housing 3140 moves in the second and third directions.

The housing 3140 may further include a fourth stopper (not shown) protruding from the lower surface thereof, in order to inhibit the bottom surface of the housing 3140 from colliding with the base 3210, the third coil 3230 and/or the circuit board 3250.

The magnets 3130-1 to 3130-4 are received in the first side portions 3141 of the housing 3140, without being limited thereto. In another embodiment, the magnets 3130-1 to 3130-4 may be disposed outside the first side portions 3141 of the housing 3140.

The magnet 3130 may be disposed on the first side portions 3141 of the housing 3140 to correspond to or to be aligned with the first coil 3120 in a direction perpendicular to the optical axis direction.

For example, the magnets 3130-1 to 3130-4 disposed in the housing 3130 may overlap the first coil 3120 in the direction perpendicular to the optical axis, for example, in the second or third direction, at the initial position of the AF movable portion (e.g., the initial position of the bobbin 3110). The initial position of the AF movable portion may be equal to that described in the embodiment of FIG. 1.

In another embodiment, the first side portions 3141 of the housing 3140 are not provided with the magnet seating portion 3141a, and the magnet 3130 may be disposed on any one of the outside or inside of the first side portions 3141 of the housing 3140.

The magnet 3130 may have a shape corresponding to the shape of the first side portions 3141 of the housing 3140, e.g., a rectangular parallelepiped shape, without being limited thereto.

The magnet 3130 may be a unipolar magnet or a bipolar magnet having an S-pole surface opposite to the first coil 3120 and an N-pole outer surface thereof. However, the embodiment is not limited thereto and the S- and N-poles may be reversely disposed.

In the embodiment, the number of magnets 3130 is 4, but the embodiment is not limited thereto and the number of magnets 3130 may be at least two. The surface of the magnet 3130 opposite to the first coil 3120 may be planar, but the embodiment is not limited thereto and the surface of the magnet 3130 opposite to the first coil 3120 may be curved.

Next, the upper elastic member 3150 and the lower elastic member 3160 will be described.

The upper elastic member 3150 and the lower elastic member 3160 may be coupled with the bobbin 3110 and the housing 3140 to flexibly support the bobbin 3110.

Figure 40:
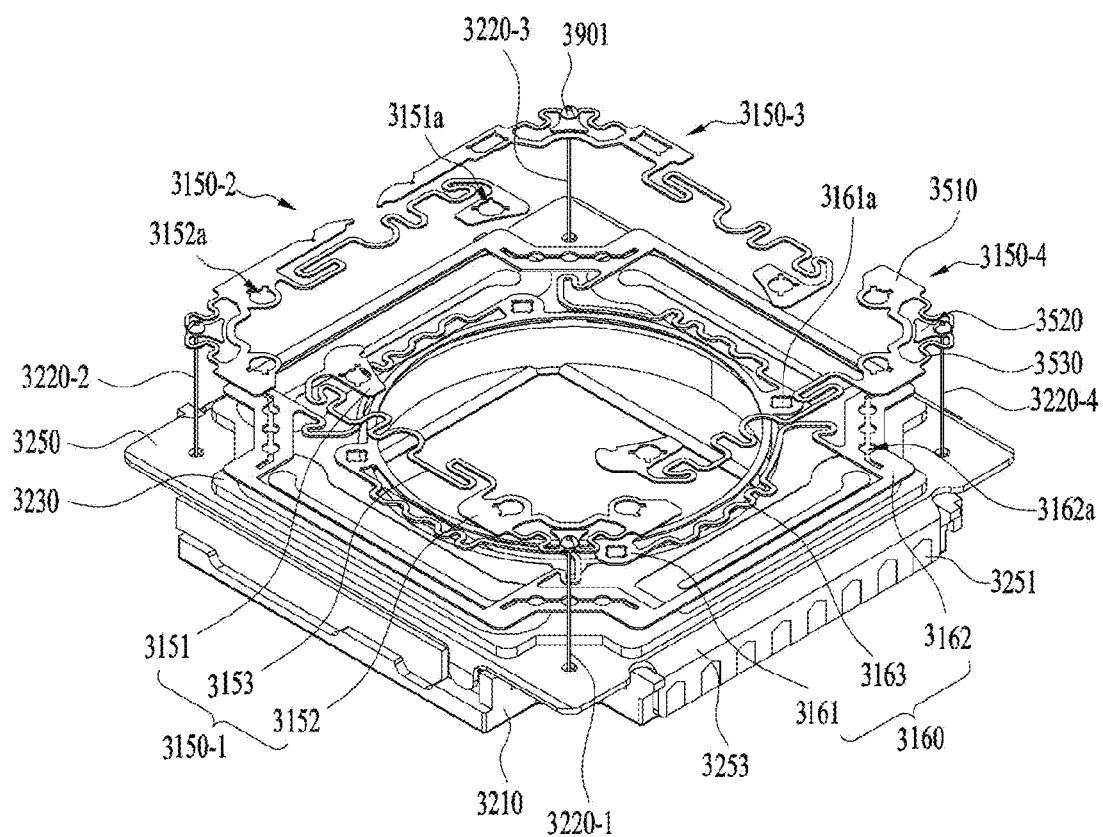
FIG. 40 is an assembled perspective view of an upper elastic member, a lower elastic member, a third coil, a circuit board, and a base of FIG. 35.

FIG. 40 is an assembled perspective view of the upper elastic member 3150, the lower elastic member 3160, the supporting member 3220, the third coil 3230, the circuit board 3250 and the base 3210 of FIG. 35.

Referring to FIG. 40, the upper elastic member 3150 and the lower elastic member 3160 may be coupled to the bobbin 3110 and the housing 3140 to flexibly support the bobbin 3110.

For example, the upper elastic member 3150 may be coupled to the upper portion, the upper surface or the upper end of the bobbin 3110 and the upper portion, the upper surface or the upper end of the housing 3140, and the lower elastic member 3160 may be coupled to the lower portion, the lower surface or the lower end of the bobbin 3110 and the lower portion, the lower surface or the lower end of the housing 3140.

At least one of the upper and lower elastic members 3150 and 3160 may be divided into two or more.

For example, the upper elastic member 3150 may include first to fourth upper springs 3150-1 to 3150-4 spaced apart from each other.

The upper elastic member 3150 and the lower elastic member 3160 may be implemented as a leaf spring without being limited thereto and may be implemented as a coil spring, a suspension wire, etc.

Each of the first to fourth upper springs 3150-1 to 3150-4 may include an inner frame 3151 coupled to the upper portion, the upper surface or the upper end of the bobbin 3110, a first outer frame 3152 coupled to the upper portion, the upper surface or the upper end of the housing 3140, and a first frame connector 3153 connecting the first inner frame 3151 with the first outer frame 3152.

The outer frame 3152 of each of the first to fourth upper springs 3150-1 to 3150-4 may include a first coupler 3510 coupled to the housing 3140, a second coupler 3520 coupled to the supporting members 3220-1 to 3220-4 and a connector 3530 connecting the first coupler 3510 with the second coupler 3520.

The lower elastic member 3160 may include a second inner frame 3161 coupled to the lower portion, the lower surface or the lower end of the bobbin 3110, a second outer frame 3162 coupled to the lower portion, the lower surface or the lower end of the housing 3140 and a second frame connector 3163 connecting the second inner frame 3161 with the second outer frame 3162.

Each of the first and second frame connectors 3153 and 3163 of the upper and lower elastic members 3150 and 3160 may be bent or curved at least one time to form a predetermined pattern. Rising and falling operation of the bobbin 3110 in the first direction may be flexibly supported through positional change and microdeformation of the first and second frame connectors 3153 and 3163.

For example, one end of the first coil 3120 may be bonded to the first inner frame 3151 of any one (e.g., 3150-1) of the upper springs 3150-1 to 3150-4 and the other end of the first coil 3120 may be bonded to the first inner frame 3151 of another (e.g., 3150-2) of the upper springs 3150-1 to 3150-4.

For example, the first connector connected to the first coil 3120 may be provided on the first inner frame 3151 of each of the first to second upper springs 3150-1 to 3150-2 by soldering or a conductive adhesive member.

Each of the first to fourth upper springs 3150-1 to 3150-4 may include a through-hole 3151a disposed in the first inner frame 3151 and engaged with the first upper supporting projection 3113 of the bobbin 3110 and a through-hole 3152a disposed in the first outer frame 3152 and engaged with the second upper supporting projection 3143 of the housing 3140.

In addition, the lower elastic member 3160 may include a through-hole 3161a disposed in the second inner frame 3161 and engaged with the first lower supporting projection 3117 of the bobbin 3110 and a through-hole 3162a disposed in the second outer frame 3162 and engaged with the second lower supporting projection 3145 of the housing 3140.

In order to absorb and damp vibration of the bobbin 3110, the lens moving apparatus 3100 may further include a first damping member (not shown) disposed between each of the upper springs 3150-1 to 3150-4 and the housing 3140.

For example, the first damping member (not shown) may be disposed in a space between the first frame connector 3153 of each of the upper springs 3150-1 to 3150-4 and the housing 3140.

In addition, for example, the lens moving apparatus 3100 may further include a second damping member (not shown) disposed between the second frame connector 3163 of the lower elastic member 3160 and the housing 3140.

In addition, for example, a damping member (not shown) may be further disposed between the inner surface of the housing 3140 and the outer circumferential surface of the bobbin 3110.

By two electrically disconnected upper springs and the supporting members corresponding thereto, the circuit board 3250 and the first coil 3120 may be electrically connected and the driving signal may be provided from the circuit board 3250 to the first coil 3120. However, the embodiment is not limited thereto.

In another embodiment, the role of the plurality of upper springs and the role of the lower elastic member 160 may be interchanged. That is, the lower elastic member 160 may be divided into a plurality of lower elastic members and the circuit board 3250 and the first coil 3120 may be electrically connected using two electrically disconnected lower elastic members.

Next, the supporting member 3230 will be described.

A plurality of supporting members 3220 may be provided and the plurality of supporting members 3220-1 to 3220-4 may be located to correspond to the second side portions 3142 of the housing 3140, and may support the bobbin 3110 and the housing 3140 such that the bobbin 3110 and the housing 3140 are moved in the direction perpendicular to the first direction.

For example, each of the plurality of supporting members 3220-1 to 3220-4 may be disposed adjacent to any one of the four second side portions 3142.

Although one supporting member is disposed on each of the second side portions 3142 of the housing 3140 in FIG. 40, the embodiment is not limited thereto.

In another embodiment, two or more supporting members may be disposed on each of the second side portions of the housing 3140 and the upper elastic member 3150 may include two or more upper springs disposed on at least one of the second side portions of the housing 3140. For example, two supporting members disposed on any one second side portion of the housing 3140 may be connected to any one of two upper springs separated from each other and disposed on the second side portion.

One end of each of the supporting members 3220-1 to 3220-4 may be bonded to the outer frames 3152 of the upper elastic members 3150-1 to 3150-4 disposed on the corresponding second side portion, by an adhesive member 3901 or a solder. The plurality of supporting members 3220-1 to 3220-4 may be spaced apart from the housing 3140 and may not be fixed to the housing 3140 but may be directly connected to the connectors 3530 of the outer frames 3153 of the upper springs 3150-1 to 3150-4.

In another embodiment, the supporting member 3220 may be disposed on the first side portions 3141 of the housing 3140 in the form of a leaf spring.

The plurality of supporting members 3220-1 to 3220-4 and the upper springs 3150-1 to 3150-4 may transmit the driving signal from the circuit board 3250 to the first coil 3120.

The plurality of supporting members 3220-1 to 3220-4 may be formed separately from the upper elastic member 3150, and may be implemented as an elastically supportable member, e.g., a leaf spring, a coil spring or a suspension wire. In addition, in another embodiment, the supporting members 3220-1 to 3220-4 may be formed integrally with the upper elastic member 3150.

Next, the base 3210, the third coil 3230, the position sensor 240 and the circuit board 250 will be described.

Figure 41:
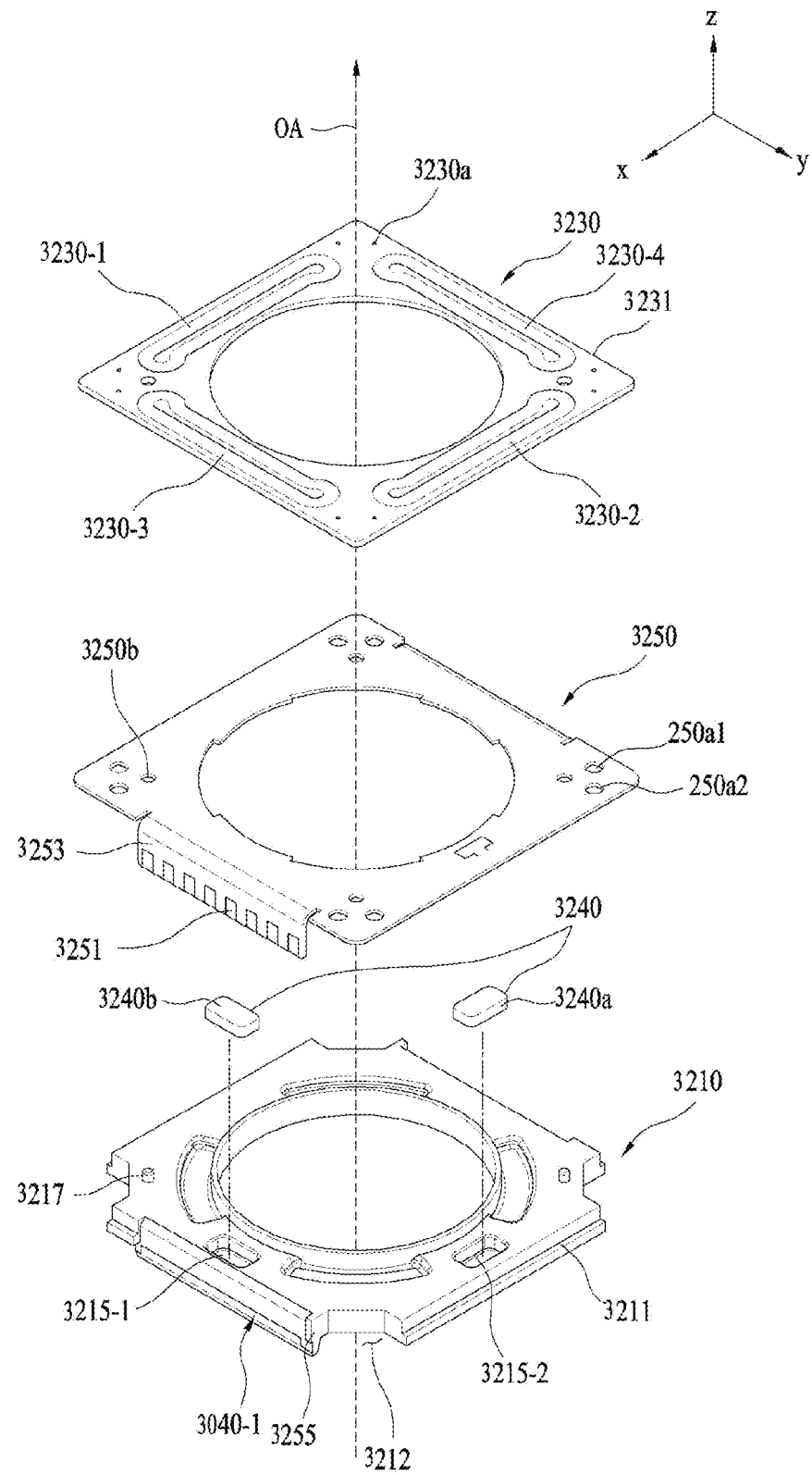
FIG. 41 is an exploded perspective view of the third coil, the circuit board, the base and first and second OIS position sensors.

FIG. 41 is an exploded perspective view of the third coil 3230, the circuit board 3250, the base 3210 and first and second OIS position sensors 3240a and 3240b.

Referring to FIG. 41, the base 3210 may be coupled with the cover member 3300 to form a reception space between the bobbin 3110 and the housing 3140. The base 3210 may include a hollowness corresponding to the hollowness of the bobbin 3110 and/or the hollowness of the housing 3140, and have a shape matching or corresponding to that of the cover member 3300, e.g., a rectangular shape.

The base 3210 may include a stair 3211 coated with an adhesive when the cover member 3300 is adhered and fixed. At this time, the stair 3211 may guide the cover member 330 coupled to the upper side thereof and the end of the side plate of the cover member 330 may be coupled to be in surface contact.

The stair 3211 of the base 3210 and the end of the side plate of the cover member 3300 may be adhered or fixed by an adhesive.

A supporting portion 3255 may be formed in the surface of the base 3210 opposite to the terminal member 3253 on which the terminal 3251 of the circuit board 3250 is formed. The supporting portion 3255 of the base 3210 may be formed as a cross section from the outer surface 3210 without a stair, protrude from the lower surface of the base 3210, and support the terminal member 3253 of the circuit board 3250.

The corner of the base 3210 may have a second groove 3212. If the corner of the cover member 3300 protrudes, the protrusion of the cover member 3300 may be coupled to the base 210 at the second groove 3212.

In addition, seating grooves 3215-1 and 3215-2 in which the position sensors 3240 may be disposed may be provided in the upper surface of the base 3210. In some embodiments, two seating grooves 3215-1 and 3215-2 may be provided in the upper surface of the base 3210 and the position sensors 3240 may be disposed in the seating grooves 3215-1 and 3215-2 of the base 3210, thereby detecting displacement of the housing 3140 in the direction perpendicular to the optical axis, e.g., the second direction and the third direction. Virtual lines connecting the centers of seating grooves 3215-1 and 3215-2 of the base 3210 and the center of the base 3210 may cross each other. For example, the angle between the virtual angles may be 90°, without being limited thereto.

For example, the seating grooves 3215-1 and 3215-2 of the base 3210 may be disposed to be aligned at or near the center of the third coil 3230, without being limited thereto. Alternatively, the center of the third coil 3230 and the center of the position sensor 3240 may be aligned with each other, without being limited thereto.

The position sensor 3240 may detect displacement of the housing 3140 relative to the base 3210 in the direction perpendicular to the optical axis OA (e.g., the X-axis or Y-axis).

The position sensor 3240 may include two OIS position sensors 3240a and 3240b disposed to cross each other or to be perpendicular to each other in order to detect displacement of the housing 3140 in the direction perpendicular to the optical axis OA.

The third coil 3230 is disposed on the upper surface of the circuit board 3250 to correspond to or to be aligned with the magnet 3130. The number of third coils 3230 may be one or more and may be equal to the number of magnets 3130, without being limited thereto.

Although the third coil 3230 is provided on a circuit member 3231 separately from the circuit board 3250 in FIG. 41, the embodiment is not limited thereto. In another embodiment, the third coil 3230 may be implemented in the form of a ring-shaped coil block, an FP coil or a circuit pattern formed on the circuit board 3250.

The circuit member 231 on which the third coil 3230 is provided may include through-holes 3230a, through the supporting members 3220 pass.

The third coil 3230 is disposed on the circuit board 3250 to be opposite to the magnets 3130 disposed on or fixed to the housing 3140.

For example, the third coil 3230 may include a plurality of optical image stabilization (OIS) coils 3230-1 to 3230-4 corresponding to the plurality of magnets 3130-1 to 3130-4.

Each of the plurality of OIS coils 3230-1 to 3230-4 may correspond to or be aligned with any one of the plurality of magnets 3130-1 to 3130-4 in the first direction.

For example, the plurality of OIS coils 230-1 to 230-4 may be disposed in correspondence with four sides of the circuit board 250, without being limited thereto.

The OIS coils 230-1 to 230-4 may be electrically connected to the circuit board 1250. The driving signal may be provided from the circuit board 3250 to the plurality of OIS coils 3230-1 to 3230-4. At this time, the driving signal may be an AC signal (e.g., AC current) or a DC signal (e.g., DC current). For example, the driving signal provided to the plurality of OIS coils 3230-1 to 3230-4 may be a sine wave signal or a pulse signal (e.g., a pulse width modulation (PWM) signal).

In another embodiment, the driving signal provided to the plurality of OIS coils 3230-1 to 3230-4 may be an AC signal and a DC signal.

Although the third coil 3230 includes two OIS coils 3230-3 and 3230-4 for the second direction and two OIS coils 3230-3 and 3230-4 for the third direction in FIG. 41, the embodiment is not limited thereto. In another embodiment, the second coil may include one or more OIS coils for the second direction and one or more OIS coils for the third direction.

Electromagnetic force may be generated by interaction between the magnets 3130-1 to 3130-4 and the plurality of OIS coils 3230-1 to 3230-4 disposed to be opposite to each other, and the housing 3140 may move using such electromagnetic force in the direction perpendicular to the optical axis, e.g., the second direction and/or the third direction, thereby performing handshake correction.

Each of the OIS position sensors 3240a and 3240b may be a Hall sensor and any sensor capable of detecting the strength of the magnetic field may be used. For example, each of the OIS position sensors 3240a and 3240b may be implemented as a driver including a Hall sensor or may be implemented as a position detection sensor such as a Hall sensor alone.

The third coil 3230 may be disposed at the upper side of the circuit board 3250 and the first and second OIS position sensors 3240a and 3240b may be disposed at the lower side of the circuit board 3250.

The circuit board 3250 may be disposed on the upper surface of the base 3210 and may include a hollowness corresponding to a hollowness of the bobbin 3110, a hollowness of the housing 140, and/or a hollowness of the base 210.

The circuit board 3250 may include at least one terminal surface 3253 bent from the upper surface thereof and a plurality of terminals 3251 provided on the terminal surface 3253. For example, the circuit board 3250 may have the terminals provided on any two opposite sides of the upper surface thereof, without being limited thereto.

For example, external power may be received through the plurality of terminals 3251 provided on the terminal member 3253 of the circuit board 3250, a driving signal or power may be supplied to the first and third coils 3120 and 3230 and the first and second OIS position sensors 3240a and 3240b, and output signals output from the first and second OIS position sensors 3240a and 3240b may be output to the outside.

The circuit board 3250 may be a flexible printed circuit board (FPCB) without being limited thereto and the terminal of the circuit board 3250 may be configured on the surface of the base 210 or a PCB using a surface electrode method.

The circuit board 3250 may include through-holes 3250a1 and 3250a2, through which the supporting members 3220-1 to 3220-4 pass. The supporting members 3220-1 to 3220-4 may be electrically connected to a circuit pattern formed on the lower surface of the circuit board 3250 through the through-holes 3250a1 and 3250a2 of the circuit board 3250 using soldering.

In addition, in another embodiment, the circuit board 3250 may not include the through-holes 3250a1 and 3250a2, and the supporting members 3220-1 to 3220-4 may be electrically connected to the circuit pattern or the pad formed on the upper surface of the circuit board 3250 through soldering.

The circuit board 3250 may further include a through-hole 3250b engaged with and fixed to the projection 3217 of the base 3210 through thermal fusion or an adhesive member.

By soldering or a conductive adhesive member, one end of the supporting member 3220 may be coupled to the upper elastic member 3150 and the other end of the supporting member 3220 may be coupled to the circuit board 3250, the circuit member 3231 and/or the base 3210.

The lens moving apparatus 3100 according to the embodiment shown in FIGS. 34 to 41 may further include an AF position sensor and a sensing magnet for AF feedback operation.

Figure 42:
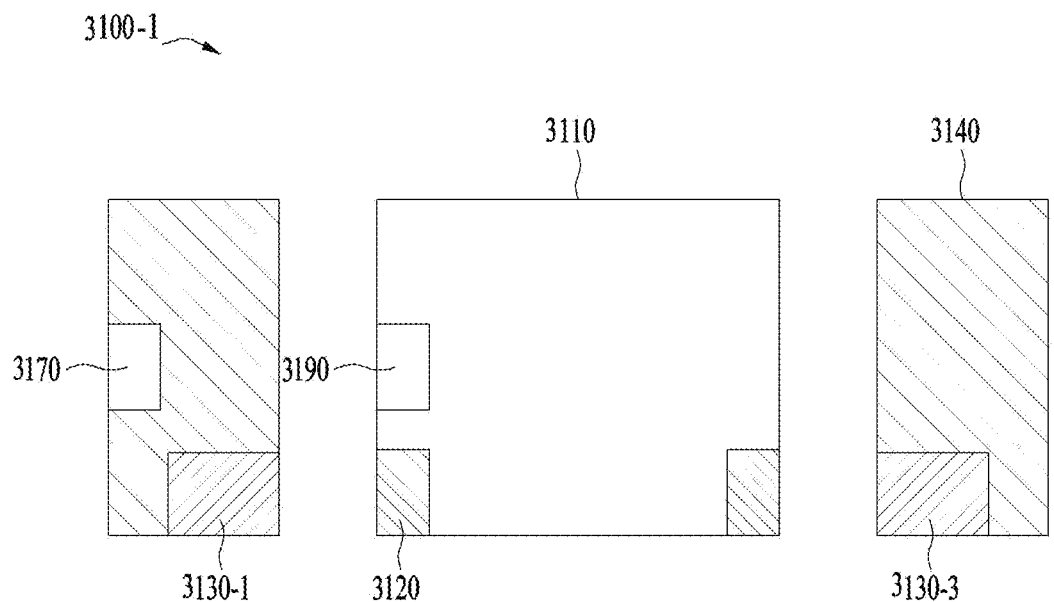
FIG. 42 is a cross-sectional view of a lens moving apparatus according to another embodiment.

FIG. 42 is a cross-sectional view of a lens moving apparatus 3100-1 according to another embodiment.

Referring to FIG. 42, the embodiment 3100-1 may further include an AF position sensor 3170 and a sensing magnet 3190 in addition to the lens moving apparatus 3100.

The sensing magnet 3190 may be disposed in the bobbin 3110 to be spaced apart from the first coil 3120. For example, the sensing magnet 3190 may be disposed on the first coil 3120.

The AF position sensor 3170 may be disposed in the housing 3140 in correspondence with the sensing magnet 3190. For example, the AF position sensor 3170 may overlap the sensing magnet 3190 in the direction perpendicular to the optical axis.

The AF position sensor 3170 may detect the strength of the magnetic field of the sensing magnet 3190 according to movement of the bobbin 3110, and generate an output signal, e.g., an output voltage, according to the result of detection. Using the output signal of the AF position sensor 3170, displacement of the bobbin 3110 in the optical axis OA direction may be controlled.

The AF position sensor 3170 may be implemented as a driver including a Hall sensor or may be implemented as a position detection sensor such as a Hall sensor alone.

The AF position sensor 3170 may be electrically connected to at least one of the upper elastic member 3150 or the lower elastic member 3160, may be electrically connected to the circuit board through the supporting members, may receive the driving signal from the circuit board 3250, and may transmit the output signal of the AF position sensor 3170 to the circuit board.

Figure 43:
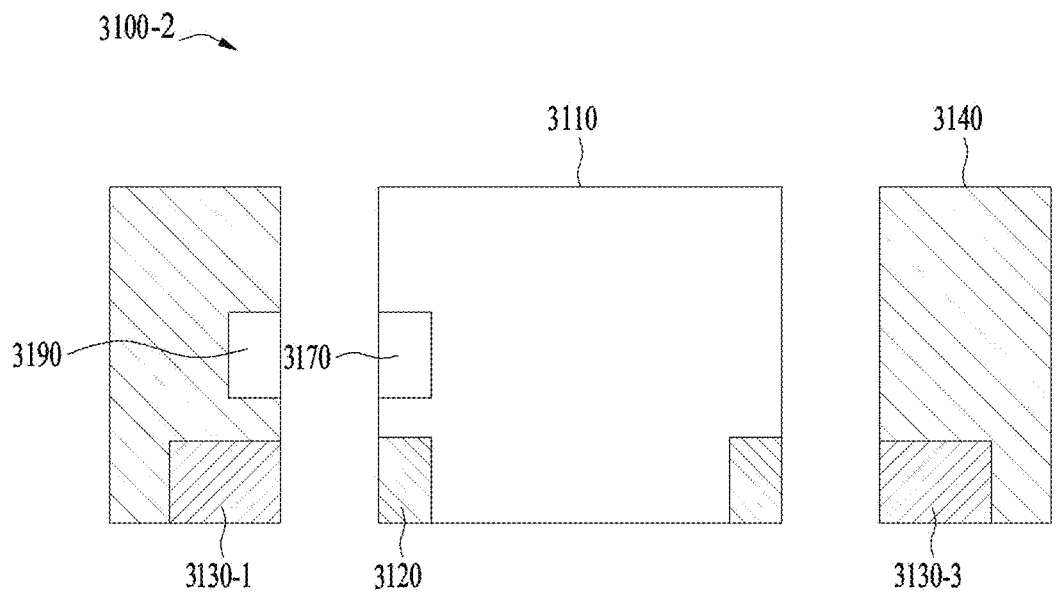
FIG. 43 is a cross-sectional view of a lens moving apparatus according to another embodiment.

FIG. 43 is a cross-sectional view of a lens moving apparatus 3100-2 according to another embodiment.

Referring to FIG. 43, the lens moving apparatus 3100-2 is a modified example of FIG. 42, the sensing magnet 3190 is disposed in the housing 3140 and the AF position sensor 3170 is disposed in the bobbin 3110. For example, the sensing magnet 3190 may be disposed in the housing 3140 to be spaced apart from the magnet 3130-1, and the AF position sensor 3170 may be disposed in the bobbin 3110 to be spaced apart from the first coil 3120.

In another embodiment, the sensing magnet 3190 of FIG. 43 may be omitted, and the AF position sensor 3170 may generate the output signal according to the result of detecting the magnetic field of the magnet 3130 according to movement of the bobbin 3110.

Figure 44:
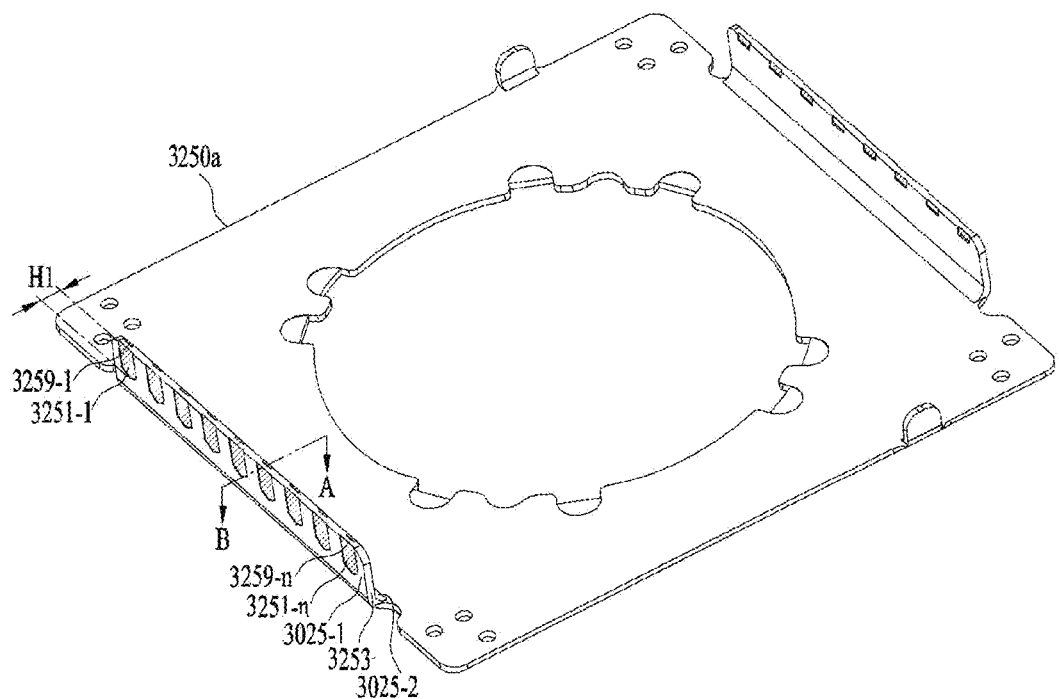
FIG. 44 is a first bottom perspective view of a circuit board shown in FIG. 43.
Figure 45:
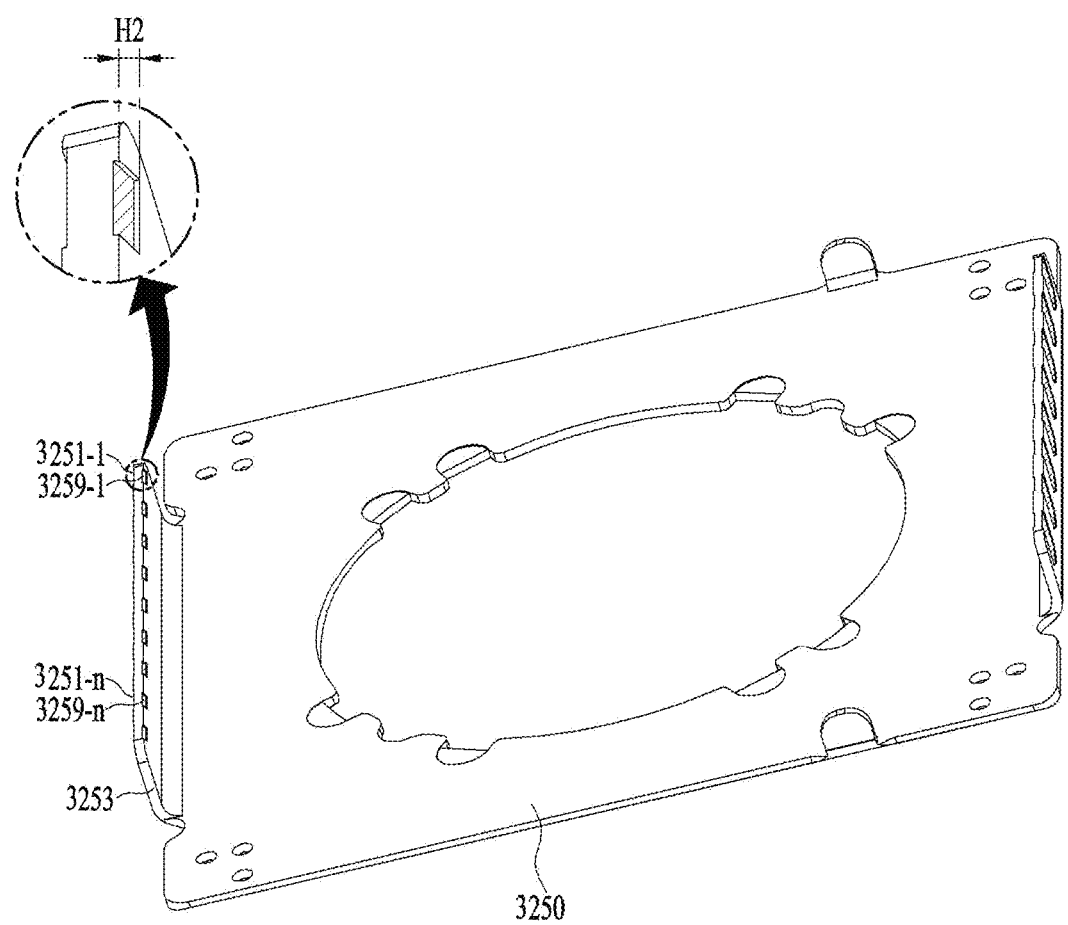
FIG. 45 is a second bottom perspective view of a circuit board shown in FIG. 44.
Figure 46:
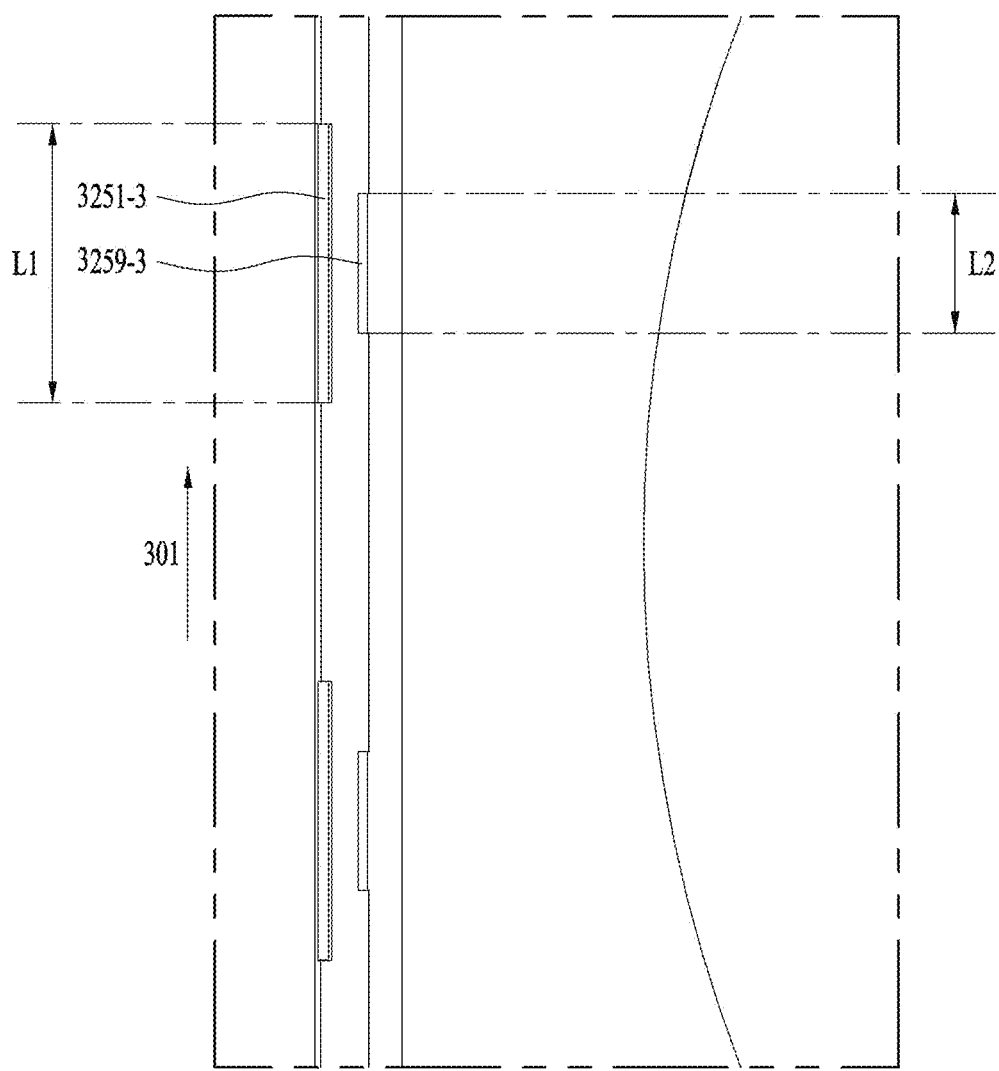
FIG. 46 is a partially enlarged view of a terminal member shown in FIG. 44.
Figure 47:
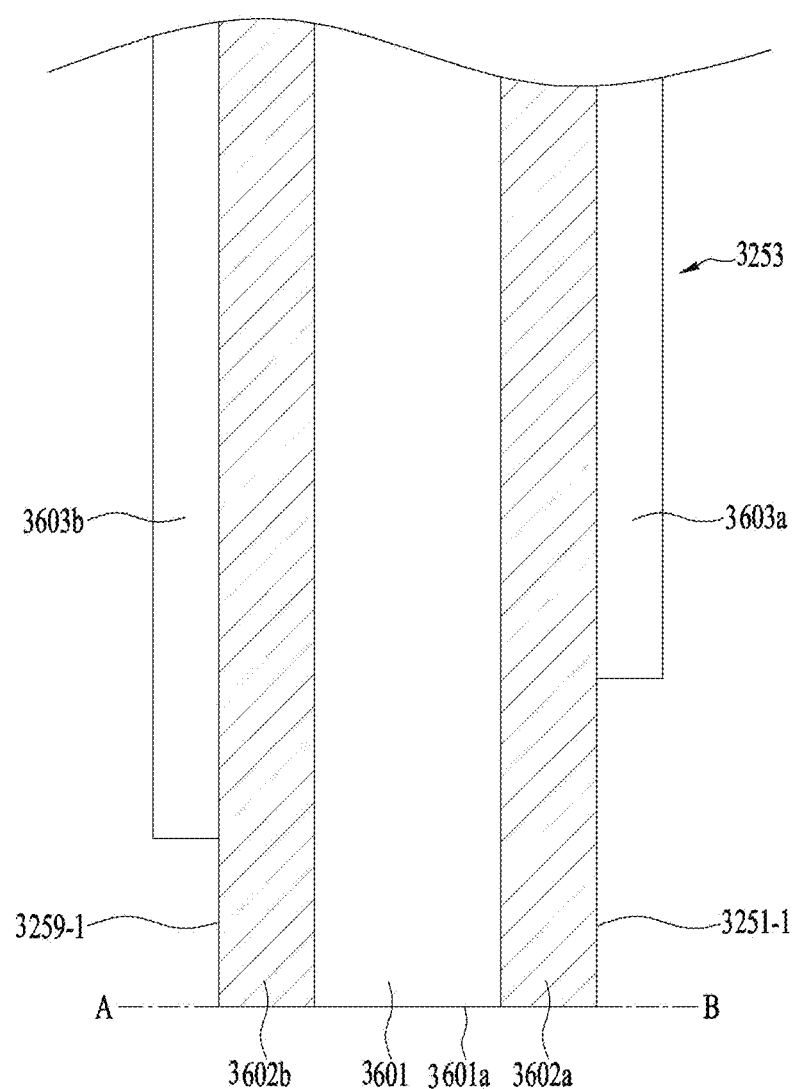
FIG. 47 is a cross-sectional view of the terminal member shown in FIG. 44 taken along line A-B.

FIG. 44 is a first bottom perspective view of a circuit board 3250 according to an embodiment, FIG. 45 is a second bottom perspective view of the circuit board 3250 shown in FIG. 44, FIG. 46 is a partially enlarged view of a terminal member 3253 shown in FIG. 44, and FIG. 47 is a cross-sectional view of the terminal member 3253 shown in FIG. 44 taken along line A-B.

Referring to FIGS. 44 to 47, the circuit board 3250 includes a body 3250a having a hollowness and disposed on the upper surface of the base 3210, at least one terminal member 3253 bent to the side surface of the base 3210, at least one connection terminal 3251-1 to 3251-n (n being a natural number greater than 1) disposed on the front surface 3025-1 of the terminal member 3253, and at least one dummy terminal 3259-1 to 3259-n (n being a natural number greater than 1) disposed on the back surface 3025-2 of the terminal member 3253.

The connection terminals 3251-1 to 3251-n may be electrically connected to the first and third coils 3120 and 3240 and the first and second OIS position sensors 3240a and 3240b. In the embodiment having the AF position sensor, the connection terminals 3251-1 to 3251-n may be electrically connected to the AF position sensor 3170 of FIGS. 42 and 43.

The circuit board 3250 may include a first insulating layer 3601, a first conductive layer 3602a disposed on the upper surface of the first insulating layer 3601, a second insulating layer 3603a disposed on the first conductive layer 3602a, a second conductive layer 3602b disposed on the lower surface of the first insulating layer 3601, and a third insulating layer 3603a disposed below the second conductive layer 3602b.

The first conductive layer 3602a may be a patterned metal layer, e.g., a Cu plating layer. For example, the first conductive layer 3602a may be patterned to include the supporting members 3220-1 to 3220-6, the third coil 3230, and wires and pads electrically connected to the second position sensor 3240.

The connection terminals 3251-1 to 3251-n of the circuit board 3250 are regions of the first conductive layer 3602 exposed from the second insulating layer 3602a, and the first conductive layer 3602a may be electrically connected to any one of the supporting members 3220-1 to 3220-6, the third coil 3230, and the second position sensor 3240.

The first insulating layer 3601 may be formed of resin, e.g., polyimide, without being limited thereto.

The second conductive layer 3602b may be a metal layer, e.g., a Cu layer, patterned to correspond to the connection terminals 3251-1 to 3251-n.

The dummy terminals 3259-1 to 3259-n of the circuit board 3250 are the regions of the second conductive layer 3602b exposed to the third insulating layer 3602 and may be spaced apart and electrically disconnected from each other.

In addition, the dummy terminals 3259-1 to 3259-n of the circuit board 3250 may be disposed to be spaced apart from the connection terminals 3251-1 to 3251-n.

The connection terminals 3251-1 to 3251-n of the terminal member 3253 of the lens moving apparatus 3100 may be electrically connected to the pad of the camera module by soldering. However, since the solder is not easily adhered to the insulating member 3601 of the terminal member 3253, solderability between the connection terminals 3251-1 to 3251-n and the pad of the camera module is not good and thus bonding strength therebetween may be poor and connection failure may occur.

The dummy terminals 3259-1 to 3259-n may serve to inhibit the bonding strength from being weakened and connection failure from occurring, by improving solderability of the connection terminals 3251-1 to 3251-n.

The plurality of connection terminals 3251-1 to 3251-n may be arranged in a line on the front surface 3025-1 of the terminal member 3253 in the direction parallel to the terminal member 3253, without being limited thereto. For example, the plurality of connection terminals 3251-1 to 3251-n may be arranged in a line in the longitudinal direction 3301 of the terminal member 3253.

In order to improve solderability with the camera module, one end of each of the plurality of connection terminals 3251-1 to 3251-n may be in contact with one end of the front surface 3025-1 of the terminal member 3253. For example, one end of the connection terminal 3253 may be in contact with one end of the insulating member 3601.

Each of the plurality of dummy terminals 3259-1 to 3259-n may be located to be aligned with any one of the plurality of connection terminals 3251-1 to 3251-n in the direction perpendicular to the front surface 3025-1 of the terminal member 3253.

For example, a virtual center line bisecting the connection terminal and a second virtual center line bisecting the dummy terminals may be aligned with or overlap each other in the direction perpendicular to the front surface 3025-1 of the terminal member 3253.

For example, the plurality of dummy terminals 3259-1 to 3259-n may be arranged in a line on the back surface 3025-2 of the terminal member 3253 in the direction parallel to the terminal member 3253, without being limited thereto. For example, the plurality of dummy terminals 3259-1 to 3259-n may be arranged in a line in the longitudinal direction 3301 of the terminal member 3253.

In order to improve solderability of the connection terminals 3251-1 to 3251-n, at least some of the dummy terminals 3259-1 to 3259-n may overlap the connection terminals in the direction perpendicular to the front surface 3025-1 of the terminal member 253.

In order to improve solderability of the connection terminals 3251-1 to 3251-n, one end of each of the dummy terminals 3259-1 to 3259-n may be in contact with one end of the back surface 3025-2 of the terminal member 3253. For example, one end of the dummy terminal may be in contact with one end 3601a of the first insulating layer 3601 of the terminal member 3253.

The area of each of the dummy terminals 3259-1 to 3259-n may be less than that of each of the connection terminals 3251-1 to 3251-n.

Since the connection terminals 3251-1 to 3251-n are electrically connected by soldering, a certain area is required. However, since the dummy terminals 3259-1 to 3259-n are provided for improved solderability, not for conductible connection, the area of the dummy terminals does not need to be equal to the area of the connection terminals. Further, if the area of each of the dummy terminals 3259-1 to 3259-n is greater than that of each of the connection terminals 3251-1 to 3251-n, the thickness of the terminal member 3253 may be reduced and durability of the terminal member 3253 may be weakened.

Referring to FIG. 46, the length L2 of the dummy terminal (e.g., 3259-3) is shorter than the length L1 of the connection terminal (e.g., 3251-3) corresponding thereto in the longitudinal direction 3301 of the terminal member 3253 (L2<L1).

For example, the length L2 of the dummy terminal (e.g., 3259-3) may be ⅓ to ½ the length L1 of the connection terminal (e.g., 3251-3). If L2<L1/3, solderability of the connection terminals may not be improved and, if L2>L1/2, the durability of the terminal member may be weakened and the terminal member may be damaged.

Referring to FIGS. 44 and 45, the length H2 (see FIG. 45) of the dummy terminal (e.g., 3259-1) in the direction perpendicular to the longitudinal direction 3301 of the terminal member 3253 is shorter than the length H1 of the connection terminal 3251-1 corresponding thereto (H2<H1). For example, the length H1 of the connection terminal may be the largest value among the lengths from the upper end and the lower end thereof.

For example, the length H2 of the dummy terminal (e.g., 3259-1) may be ¼ to ⅓ the length H1 of the connection terminal (e.g., 3251-1). If H2<H1/4, solderability of the connection terminals may not be improved and, if H2>H1/3, the durability of the terminal member 3253 may be weakened and the terminal member 3253 may be damaged.

Figure 48:
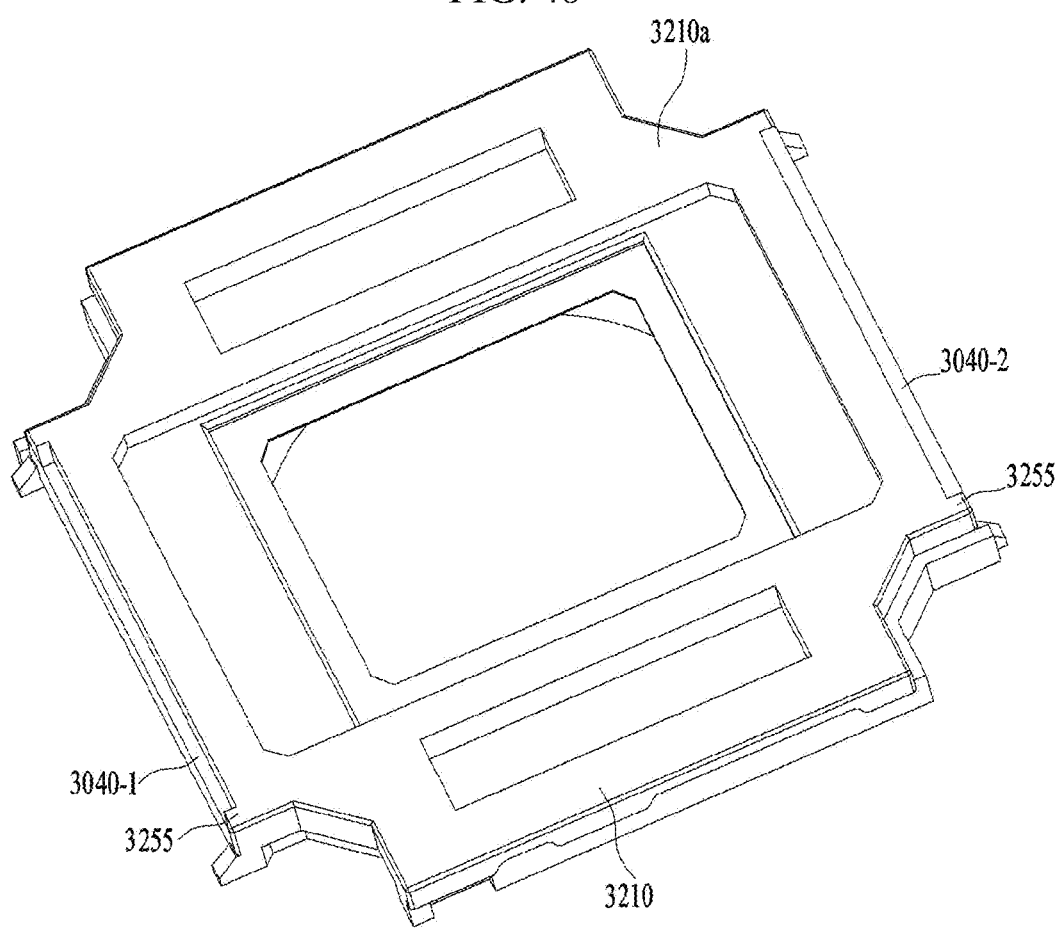
FIG. 48 is a bottom perspective view of a base according to an embodiment.
Figure 49:
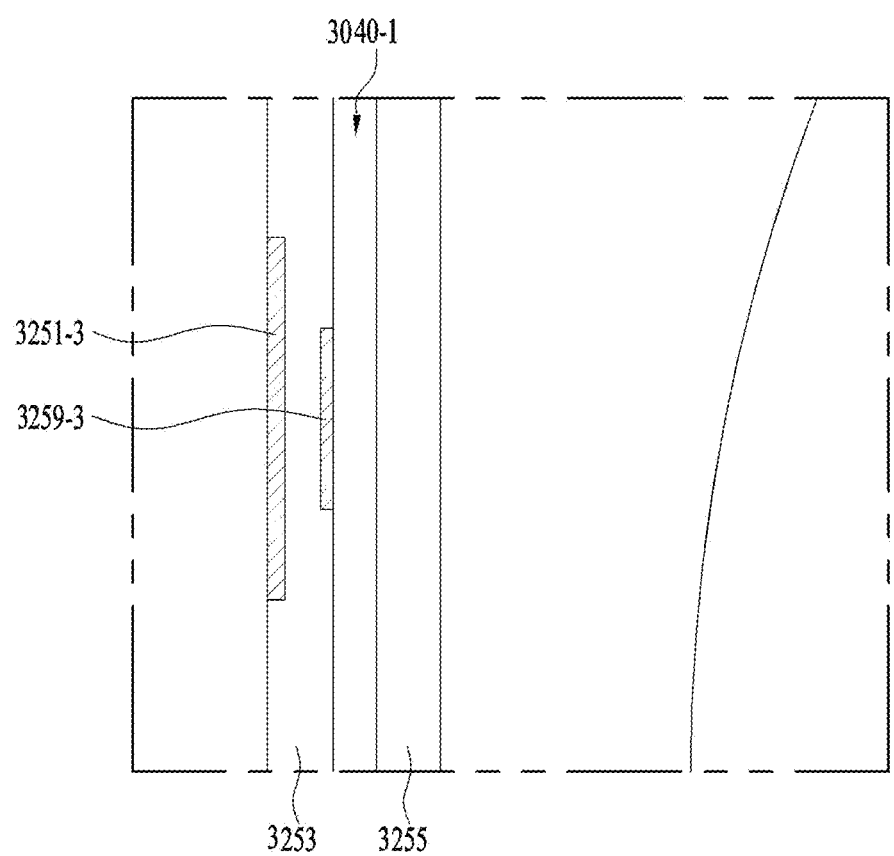
FIG. 49 is a partially enlarged view of the base of FIG. 48 coupled with a circuit board.

FIG. 48 is a bottom perspective view of a base 3210 according to an embodiment, and FIG. 49 is a partially enlarged view of the base 3210 of FIG. 48 coupled with a circuit board 3250.

Referring to FIGS. 48 and 49, grooves 3040-1 and 3040-2 opposite to the dummy terminals 3259-1 to 3259-n may be provided in the lower end of the outer surface of the base 3210.

For example, the grooves 3040-1 and 3040-2 may be provided in the lower end of the outer surface of the supporting portion 3255 of the base 3210.

A space or gap, into which a solder may permeate, may be formed between the outer surface of the base 3210 and the dummy terminals 3259-1 to 3259-n of the circuit board 3250 by the grooves 3040-1 and 3040-2 of the base 3210, thereby facilitating soldering.

For example, the distance D1 between the outer surface of the base 3210 and the dummy terminals 3259-1 to 3259-n of the circuit board 3250 may be 70 µm to 80 µm.

For example, the distance D1 (see FIG. 50) between the bottom of the groove 3040-1 of the base and the dummy terminals 3259-1 to 3259-n of the circuit board 3250 may be 70 µm to 80 µm.

When the distance D1 is less than 70 µm, the space, into which a solder material permeates, may be insufficient and thus solderability of the dummy terminals may be deteriorated. In addition, when the distance D1 exceeds 80 µm, the solder material may be spaced apart from the outer surface of the base during soldering and thus the solder material may not be supported by the outer surface of the base, thereby deteriorating solderability of the dummy terminals.

For example, the bottoms of the grooves 3040-1 and 3040-2 of the base 3210 in the lower surface 3210a of the base 3210 may be positioned at the same plane as the upper ends of the dummy terminals 3259-1 to 3259-n, without being limited thereto.

For example, the distance from the lower surface 3210a of the base 3210 to the bottoms of the grooves 3040-1 and 3040-2 of the base 3210 may be equal to the distance from the lower ends to the upper ends of the dummy terminals 3259-1 to 3259-n. When the distance from the lower surface 3210a of the base 3210 to the bottoms of the grooves 3040-1 and 3040-2 of the base 3210 is too large, the supporting portion 3255 of the base 3210 may not support the circuit board 3250 and thus the circuit board 3250 may be bent.

The grooves 3040-1 and 3040-2 of the base 3210 may be disposed in the lower end of the outer surface of the supporting portion 3255 in a line shape, without being limited thereto.

In another embodiment, the base 3210 may include a plurality of grooves spaced apart from each other, and the plurality of grooves may be provided in the lower end of the supporting portion 3255 of the base 3210 in correspondence with any one of the dummy terminals and may be arranged in a line.

The lens moving apparatus 3100 according to the embodiment may include dummy terminals corresponding to the connection terminals on the terminal member 3253 of the circuit board 3250, thereby improving solderability during soldering to the camera module and inhibiting connection failure.

The camera module according to another embodiment may include the lens moving apparatus 3100 of FIG. 34 instead of the lens moving apparatus 1100 in the camera module 200 shown in FIG. 15b. At this time, the description of the camera module 200 of FIG. 15b except for the amplifier 310 is applicable to the camera module including the lens moving apparatus 3100.

Figure 50:
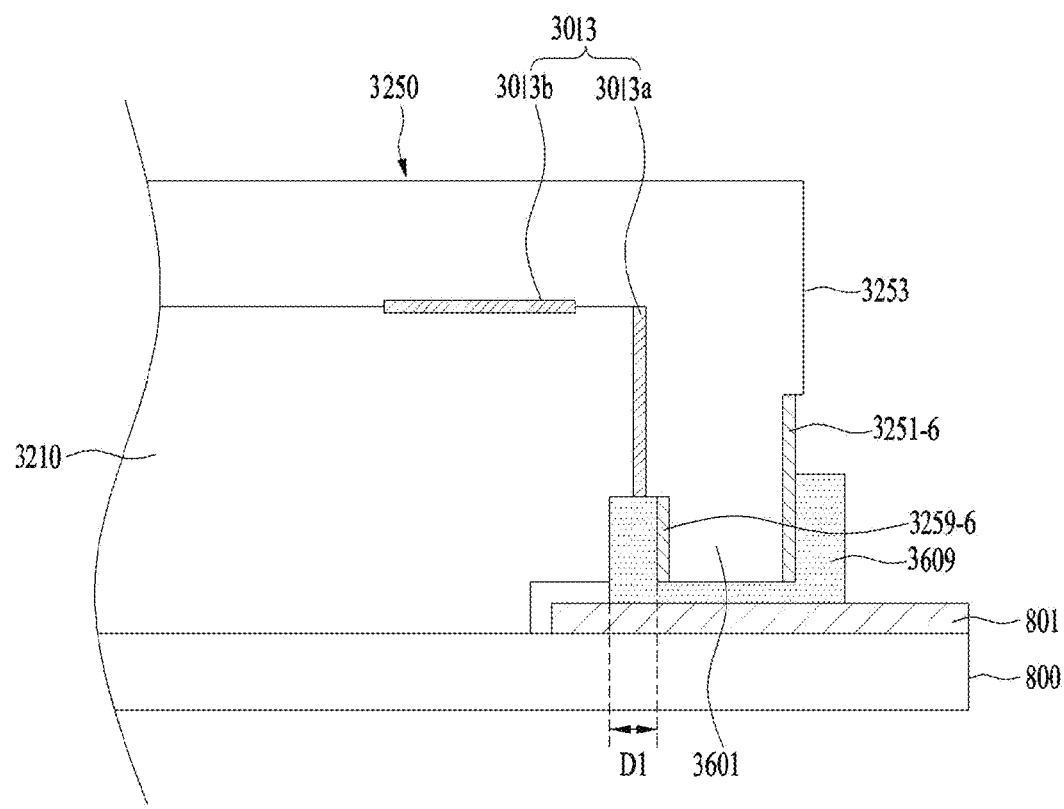
FIG. 50 is a view showing a solder disposed between a terminal member of a lens moving apparatus according to an embodiment and a pad of a second holder of a camera module including the same.

FIG. 50 is a view showing a solder 3609 disposed between a terminal member 3253 of a lens moving apparatus 3100 according to an embodiment and a pad 801 of a second holder 800 of a camera module including the same.

Referring to FIG. 50, during the soldering process between the terminal member 253 of the circuit board 250 of the lens moving apparatus 3100 and the pad 801 of the second holder 800 of the camera module, the solder may be fully adhered to the dummy terminal (e.g., 3259-6) and the connection terminal (e.g., 3251-6) corresponding thereto. That is, the solder 3609 may be in contact with both the dummy terminal (e.g., 3259-6) and the connection terminal (e.g., 3251-6) corresponding thereto.

In addition, a portion of the solder 3609 may be located between the dummy terminal (e.g., 3259-6) and the outer surface of the base 3210.

For example, a portion of the solder 3609 may be located inside the grooves 3040-1 and 3040-2 of the base 3210 and may be in contact with the bottoms and/or the side walls of the grooves 3040-1 and 3040-2.

The solder material having high viscosity may easily remain between the distal end of the insulating member 3601 and the pad 801, such that the embodiment can improve solderability between the connection terminals and the pad and inhibit connection failure and bonding strength weakening.

The camera module 3200 may further include an adhesive member 3013 disposed between the lower surface of the circuit board and the base 3210. For example, the adhesive member 3013 may be formed of a resin material such as epoxy, without being limited thereto.

For example, the adhesive member 3013 may include a first adhesive member 3013a disposed between the back surface of the terminal member 3253 of the circuit board 3250 and the outer surface of the base 3210 and a second adhesive member 3013a disposed between the lower surface of the circuit board 3250 and the upper surface of the base 3210.

For example, the first adhesive member 3013 may be located on a portion of the solder 3609 located inside the grooves 3040-1 and 3040-2 of the base 3210.

In the lens moving apparatus 3100 including the AF position sensor, the controller 830 may further include a third driver for providing a third driving signal for driving the AF position sensor 3170 and a third amplifier for amplifying the output signal of the first position sensor 3170 and outputting an amplified signal according to the result of amplification. In addition, a servo controller may output a first control signal for controlling the AF driver based on the rotation angular speed information received from the motion sensor 820 and the amplified signal of the third amplifier and perform AF feedback operation.

The description of FIGS. 44 to 49 is applicable to the lens moving apparatus 100 of FIG. 1 and the lens moving apparatus 1100 of FIG. 16.

Figure 51:
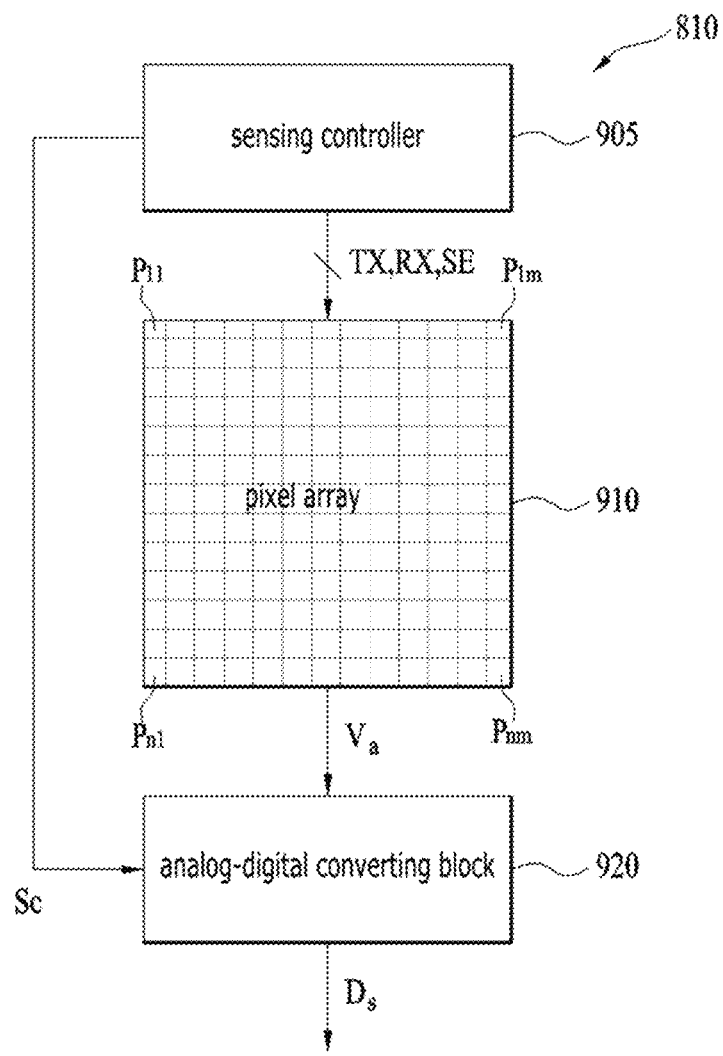
FIG. 51 is a block diagram showing an embodiment of an image sensor shown in FIGS. 15b and 29.

FIG. 51 is a block diagram showing an embodiment of the image sensor 810 shown in FIGS. 15b and 29.

Referring to FIG. 51, the image sensor 810 includes a sensing controller 905, a pixel array 910, and an analog-to-digital converting block 920.

The sensing controller 905 outputs control signals (e.g., a reset signal RX, a transmission signal TX and a selection signal SX) for controlling the transistors included in the pixel array 120, and control signals Sc for controlling the analog-to-digital converting block 920.

The pixel array 910 includes a plurality of unit pixels P11 to Pnm (n and m being natural numbers greater than 1), and the plurality of unit pixels P11 to Pnm may be arranged in a matrix including rows and columns. Each of the unit pixels P11 to Pnm may be a photoelectric conversion element for detecting and converting light into an electrical signal.

The pixel array 120 may include sensing lines connected to the output terminals of the unit pixels P11 to Pnm.

For example, each of the unit pixels P11 to Pnm may include a photodiode, a transfer transistor, a reset transistor, a drive transistor and a select transistors, without being limited thereto. The number of transistors included in the unit pixel is not limited to 4 and may be 3 or The photodiode may absorb light and generate charges by the absorbed light.

The transfer transistor may transmit the charges generated by the photodiode to a detecting node (e.g., a floating diffusion region) in response to the transmission signal Tx. The reset transistor may reset the unit pixel in response to the reset signal RX. The drive transistor may be controlled in response to the voltage of the detecting node, may be implemented as a source follower, and may serve as a buffer. The select transistor may be controlled by the select signal SE and the detected signal Va may be output through the output terminal of the unit pixel.

The analog-to-digital converting block 920 samples the detected signal Va which is an analog signal output from the pixel array 905 and converts the sampled signal into the digital signal Ds. The analog-to-digital converting block 920 may perform correlated double sampling (CDS) in order to remove fixed pattern noise inherent to the pixel.

The sensing controller 905 and the analog-to-digital converting block 920 may be implemented separately from the controller 830 without being limited thereto. The sensing controller 905, the analog-to-digital converting block 920 and the controller 830 may be implemented as one controller.

For example, the lens moving apparatuses 100, 1100 and 3100 according to the embodiments may be included in an optical instrument for forming an image of an object in a space using characteristics of light such as reflection, refraction, absorption, interference and diffraction for the purpose of increasing the visual power of an eye, for recording and reproduction of the image by a lens or propagating or transmitting the image. For example, the optical instrument according to the embodiment may include a smartphone and a portable terminal including a camera mounted therein.

Figure 52:
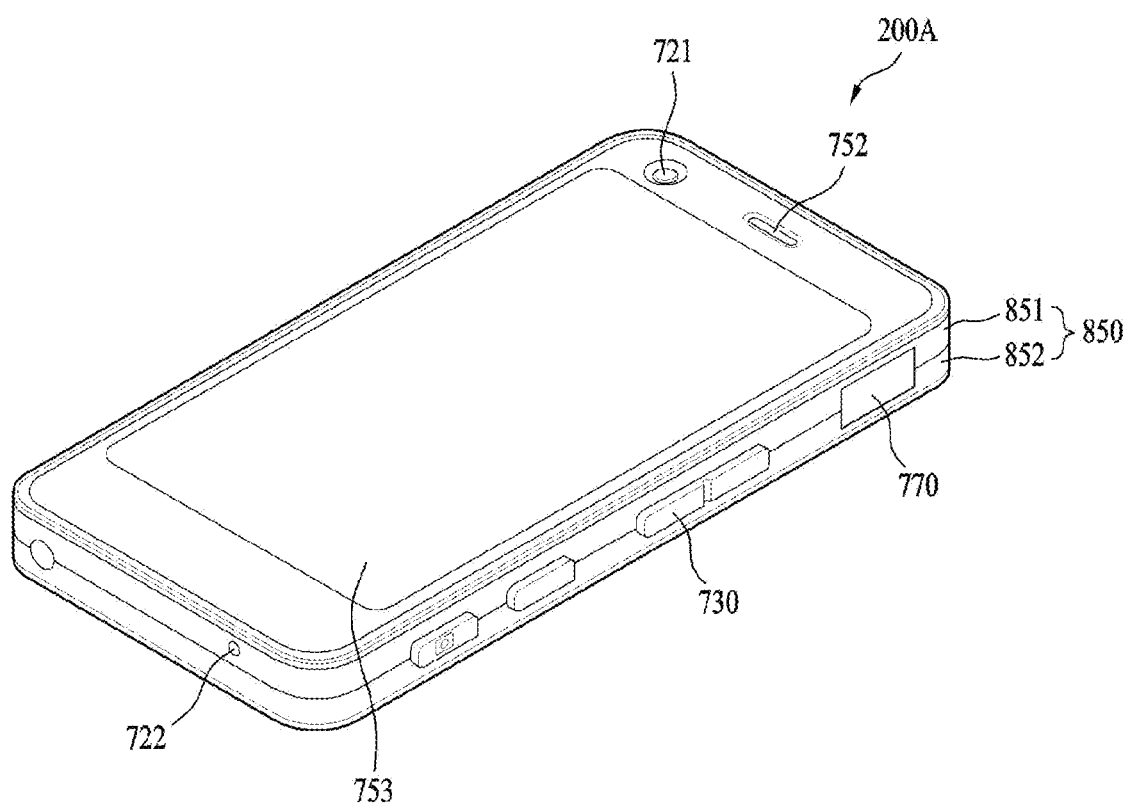
FIG. 52 is a perspective view of a portable terminal according to an embodiment.
Figure 53:
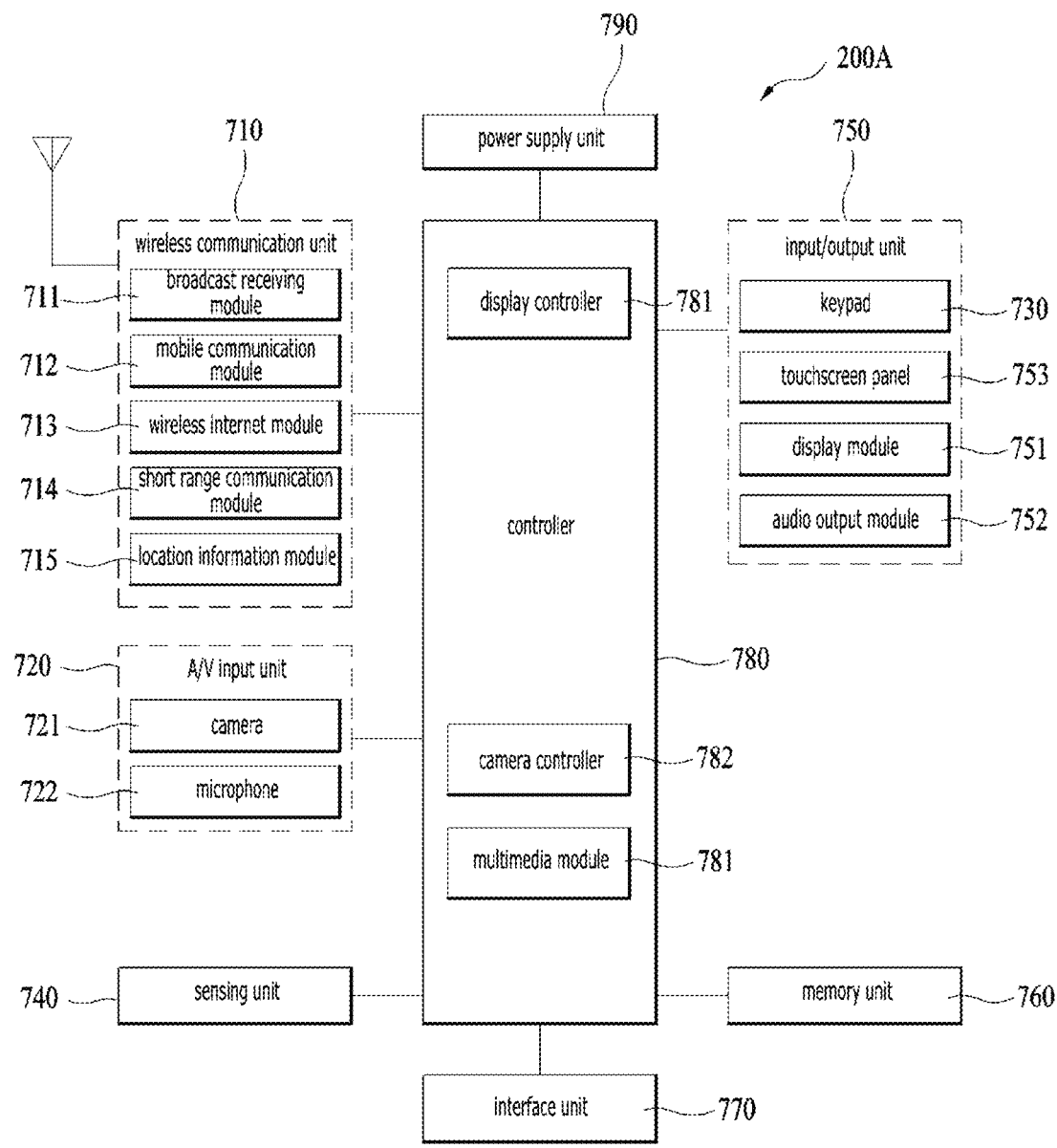
FIG. 53 is a diagram showing the configuration of the portable terminal shown in FIG. 52.

FIG. 52 is a perspective view of a portable terminal 200A according to an embodiment, and FIG. 53 is a diagram showing the configuration of the portable terminal shown in FIG. 52.

Referring to FIGS. 52 and 53, the portable terminal 200A (hereinafter referred to as a terminal) may include a body 850, a wireless communication unit 710, an A/V input unit 720, a sensing unit 740, an input/output unit 750, a memory unit 760, an interface unit 770, a controller 780 and a power supply 790.

The body 850 shown in FIG. 52 has a bar shape without being limited thereto and may have various structure such as a slide type, a folding type, a switching type and a swirl type, in which two or more sub-bodies are relatively movably coupled.

The body 850 may include a case (a casing, a housing, a cover, etc.) forming the appearance thereof. For example, the body 850 may be divided into a front case 851 and a rear case 852. Various electronic parts of the terminal may be provided in a space formed between the front case 851 and the rear case 852.

The wireless communication unit 710 may include one or more modules capable of performing wireless communication between the terminal 200A and a wireless communication system or between the terminal 200A and a network in which the terminal 200A is located. For example, the wireless communication unit 710 may include a broadcast receiving module 711, a mobile communication module 712, a wireless Internet module 713, a short-range communication module 714 and a location information module 715.

The A/V input unit 720 is used to input an audio signal or a video signal and may include a camera 721 and a microphone 722.

The camera 721 may include camera modules 200 and 200-1 according to the embodiments shown in FIGS. 15b and 29.

The sensing unit 740 may detect the current state of the terminal 200A, such as the open/closed state of the terminal 200A, the position of the terminal 200A, contact or non-contact of a user, the orientation of the terminal 200A, and acceleration/deceleration of the terminal 200A and generate a sensing signal for controlling operation of the terminal 200A. For example, if the terminal 200A is a slide phone, whether the slide phone is open or closed may be sensed. In addition, the sensing unit may sense whether the power supply unit 790 supplies power or whether the interface unit 770 is connected to an external device.

The input/output unit generates input or output related to a visual, auditory or tactile sense. The input/output unit 750 may generate input data for controlling operation of the terminal 200A and display information processed by the terminal 200A.

The input/output unit 750 may include a keypad 730, a display module 751, an acoustic output module 752 and a touchscreen panel 753. The keypad 730 may generate input data by keypad input.

The display module 751 may include a plurality of pixels, the colors of which are changed according to electrical signals. For example, the display module 751 may include at least one of a liquid crystal display, a thin film transistor-liquid crystal display, an organic light emitting diode display, a flexible display and a three-dimensional (3D) display.

The acoustic output module 752 may output audio data received from the wireless communication unit 710 in a call signal reception mode, a telephone conversation mode, a recording mode, a voice recognition mode or a broadcast reception mode or output audio data stored in the memory unit 760.

The touchscreen panel 753 may convert change in capacitance caused by user touch in a specific area of the touchscreen into an electrical input signal.

The memory unit 760 may store a program for processing and control of the controller 780 and temporarily store input/output data (e.g., a telephone directory, a message, audio, a still image, a picture, a moving image, etc.). For example, the memory unit 760 may store an image captured by the camera 721, e.g., a picture or a moving image.

The interface unit 770 serves as an interface with an external device connected to the terminal 200A. The interface unit 770 may receive power or data from the external device and transmit the power or the data to the elements of the terminal 200A or may transmit data of the terminal 200A to the external device. For example, the interface unit 770 may include wired or wireless headset ports, external charger ports, wired or wireless data ports, memory card ports, ports for connecting a device having an identification module, audio input/output (I/O) ports, video I/O ports, earphone ports, and the like.

The controller 780 typically functions to control overall operation of the terminal 200A. For example, the controller 780 may perform control or processing related to voice call, data communication, video call, etc.

The controller 780 may include a multimedia module 781 for reproducing multimedia. The multimedia module 781 may be implemented inside the controller 780 or separately from the controller 780.

The controller 780 may include a display controller 782 for generating display control signals for driving the display 751 and a camera controller 783 for generating camera control signals for driving the camera 721.

The controller 780 may perform a pattern recognition process for respectively recognizing handwriting input or drawing input performed on the touchscreen as characters and images.

The power supply unit 790 may receive external power or internal power and supply power necessary for operation of the elements, under control of the controller 780.

The features, structures, effects and the like described in the embodiments are included in at least one embodiment and are not necessarily limited to only one embodiment. Further, the features, structures, effects, and the like illustrated in the embodiments can be combined and modified by other persons having ordinary skill in the art, to which the embodiments pertain. Therefore, differences related to such modifications and applications should be interpreted as being within the scope of the present disclosure.

INDUSTRIAL APPLICABILITY

The embodiment may be used in a lens moving apparatus capable of reducing noise of a voltage induced in a second coil and improving accuracy of autofocus operation, and a camera module and optical instrument including the same.

The invention claimed is:

1. A lens moving apparatus comprising:
a housing;
a bobbin disposed in the housing;
a first coil disposed on the bobbin;
a magnet disposed on the housing;
a base disposed under the housing; and
a first circuit board disposed on the base,
wherein the first circuit board comprises:
a body disposed on an upper surface of the base and comprising a hole;
at least one terminal member connecting to the body and disposed on an outer side surface of the base;
at least one connection terminal disposed on a front surface of the terminal member; and
at least one dummy terminal disposed on a back surface of the terminal member.

2. The lens moving apparatus according to claim 1, wherein the at least one dummy terminal overlaps the at least one connection terminal in a direction perpendicular to the front surface of the terminal member.

3. The lens moving apparatus according to claim 1, wherein the first circuit board comprises a plurality of connection terminals and a plurality of dummy terminals, and
wherein the plurality of dummy terminals are spaced apart from each other.

4. The lens moving apparatus according to claim 3, wherein each of the plurality of dummy terminals is positioned to be aligned with corresponding one of the plurality of connection terminals.

5. The lens moving apparatus according to claim 1, wherein the at least one terminal member comprises a first insulating layer, a first conductive layer disposed on an upper surface of the first insulating layer, a second conductive layer disposed on a lower surface of the first insulating layer, a second insulating layer disposed on the first conductive layer, and a third insulating layer disposed below the second conductive layer, and
wherein the at least one connection terminal is a region of the first conductive layer exposed from the second insulating layer, and
wherein the at least one dummy terminal is a region of the second conductive layer exposed to the third insulating layer.

6. The lens moving apparatus according to claim 1, wherein the at least one dummy terminal is contact with one end of the back surface of the terminal member.

7. The lens moving apparatus according to claim 6, wherein the at least one connection terminal is contact with one end of the front surface of the terminal member.

8. The lens moving apparatus according to claim 1, wherein an area of the at least one dummy terminal is less than an area of the at least one connection terminal.

9. The lens moving apparatus according to claim 1, wherein a length of the at least one dummy terminal is shorter than a length of the at least one connection terminal corresponding thereto in a longitudinal direction of the terminal member.

10. The lens moving apparatus according to claim 1, wherein a length of the at least one dummy terminal in a direction perpendicular to a longitudinal direction of the terminal member is shorter than a length of the at least one connection terminal corresponding thereto.

11. The lens moving apparatus according to claim 1, wherein the base comprises a groove opposite to the at least one dummy terminal provided in a lower end of an outer surface of the base.

12. The lens moving apparatus according to claim 11, wherein the base comprises a supporting portion supporting the terminal member, and
wherein the groove is provided in a lower end of an outer surface of the supporting portion.

13. The lens moving apparatus according to claim 12, wherein the groove is disposed in the lower end of the outer surface of the supporting portion in a line shape.

14. The lens moving apparatus according to claim 11, wherein a bottom of the groove is positioned at a same plane as an upper end of the dummy terminal.

15. The lens moving apparatus according to claim 1, comprising:
a second coil disposed on the first circuit board to face the magnet:
an elastic member coupled to the bobbin and the housing; and
a support member electrically connecting the elastic member and the first circuit board.

16. The lens moving apparatus according to claim 1, wherein a gap is formed between an outer surface of the base and the dummy terminal.

17. The lens moving apparatus according to claim 16, wherein a distance between the outer surface of the base and the dummy terminal is 70 μm to 80 μm.

18. A camera module comprising:
a lens;
the lens moving apparatus according to claim 1; and
an image sensor.

19. The camera module according to claim 18, comprising:
a second circuit board comprising a pad; and
a solder disposed between the terminal member and the pad, wherein the solder is adhered to the at least one dummy terminal and the at least one connection terminal corresponding thereto.

20. A lens moving apparatus comprising:
a housing;
a bobbin disposed in the housing;
a first coil disposed on the bobbin;
a magnet disposed on the housing;
a base disposed under the housing; and
a first circuit board disposed on the base and comprising a terminal member disposed on an outer side surface of the base;
wherein the terminal member comprises a connection terminal and a dummy terminal, and the connection terminal and the dummy terminal overlap each other in a direction perpendicular to a front surface of the terminal member.

* * * * *